US012619147B2

(12) United States Patent
Miyoshi et al.

(10) Patent No.: US 12,619,147 B2
(45) Date of Patent: May 5, 2026

(54) ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, AND METHOD FOR MANUFACTURING ELECTRONIC DEVICE

(71) Applicant: FUJIFILM Corporation, Tokyo (JP)

(72) Inventors: Taro Miyoshi, Shizuoka (JP); Yasunori Yonekuta, Shizuoka (JP); Eiji Fukuzaki, Shizuoka (JP); Toshiya Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 678 days.

(21) Appl. No.: 17/691,119

(22) Filed: Mar. 10, 2022

(65) Prior Publication Data

US 2022/0206386 A1 Jun. 30, 2022

Related U.S. Application Data

(63) Continuation of application No. PCT/JP2020/034762, filed on Sep. 14, 2020.

(30) Foreign Application Priority Data

Sep. 30, 2019 (JP) ................................ 2019-179944
May 29, 2020 (JP) ................................ 2020-094650

(51) Int. Cl.
*G03F 7/039* (2006.01)
*G03F 7/004* (2006.01)
*G03F 7/20* (2006.01)
*G03F 7/32* (2006.01)

(52) U.S. Cl.
CPC .......... *G03F 7/0392* (2013.01); *G03F 7/0045* (2013.01); *G03F 7/2004* (2013.01); *G03F 7/322* (2013.01)

(58) Field of Classification Search
None
See application file for complete search history.

(56) References Cited

U.S. PATENT DOCUMENTS 6,096,478 A * 8/2000 Yamana ................ G03F 7/0045 430/921
9,580,402 B2 2/2017 Sakamoto et al.
10,816,902 B2 10/2020 Masuyama et al.
2010/0035185 A1 2/2010 Hagiwara et al.
2011/0117495 A1* 5/2011 Ichikawa ............. G03F 7/0397 549/60
2011/0189609 A1* 8/2011 Kawabata ............ G03F 7/0397 430/296
2011/0318688 A1* 12/2011 Hiraoka ............... C07D 207/12 549/16
2012/0164582 A1 6/2012 Maruyama
2012/0270155 A1 10/2012 Komuro et al.
2013/0130175 A1 5/2013 Hagiwara et al.
2015/0004545 A1 1/2015 Namai et al.
2015/0093691 A1 4/2015 Shibuya
2016/0370700 A1 12/2016 Namai et al.
2017/0059995 A1* 3/2017 Furutani ............... G03F 7/2006
2017/0227852 A1* 8/2017 Zi ......................... G03F 7/0382
2017/0369616 A1 12/2017 Hatakeyama et al.
2017/0369698 A1 12/2017 Suzuki et al.
2018/0011401 A1* 1/2018 Utsumi .................... C09K 3/00
2018/0246406 A1 8/2018 Yoshino
2019/0079399 A1 3/2019 Fukushima et al.
2019/0196326 A1 6/2019 Kojima et al.

FOREIGN PATENT DOCUMENTS

CN 101687781 3/2010
CN 104364714 2/2015
CN 107544206 1/2018
(Continued)

OTHER PUBLICATIONS

JP2014199358A English Translation (Year: 2024).*
"Search Report of Europe Counterpart Application", issued on Nov. 24, 2022, p. 1-p. 8.
"Office Action of Taiwan Counterpart Application", issued on Dec. 20, 2023, with English translation thereof, p. 1-p. 16.
"Office Action of Korea Counterpart Application", issued on Mar. 6, 2024, with English translation thereof, p. 1-p. 15.
"International Search Report (Form PCT/ISA/210) of PCT/JP2020/034762," mailed on Dec. 1, 2020, with English translation thereof, pp. 1-7.
(Continued)

*Primary Examiner* — Mark F. Huff
*Assistant Examiner* — Kevin J Drummey
(74) *Attorney, Agent, or Firm* — JCIPRNET

(57) ABSTRACT

An actinic ray-sensitive or radiation-sensitive resin composition containing (A) an acid-decomposable resin, (B) a compound represented by General Formula (b1), and (C) a compound represented by General Formula (c1), in which a ratio of a content of the compound (C) to a content of the compound (B) is from 0.01% by mass to 10% by mass. In the formulae, L represents a single bond or a divalent linking group. A represents a group that decomposes by the action of an acid. B represents a group that decomposes by the action of an acid, a hydroxy group, or a carboxy group. It should be noted that at least one B represents the hydroxy group or the carboxy group. n represents an integer from 1 to 5. X represents an (n+1)-valent linking group. $M^+$ represents a sulfonium ion or an iodonium ion.

$$_n(A-L)-X-SO_3^- \quad M^+ \tag{b1}$$

$$_n(B-L)-X-SO_3^- \quad M^+ \tag{c1}$$

15 Claims, No Drawings

(56) References Cited

FOREIGN PATENT DOCUMENTS

| | | | |
|---|---|---|---|
| CN | 108351592 | | 7/2018 |
| CN | 109643061 | | 4/2019 |
| JP | 2011164322 | | 8/2011 |
| JP | 2012224586 | | 11/2012 |
| JP | 2013041257 | | 2/2013 |
| JP | 2013250433 | | 12/2013 |
| JP | 2014199358 | A * | 10/2014 |
| JP | 2018005224 | | 1/2018 |
| JP | 2018012684 | | 1/2018 |
| KR | 20180002022 | | 1/2018 |
| TW | 201632501 | | 9/2016 |
| TW | 201906814 | | 2/2019 |
| WO | 2013140969 | | 9/2013 |

OTHER PUBLICATIONS

"Written Opinion of the International Searching Authority (Form PCT/ISA/237)" of PCT/JP2020/034762, mailed on Dec. 1, 2020, with English translation thereof, pp. 1-6.

"Office Action of Japan Counterpart Application", issued on Aug. 23, 2022, with English translation thereof, p. 1-p. 4.

"Office Action of China Counterpart Application", issued on Sep. 6, 2024, with English translation thereof, p. 1-p. 14.

* cited by examiner

ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, AND METHOD FOR MANUFACTURING ELECTRONIC DEVICE

CROSS REFERENCE TO RELATED APPLICATIONS

This is a continuation of International Application No. PCT/JP2020/034762 filed on Sep. 14, 2020 and claims priority from Japanese Patent Application No. JP2019-179944 filed on Sep. 30, 2019 and Japanese patent application No. 2020-094650 filed on May 29, 2020, the entire contents of which are incorporated herein by reference.

BACKGROUND OF THE INVENTION

1. Field of the Invention

The present invention relates to an actinic ray-sensitive or radiation-sensitive resin composition, an actinic ray-sensitive or radiation-sensitive film, a pattern forming method, and a method for manufacturing an electronic device. More specifically, the present invention relates to an actinic ray-sensitive or radiation-sensitive resin composition, an actinic ray-sensitive or radiation-sensitive film, a pattern forming method, and a method for manufacturing an electronic device, each of which is suitably used for an ultra-microlithography process applicable to a process for manufacturing an ultra-large scale integration (LSI) and a high-capacity microchip, a process for creating a mold for a nanoimprint, a process for manufacturing a high-density information recording medium, and the like, and other photofabrication processes.

2. Description of the Related Art

In processes for manufacturing semiconductor devices such as an integrated circuit (IC) and an LSI, microfabrication by lithography using a photoresist composition has been performed in the related art. In recent years, along with the high integration of integrated circuits, the formation of ultrafine patterns in a submicron region or quarter micron region has been required. Along with this, the exposure wavelength also tends to be shortened from g-line to i-line, and further to KrF excimer laser light, and an exposure machine using an ArF excimer laser having a wavelength of 193 nm as a light source is currently being developed. In addition, the development of a so-called liquid immersion method in which a liquid having a high refractive index (hereinafter also referred to as an "immersion liquid") is filled between a projection lens and a sample as a technique for further enhancing a resolving power has been in progress since the related art.

Furthermore, at present, the development of lithography using electron beams (EB), X-rays, extreme ultraviolet rays (EUV), or the like in addition to excimer laser light is also in progress. Along with this, resist compositions which are effectively sensitive to various actinic rays or radiations have been developed.

For example, a resist composition containing a resin having an acid-decomposable group, a salt consisting of a specific cation and a specific anion having an acid-decomposable group as an acid generator, and a salt consisting of a specific cation and a specific anion, which are each different from the cation and the anion in the salt, is described in JP2013-41257A.

SUMMARY OF THE INVENTION

However, in recent years, performance required for a resist composition has been further enhanced due to further miniaturization of a pattern formed, and the like.

In view of the circumstances, an object of the present invention is to provide an actinic ray-sensitive or radiation-sensitive resin composition which is excellent in a resolution and a line width roughness (LWR) performance and can reduce development defects and etching defects; and an actinic ray-sensitive or radiation-sensitive film, a pattern forming method, and a method for manufacturing an electronic device, each using the actinic ray-sensitive or radiation-sensitive resin composition.

The present inventors have found that the object can be accomplished by the following configurations.

[1] An actinic ray-sensitive or radiation-sensitive resin composition comprising:

(A) a resin having a group having a polarity that increases through decomposition by an action of an acid;

(B) a compound represented by General Formula (b1), which generates an acid upon irradiation with actinic rays or radiation; and (C) a compound represented by General Formula (c1), which generates an acid upon irradiation with actinic rays or radiation, in which a ratio of a content of the compound (C) to a content of the compound (B) is from 0.01% by mass to 10% by mass.

$${}_{n}(A-L)-X-SO_3^- \ M^+ \qquad \text{(b1)}$$

In General Formula (b1), L represents a single bond or a divalent linking group. In a case where there are a plurality of L's, the plurality of L's may be the same as or different from each other. A represents a group that decomposes by an action of an acid. In a case where there are a plurality of A's, the plurality of A's may be the same as or different from each other. n represents an integer from 1 to 5. X represents an (n+1)-valent linking group. $M^+$ represents a sulfonium ion or an iodonium ion.

$${}_{n}(B-L)-X-SO_3^- \ M^+ \qquad \text{(c1)}$$

In General Formula (c1), L represents a single bond or a divalent linking group. In a case where there are a plurality of L's, the plurality of L's may be the same as or different from each other. n represents an integer from 1 to 5. X represents an (n+1)-valent linking group. $M^+$ represents a sulfonium ion or an iodonium ion. It should be noted that L, n, X, and $M^+$ in General Formula (c1) are the same as L, n, X, and $M^+$ in General Formula (b1), respectively. B represents a group that decomposes by an action of an acid, a hydroxy group, or a carboxy group. In a case where there are a plurality of B's, the plurality of B's may be the same as or different from each other. It should be noted that at least one B represents the hydroxy group or the carboxy group.

[2] The actinic ray-sensitive or radiation-sensitive resin composition as described in [1], in which the compound (B) is represented by General Formula (b2) and the compound (C) is represented by General Formula (c2).

(b2)

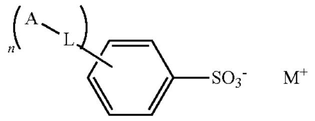

In General Formula (b2), L represents a single bond or a divalent linking group. In a case where there are a plurality of L's, the plurality of L's may be the same as or different from each other. A represents a group that decomposes by an action of an acid. In a case where there are a plurality of A's, the plurality of A's may be the same as or different from each other. n represents an integer from 1 to 5. $M^+$ represents a sulfonium ion or an iodonium ion.

(c2)

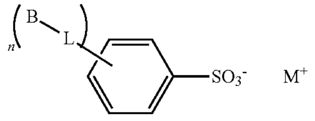

In General Formula (c2), L represents a single bond or a divalent linking group. In a case where there are a plurality of L's, the plurality of L's may be the same as or different from each other. n represents an integer from 1 to 5. $M^+$ represents a sulfonium ion or an iodonium ion. It should be noted that L, n, and $M^+$ in General Formula (c2) are the same as L, n, and $M^+$ in General Formula (b2), respectively. B represents a group that decomposes by an action of an acid, a hydroxy group, or a carboxy group. In a case where there area plurality of B's, the plurality of B's may be the same as or different from each other. It should be noted that at least one B represents the hydroxy group or the carboxy group.

[3] The actinic ray-sensitive or radiation-sensitive resin composition as described in [1], in which the compound (B) is represented by General Formula (b3) and the compound (C) is represented by General Formula (c3).

(b3)

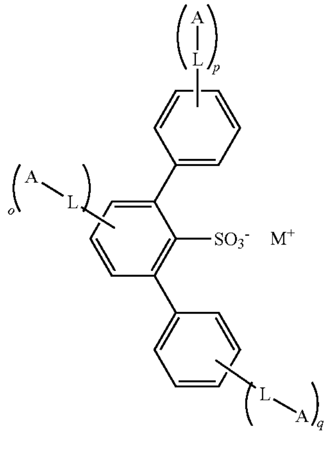

In General Formula (b3), L represents a single bond or a divalent linking group. In a case where there are a plurality of L's, the plurality of L's may be the same as or different from each other. A represents a group that decomposes by the action of an acid. In a case where there are a plurality of A's, the plurality of A's may be the same as or different from each other. o, p, and q each independently represent an integer from 0 to 5. It should be noted that a sum of o, p, and q is from 1 to 5. $M^+$ represents a sulfonium ion or an iodonium ion.

(c3)

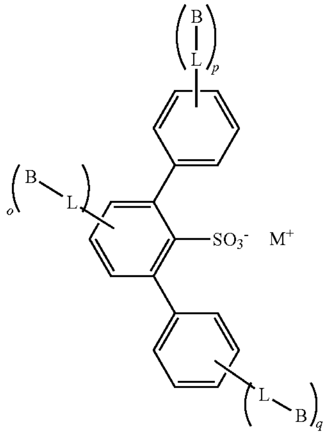

In General Formula (c3), L represents a single bond or a divalent linking group. In a case where there are a plurality of L's, the plurality of L's may be the same as or different from each other. o, p, and q each independently represent an integer from 0 to 5. It should be noted that a sum of o, p, and q is from 1 to 5. $M^+$ represents a sulfonium ion or an iodonium ion. It should be noted that L, o, p, q, and $M^+$ in General Formula (c3) are the same as L, o, p, q, and $M^+$ in General Formula (b3), respectively. B represents a group that decomposes by an action of an acid, a hydroxy group, or a carboxy group. In a case where there are a plurality of B's, the plurality of B's may be the same as or different from each other. It should be noted that at least one B represents the hydroxy group or the carboxy group.

[4] The actinic ray-sensitive or radiation-sensitive resin composition as described in any one of [1] to [3], in which the group represented by A, which decomposes by an action of an acid, is at least one group selected from the group consisting of a group represented by General Formula (T-1) and a group represented by General Formula (T-2).

(T-1)

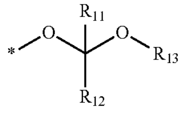

(T-2)

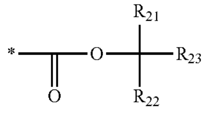

In General Formula (T-1), $R_{11}$ represents a hydrogen atom or an alkyl group.

$R_{12}$ represents a hydrogen atom, an alkyl group, a cycloalkyl group, or an aryl group, and the alkyl group and the cycloalkyl group may each include an ether bond or a carbonyl bond.

$R_{13}$ represents an alkyl group, a cycloalkyl group, or an aryl group, and the alkyl group and the cycloalkyl group may each include an ether bond or a carbonyl bond.

$R_{11}$ and $R_{12}$ may be bonded to each other to form a ring.

$R_{12}$ and $R_{13}$ may be bonded to each other to form a ring.

* represents a bond.

In General Formula (T-2), $R_{21}$, $R_{22}$, and $R_{23}$ each independently represent an alkyl group.

Two of $R_{21}$ to $R_{23}$ may be bonded to each other to form a ring.

* represents a bond.

[5] The actinic ray-sensitive or radiation-sensitive resin composition as described in [4], in which the group represented by A, which decomposes by an action of an acid, is the group represented by General Formula (T-1).

[6] The actinic ray-sensitive or radiation-sensitive resin composition as described in any one of [1] to [5], in which the ratio of the content of the compound (C) to the content of the compound (B) is from 0.01% by mass to 5% by mass.

[7] The actinic ray-sensitive or radiation-sensitive resin composition as described in any one of [1] to [6], in which the sulfonium ion or the iodonium ion represented by $M^+$ has no nitrogen atom.

[8] The actinic ray-sensitive or radiation-sensitive resin composition as described in any one of [1] to [7], in which the resin (A) includes a repeating unit represented by General Formula (I).

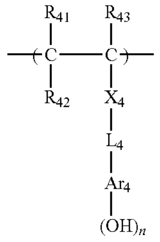

(I)

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, and in this case, $R_{42}$ represents a single bond or an alkylene group.

$X_4$ represents a single bond, —COO—, or —$CONR_{64}$—, where $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

[9] An actinic ray-sensitive or radiation-sensitive film formed of the actinic ray-sensitive or radiation-sensitive resin composition as described in any one of [1] to [8].

[10] A pattern forming method comprising:

a resist film forming step of forming a resist film using the actinic ray-sensitive or radiation-sensitive resin composition as described in any one of [1] to [8];

an exposing step of exposing the resist film; and a developing step of developing the exposed resist film, using a developer.

[11] A method for manufacturing an electronic device, comprising the pattern forming method as described in [10].

According to the present invention, it is possible to provide an actinic ray-sensitive or radiation-sensitive resin composition which is excellent in a resolution and a line width roughness (LWR) performance, and can reduce development defects and etching defects; and an actinic ray-sensitive or radiation-sensitive film, a pattern forming method, and a method for manufacturing an electronic device, each using the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV light), X-rays, soft X-rays, electron beams (EB), or the like. "Light" in the present specification means actinic rays or radiation. Unless otherwise specified, "exposure" in the present specification encompasses not only exposure by a bright line spectrum of a mercury lamp, far ultraviolet rays typified by an excimer laser, extreme ultraviolet rays (EUV light), X-rays, or the like, but also lithography by particle rays such as electron beams and ion beams.

In the present specification, a numerical range expressed using "to" is used in a meaning of a range that includes the preceding and succeeding numerical values of "to" as the lower limit value and the upper limit value, respectively.

In the present specification, (meth)acrylate represents at least one of acrylate or methacrylate. In addition, (meth) acrylic acid represents at least one of acrylic acid or methacrylic acid.

In the present specification, the weight-average molecular weight (Mw), the number-average molecular weight (Mn), and the dispersity (also referred to as a molecular weight distribution) (Mw/Mn) of a resin are each defined as a value expressed in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

In notations for a group (atomic group) in the present specification, in a case where the group is cited without specifying that it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, the types of substituents, the positions of substituents, and the number of substituents in a case where it is described that "a substituent may be contained" are not particularly limited. The number of the substituents may be, for example, one, two, three, or more. Examples of the substituent include a monovalent non-metal atomic group excluding a hydrogen atom, and the substituent can be selected from, for example, the following substituent T.

(Substituent T)

Examples of the substituent T include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; alkyl groups (for example, an alkyl group having 1 to 10 carbon atoms); cycloalkyl groups (for example, a cycloalkyl group having 3 to 20 carbon atoms); aryl groups (for example, an aryl group having 6 to 20 carbon atoms); a heteroaryl group; a hydroxy group; a carboxy group; a formyl group; a sulfo group; a cyano group; an alkylaminocarbonyl group; an arylaminocarbonyl group; a sulfonamide group; a silyl group; an amino group; a monoalkylamino group; a dialkylamino group; an arylamino group, a nitro group; and a combination thereof.

The actinic ray-sensitive or radiation-sensitive resin composition according to an embodiment of the present invention (hereinafter also referred to as "the composition of the embodiment of the present invention") is an actinic ray-sensitive or radiation-sensitive resin composition containing (A) a resin having a group having a polarity that increases through decomposition by an action of an acid, (B) a compound represented by General Formula (b1), which generates an acid upon irradiation with actinic rays or radiation, and (C) a compound represented by General Formula (c1), which generates an acid upon irradiation with actinic rays or radiation, in which a ratio of a content of the compound (C) to a content of the compound (B) is from 0.01% by mass to 10% by mass.

$$_{n}(A—L)—X—SO_3^- \ M^+ \tag{b1}$$

In General Formula (b1), L represents a single bond or a divalent linking group. In a case where there are a plurality of L's, the plurality of L's may be the same as or different from each other. A represents a group that decomposes by the action of an acid. In a case where there are a plurality of A's, the plurality of A's may be the same as or different from each other. n represents an integer from 1 to 5. X represents an (n+1)-valent linking group. $M^+$ represents a sulfonium ion or an iodonium ion.

$$_{n}(B—L)—X—SO_3^- \ M^+ \tag{c1}$$

In General Formula (c1), L represents a single bond or a divalent linking group. In a case where there are a plurality of L's, the plurality of L's may be the same as or different from each other. n represents an integer from 1 to 5. X represents an (n+1)-valent linking group. $M^+$ represents a sulfonium ion or an iodonium ion. It should be noted that L, n, X, and $M^+$ in General Formula (c1) are the same as L, n, X, and $M^+$ in General Formula (b1), respectively. B represents a group that decomposes by the action of an acid, a hydroxy group, or a carboxy group. In a case where there are a plurality of B's, the plurality of B's may be the same as or different from each other. It should be noted that at least one B represents the hydroxy group or the carboxy group.

The composition of the embodiment of the present invention is preferably a resist composition, and may be either a positive tone resist composition or a negative tone resist composition. In addition, the resist composition may be either a resist composition for alkali development or a resist composition for organic solvent development. Among those, the positive tone resist composition, which is a resist composition for alkali development, is preferable.

Furthermore, the composition of the embodiment of the present invention is preferably a chemically amplified resist composition, and more preferably a chemically amplified positive tone resist composition.

A reason why the composition of the embodiment of the present invention is excellent in a resolution and an LWR performance, and can reduce development defects and etching defects has not been completely clarified, but the present inventors have presumed the reason to be as follows.

The composition of the embodiment of the present invention contains a compound (B) which is a compound that generates an acid upon irradiation with actinic rays or radiation and has a group that decomposes by the action of an acid, and further contains a compound (C) which has the same skeleton as that of the compound (B) and has a hydroxy group or a carboxy group at a specific ratio with respect to the compound (B).

It is considered that since the compound (C) has a hydroxy group or a carboxy group, it serves as a dissolution accelerator for a film formed by using the composition of the embodiment of the present invention, and development defects caused by the undissolved film are suppressed.

It is considered that since the amount of the compound (C) added is in an appropriate range, the solubility of the film in a developer does not increase excessively and a resolution is excellent. In addition, it is considered that metal impurities causing etching defects are easily coordinated with respect to the hydroxy group or the carboxy group contained in the compound (C), but since the amount of the compound (C) added is in an appropriate range, the etching defects Is unlikely to occur.

Furthermore, it is considered that since the compound (C) has the same skeleton as the compound (B), it is easily compatible with the compound (B), and the LWR performance is improved by uniformly distributing the compound (B) in the film.

[(A) Resin Having Group that Polarity that Increase Through Decomposition by Action of Acid]

(A) A resin having a group having a polarity that increases through decomposition by the action of an acid (also referred to as a "resin (A)") will be described.

The resin (A) is a resin (hereinafter also referred to as an "acid-decomposable resin") having a group having a polarity that increases through decomposition by the action of an acid (also referred to as an "acid-decomposable group").

Since the resin (A) has the acid-decomposable group, it is a resin having a solubility in an alkali developer that increases through decomposition by the action of an acid.

The resin (A) preferably has a repeating unit having an acid-decomposable group.

As the resin (A), a known resin can be appropriately used. For example, the known resins disclosed in paragraphs [0055] to [0191] of the specification of US2016/0274458A1, paragraphs [0035] to [0085] of the specification of US2015/0004544A1, or paragraphs [0045] to [0090] of the specification of US2016/0147150A1 can be suitably used as the resin (A).

The acid-decomposable group preferably has a structure in which a polar group is protected with a group that leaves through decomposition by the action of an acid (leaving group).

Examples of the polar group include an acidic group (typically a group which dissociates in a 2.38%-by-mass aqueous tetramethylammonium hydroxide solution), such as a carboxy group, a phenolic hydroxy group, a fluorinated alcohol group, a sulfonic acid group, a sulfonamide group, a sulfonylimide group, an (alkylsulfonyl)(alkylcarbonyl) methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxy group.

Moreover, the alcoholic hydroxy group refers to a hydroxy group bonded to a hydrocarbon group, which is a hydroxy group other than a hydroxy group (phenolic hydroxy group) directly bonded to an aromatic ring, from which an aliphatic alcohol group (for example, a hexafluoroisopropanol group) having the α-position substituted with an electron-withdrawing group such as a fluorine atom is excluded as a hydroxy group. The alcoholic hydroxy group is preferably a hydroxy group having an acid dissociation constant (pKa) from 12 to 20.

Among those, as the polar group, the carboxy group, the phenolic hydroxy group, the fluorinated alcohol group (preferably the hexafluoroisopropanol group), or the sulfonic acid group is preferable.

Examples of the group that leaves through decomposition by the action of an acid (leaving group) include groups represented by Formulae (Y1) to (Y4).

$-C(Rx_1)(Rx_2)(Rx_3)$ Formula (Y1):

$-C(=O)OC(Rx_1)(Rx_2)(Rx_3)$ Formula (Y2):

$-C(R_{36})(R_{37})(OR_{38})$ Formula (Y3):

$-C(Rn)(H)(Ar)$ Formula (Y4):

In Formula (Y1) and Formula (Y2), $Rx_1$ to $Rx_3$ each independently represent an (linear or branched) alkyl group or a (monocyclic or polycyclic) cycloalkyl group. Furthermore, in a case where all of $Rx_1$ to $Rx_3$ are (linear or branched) alkyl groups, it is preferable that at least two of $Rx_1$, $Rx_2$, or $Rx_3$ are methyl groups.

Among those, it is preferable that $Rx_1$ to $Rx_3$ each independently represent a linear or branched alkyl group, and it is more preferable that $Rx_1$ to $Rx_3$ each independently represent a linear alkyl group.

Two of $Rx_1$ to $Rx_3$ may be bonded to each other to form a monocycle or a polycycle.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable, and a monocyclic cycloalkyl group having 5 or 6 carbon atoms is more preferable.

In the cycloalkyl group formed by the bonding of two of $Rx_1$ to $Rx_3$, for example, one of the methylene groups constituting the ring may be substituted with a heteroatom such as an oxygen atom or a group having a heteroatom, such as a carbonyl group.

With regard to the group represented by Formula (Y1) or Formula (Y2), for example, an aspect in which $Rx_1$ is a methyl group or an ethyl group, and $Rx_2$ and $Rx_3$ are bonded to each other to form a cycloalkyl group is preferable.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include an alkyl group, a cycloalkyl group, an aryl group, an aralkyl group, and an alkenyl group. It is also preferable that $R_{36}$ is the hydrogen atom.

As Formula (Y3), a group represented by Formula (Y3-1) is preferable.

(Y3-1)

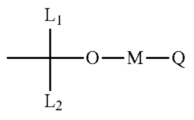

Here, $L_1$ and $L_2$ each independently represent a hydrogen atom, an alkyl group, a cycloalkyl group, an aryl group, or a group formed by combination thereof (for example, a group formed by a combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination thereof (for example, a group formed by a combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

Furthermore, it is preferable that one of $L_1$ or $L_2$ is a hydrogen atom, and the other is an alkyl group, a cycloalkyl group, an aryl group, or a group formed by a combination of an alkylene group and an aryl group.

At least two of Q, M, or $L_1$ may be bonded to each other to form a ring (preferably a 5-membered or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane group. In these aspects, since the glass transition temperature (Tg) and the activation energy are higher, it is possible to suppress fogging in addition to ensuring film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably an aryl group.

The resin (A) preferably has an acetal structure.

The acid-decomposable group preferably has an acetal structure. The acetal structure is, for example, a structure in which a polar group such as a carboxy group, a phenolic hydroxy group, and a fluorinated alcohol group is protected with the group represented by Formula (Y3).

As the repeating unit having an acid-decomposable group, a repeating unit represented by Formula (A) is preferable.

(A)

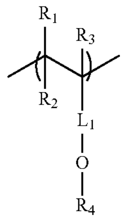

$L_1$ represents a divalent linking group, $R_1$ to $R_3$ each independently represent a hydrogen atom or a monovalent substituent, and $R_4$ represents a group that leaves through decomposition by the action of an acid.

$L_1$ represents a divalent linking group. Examples of the divalent linking group include —CO—, —O—, —S—, —SO—, —$SO_2$—, a hydrocarbon group (for example, an alkylene group, a cycloalkylene group, an alkenylene group, and an arylene group), and a linking group in which a plurality of these groups are linked. Among those, $L_1$ is preferably —CO— or the arylene group.

As the arylene group, a phenylene group is preferable.

The alkylene group may be linear or branched. The number of carbon atoms of the alkylene group is not particularly limited, but is preferably 1 to 10, and more preferably 1 to 3.

$R_1$ to $R_3$ each independently represent a hydrogen atom or a monovalent substituent. Examples of the monovalent substituent include an alkyl group, a cycloalkyl group, and a halogen atom.

The alkyl group may be linear or branched. The number of carbon atoms of the alkyl group is not particularly limited, but is preferably 1 to 10, and more preferably 1 to 3.

The cycloalkyl group may be monocyclic or polycyclic. This cycloalkyl group preferably has 3 to 8 carbon atoms.

Examples of the halogen atom include a fluorine atom, a chlorine atom, a bromine atom, and an iodine atom.

$R_4$ represents a group that leaves through decomposition by the action of an acid (leaving group).

Among those, examples of the leaving group include the groups represented by Formulae (Y1) to (Y4), and the group represented by Formula (Y3) is preferable.

In a case where each of the groups has a substituent, examples of the substituent include an alkyl group (having 1 to 4 carbon atoms), a halogen atom, a hydroxy group, an alkoxy group (having 1 to 4 carbon atoms), a carboxy group, and an alkoxycarbonyl group (having 2 to 6 carbon atoms). The substituent preferably has 8 or less carbon atoms.

As the repeating unit having an acid-decomposable group, a repeating unit represented by General Formula (AI) is also preferable.

(AI)

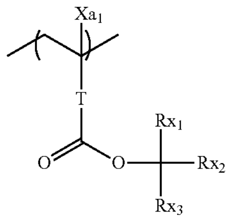

In General Formula (AI), $Xa_1$ represents a hydrogen atom or an alkyl group.

T represents a single bond or a divalent linking group.

$Rx_1$ to $Rx_3$ each independently represent an (linear or branched) alkyl group or a (monocyclic or polycyclic) cycloalkyl group. It should be noted that in a case where all of $Rx_1$ to $Rx_3$ are (linear or branched) alkyl groups, at least two of $Rx_1$, $Rx_2$, or $Rx_3$ are preferably methyl groups.

Two of $Rx_1$ to $Rx_3$ may be bonded to each other to form a (monocyclic or polycyclic) cycloalkyl group.

Examples of the alkyl group represented by $Xa_1$ include a methyl group and a group represented by —$CH_2$—$R_{11}$. $R_{11}$ represents a halogen atom (a fluorine atom or the like), a hydroxy group, or a monovalent organic group, examples thereof include an alkyl group having 5 or less carbon atoms and an acyl group having 5 or less carbon atoms, the alkyl group having 3 or less carbon atoms is preferable, and a methyl group is more preferable. $Xa_1$ is preferably a hydrogen atom, a methyl group, a trifluoromethyl group, or a hydroxymethyl group.

Examples of the divalent linking group of T include an alkylene group, an aromatic ring group, a —COO-Rt- group, and an —O-Rt- group. In Formulae, Rt represents an alkylene group or a cycloalkylene group.

T is preferably a single bond or the —COO-Rt- group. In a case where T represents the —COO-Rt- group, Rt is preferably an alkylene group having 1 to 5 carbon atoms, and is more preferably a —$CH_2$— group, a —$(CH_2)_2$— group, or a —$(CH_2)_3$— group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom or a group having a heteroatom, such as a carbonyl group.

With regard to the repeating unit represented by General Formula (AI), for example, an aspect in which $Rx_1$ is a methyl group or an ethyl group, and $Rx_2$ and $Rx_3$ are bonded to each other to form the above-mentioned cycloalkyl group is preferable.

In a case where each of the groups has a substituent, examples of the substituent include an alkyl group (having 1 to 4 carbon atoms), a halogen atom, a hydroxy group, an alkoxy group (having 1 to 4 carbon atoms), a carboxy group, and an alkoxycarbonyl group (having 2 to 6 carbon atoms). The substituent preferably has 8 or less carbon atoms.

The repeating unit represented by General Formula (AI) is preferably an acid-decomposable tertiary alkyl (meth) acrylate ester-based repeating unit (the repeating unit in which $Xa_1$ represents a hydrogen atom or a methyl group, and T represents a single bond).

The resin (A) may include only one kind of the repeating units having an acid-decomposable group or a combination of two or more kinds of the repeating units.

A content of the repeating unit having an acid-decomposable group included in the resin (A) (in a case where a plurality of the repeating units having an acid-decomposable group are present, a total content thereof) is preferably 10% to 90% by mole, more preferably 20% to 80% by mole, and still more preferably 30% to 70% by mole with respect to all the repeating units of the resin (A).

(Repeating Unit Having Lactone Group or Sultone Group)

The resin (A) may further have a repeating unit having a lactone group or a sultone group.

As the lactone group or the sultone group, any of groups having a lactone structure or a sultone structure can be used, but a group having a 5- to 7-membered ring lactone structure or a 5- to 7-membered ring sultone structure is preferable; and the group in which another ring structure is fused to the 5- to 7-membered ring lactone structure so as to form a bicyclo structure or a spiro structure, or the group in which another ring structure is fused to the 5- to 7-membered ring sultone structure so as to form a bicyclo structure or a spiro structure is more preferable. The resin (A) more preferably has a repeating unit having a group having lactone structure represented by any of General Formulae (LC1-1) to (LC1-21) or a group having a sultone structure represented by any of General Formula (SL1-1), (SL1-2), or (SL1-3). Furthermore, a group having a lactone structure or a sultone structure may be bonded directly to the main chain. As the preferred structure, groups represented by General Formula (LC1-1), General Formula (LC1-4), General Formula (LC1-5), General Formula (LC1-6), General Formula (LC1-13), and General Formula (LC1-14) are preferable.

LC1-1

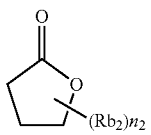

-continued

LC1-2

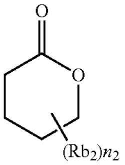

LC1-3

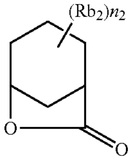

LC1-4

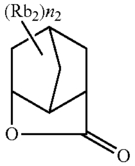

LC1-5

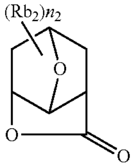

LC1-6

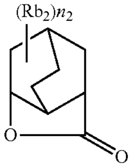

LC1-7

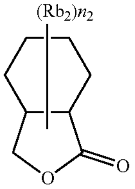

LC1-8

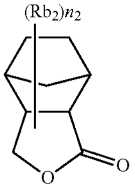

LC1-9

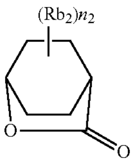

LC1-10

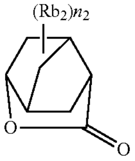

-continued

LC1-11

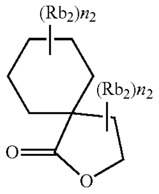

LC1-12

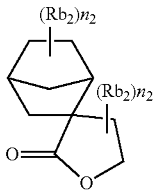

LC1-13

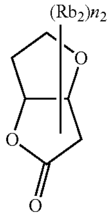

LC1-14

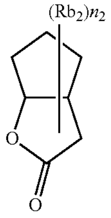

LC1-15

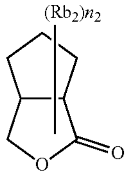

LC1-16

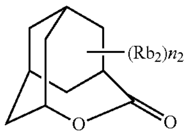

LC1-17

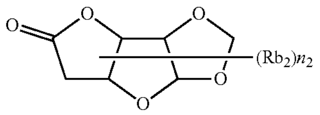

LC1-18

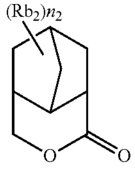

-continued

LC1-19

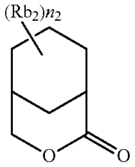

LC1-20

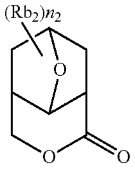

LC1-21

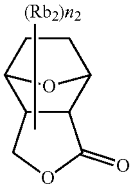

SL1-1

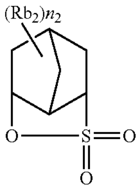

SL1-2

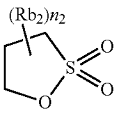

SL1-3

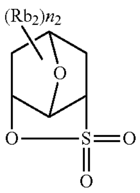

The lactone structural moiety or the sultone structural moiety may have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxy group, a halogen atom, a hydroxy group, a cyano group, and an acid-decomposable group. n2 represents an integer of 0 to 4. In a case where n2 is 2 or more, $Rb_2$'s which are present in a plural number may be different from each other, and $Rb_2$'s which are present in a plural number may be bonded to each other to form a ring.

Examples of the repeating unit having the group having a lactone structure or a sultone structure include a repeating unit represented by General Formula (AII).

(AII)

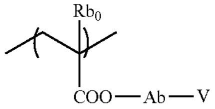

In General Formula (AII), $Rb_0$ represents a hydrogen atom, a halogen atom, or an alkyl group having 1 to 4 carbon atoms.

Preferred examples of the substituent which may be contained in the alkyl group of $Rb_0$ include a hydroxy group and a halogen atom.

Examples of the halogen atom of $Rb_0$ include a fluorine atom, a chlorine atom, a bromine atom, and an iodine atom. $Rb_0$ is preferably the hydrogen atom or a methyl group.

Ab represents a single bond, an alkylene group, a divalent linking group having a monocyclic or polycyclic alicyclic hydrocarbon structure, an ether group, an ester group, a carbonyl group, a carboxy group, or a divalent group formed by combination thereof. Among those, the single bond or a linking group represented by $-Ab_1-CO_2-$ is preferable. $Ab_1$ is a linear or branched alkylene group or a monocyclic or polycyclic cycloalkylene group, and preferably a methylene group, an ethylene group, a cyclohexylene group, an adamantylene group, or a norbornylene group.

V represents a group having a lactone structure or a sultone structure.

As the group having the lactone structure or the sultone structure of V, a group represented by any of General Formulae (LC1-1) to (LC1-21) and General Formulae (SL1-1) to (SL1-3) is preferable.

The repeating unit having the group having a lactone structure or a sultone structure usually has optical isomers, and any of optical isomers may be used. In addition, one kind of optical isomers may be used alone or a plurality of kinds of optical isomers may be mixed and used. In a case where one kind of optical isomers is mainly used, an optical purity (ee) thereof is preferably 90 or more, and more preferably 95 or more.

In addition, the resin (A) may have a repeating unit having a structure in which one or more methanediyl groups in a lactone structure or a sultone structure are substituted with oxygen atoms or sulfur atoms.

Specific examples of the repeating unit having a group having a lactone structure or a sultone structure, and the repeating unit having a structure in which one or more methanediyl groups in the lactone structure or the sultone structure are substituted with oxygen atoms or sulfur atoms are shown below, but the present invention is not limited thereto. Furthermore, in the formulae, Rr represents H, $CH_3$, $CH_2OK$ or $CF_3$.

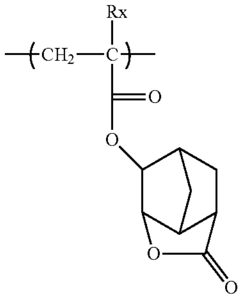

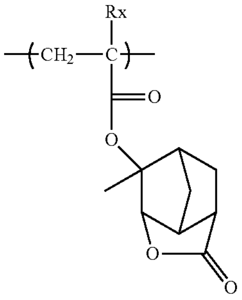

-continued

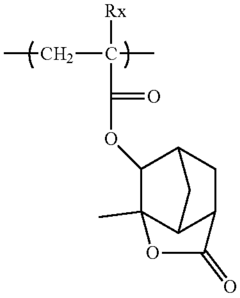

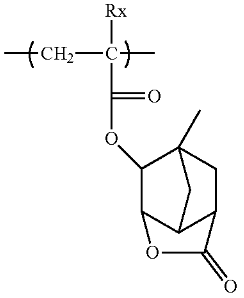

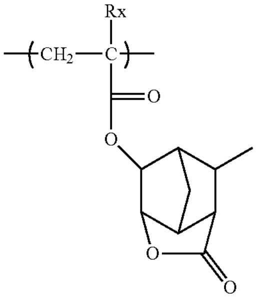

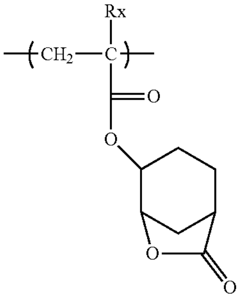

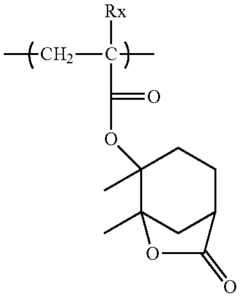

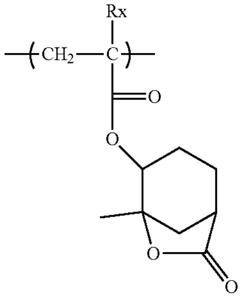

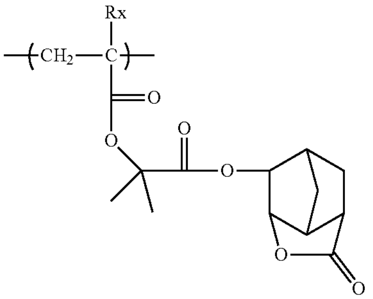

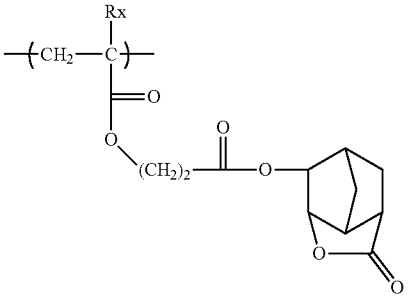

-continued
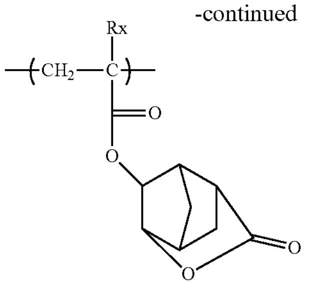
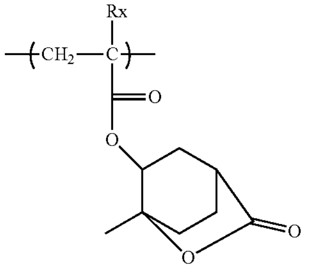
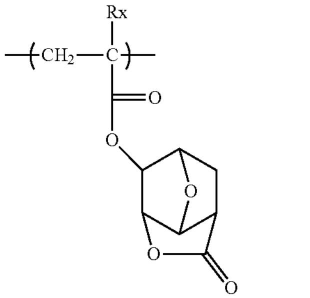
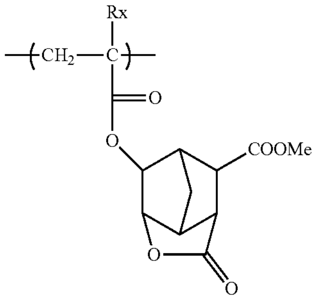
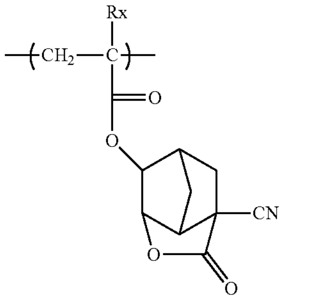
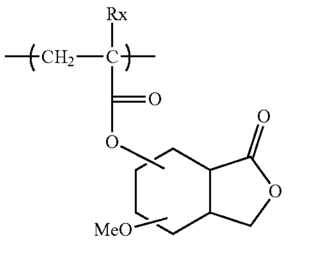
-continued
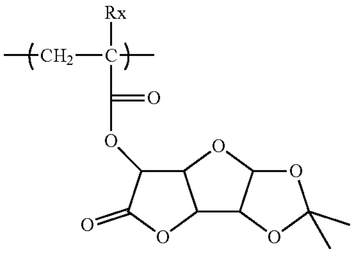
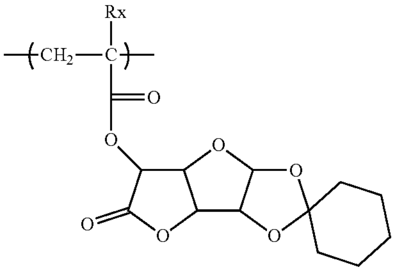
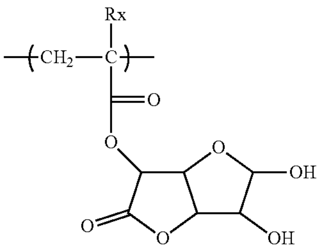
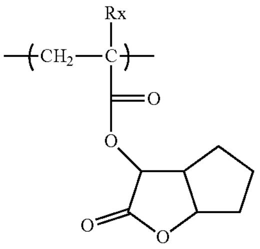
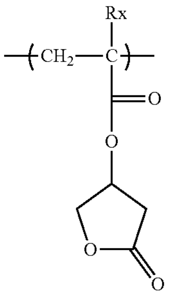
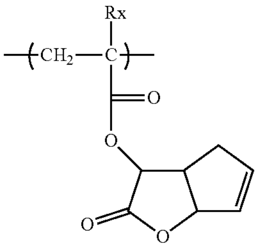
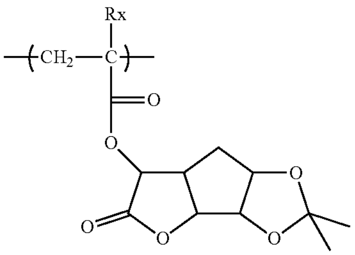

-continued
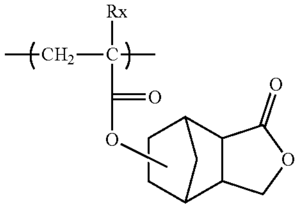
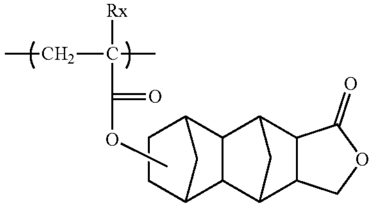
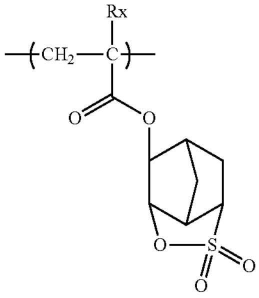
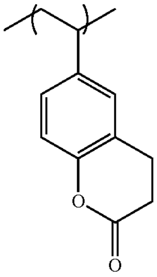
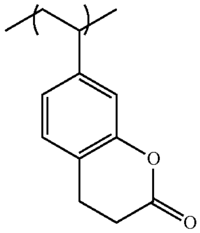
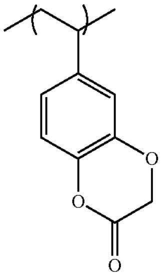
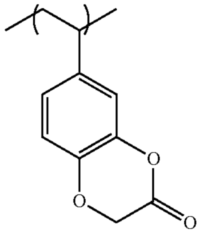
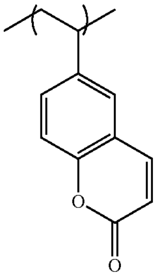
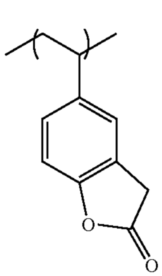
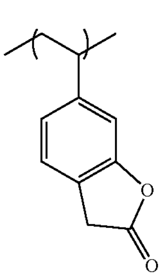
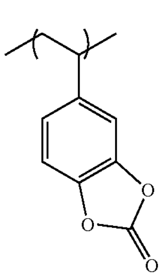
-continued
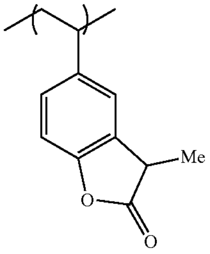
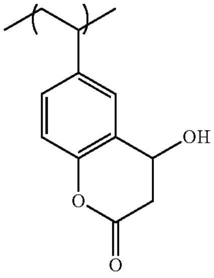
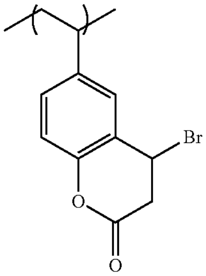
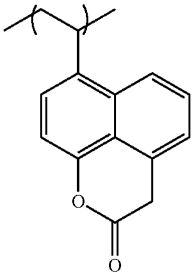
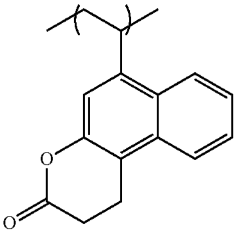
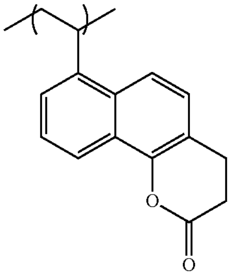
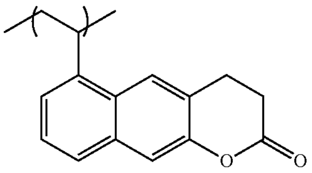
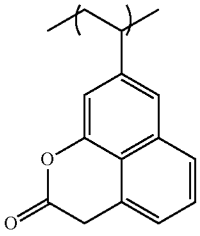
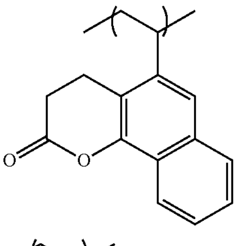
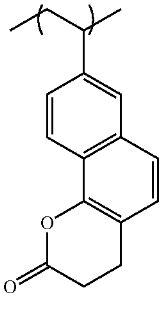
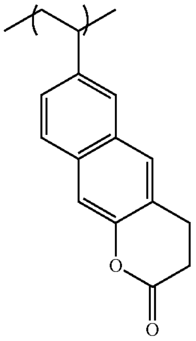
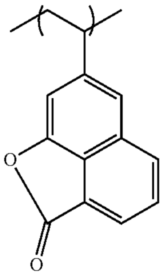

-continued
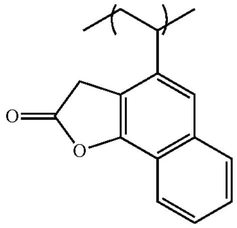
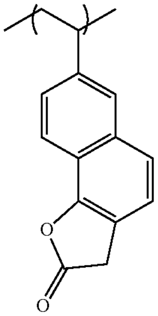
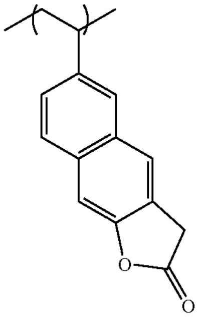
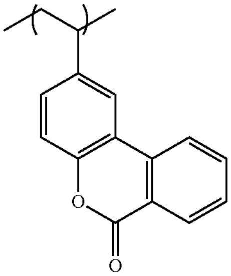
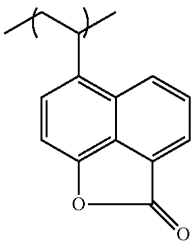
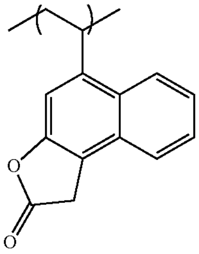
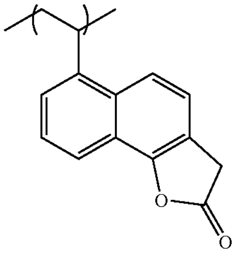
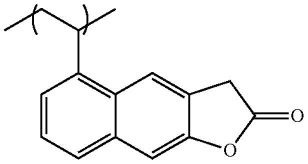
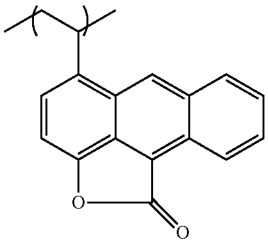
-continued
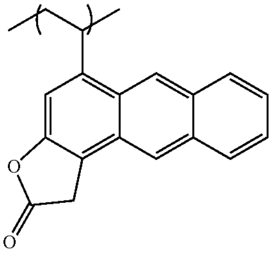
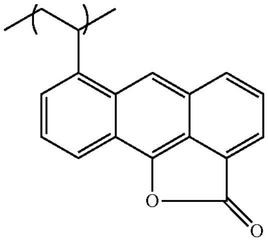
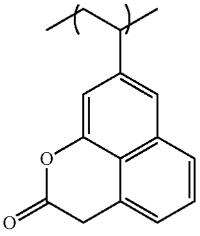
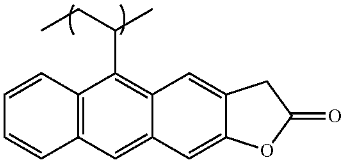
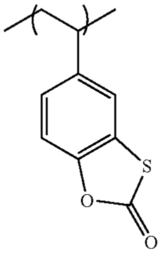
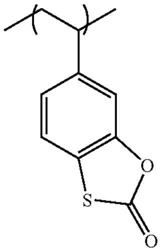
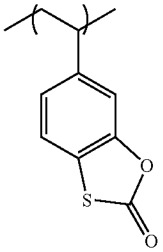
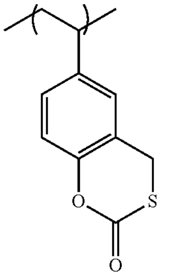
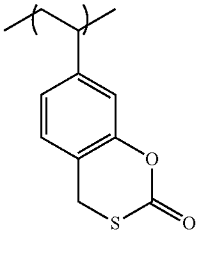
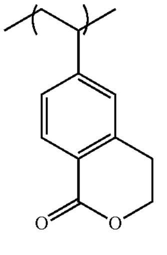
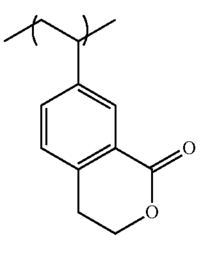
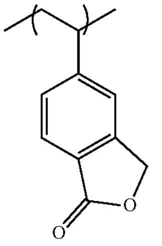

-continued

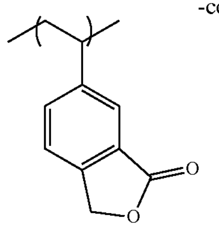

A content of the repeating unit having a lactone group or a sultone group is preferably 1% to 60% by mole, more preferably 5% to 50% by mole, and still more preferably 10% to 40% by mole with respect to all the repeating units in the resin (A).

(Repeating Unit Having Acid Group)

The resin (A) may have a repeating unit having an acid group.

As the acid group, an acid group having an acid dissociation constant (pKa) of 13 or less is preferable.

The pKa is the same as the pKa in the pKa of an acid generated by the compound (B) which will be described later, upon irradiation with actinic rays or radiation.

As the repeating unit having an acid group, a repeating unit represented by Formula (B) is preferable.

(B)

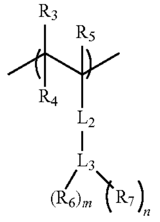

$R_3$ represents a hydrogen atom or a monovalent organic group.

As the monovalent organic group, a group represented by $-L_4-R_8$ is preferable. $L_4$ represents a single bond or an ester group. Examples of $R_8$ include an alkyl group, a cycloalkyl group, an aryl group, and a group formed by combination thereof.

$R_4$ and $R_5$ each independently represent a hydrogen atom, a halogen atom, or an alkyl group.

Examples of the halogen atom include a fluorine atom, a chlorine atom, a bromine atom, or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be either a monocycle or a polycycle, and examples thereof include a cycloalkyl ring group.

$R_6$ represents a hydroxy group or a fluorinated alcohol group (preferably a hexafluoroisopropanol group). Furthermore, in a case where $R_6$ is a hydroxy group, $L_3$ is preferably the (n+m+1)-valent aromatic hydrocarbon ring group.

$R_7$ represents a halogen atom. Examples of the halogen atom include a fluorine atom, a chlorine atom, a bromine atom, or an iodine atom.

m represents an integer of 1 or more. m is preferably an integer of 1 to 3 and more preferably an integer of 1 or 2.

n represents 0 or an integer of 1 or more. n is preferably an integer of 1 to 4.

Furthermore, (n+m+1) is preferably an integer of 1 to 5.

As the repeating unit having an acid group, a repeating unit represented by General Formula (I) is also preferable.

It is a preferable aspect of the resin (A) that the resin (A) includes a repeating unit represented by General Formula (I).

(I)

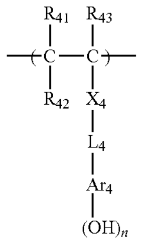

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, and in this case, $R_{42}$ represents a single bond or an alkylene group.

$X_4$ represents a single bond, —COO—, or —$CONR_{64}$—, where $R_{64}$ represents a hydrogen atom or an alkyl group.

$L_4$ represents a single bond or an alkylene group.

$Ar_4$ represents an (n+1)-valent aromatic ring group, and in a case where Ar is bonded to $R_{42}$ to form a ring, $Ar_4$ represents an (n+2)-valent aromatic ring group.

n represents an integer of 1 to 5.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in General Formula (I) may be monocyclic or polycyclic. Among those, a cycloalkyl group having 3 to 8 carbon atoms, such as a cyclopropyl group, a cyclopentyl group, and a monocyclic cyclohexyl group, is preferable.

Examples of the halogen atom of each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in General Formula (I), the same ones as the alkyl group in each of $R_{41}$, $R_{42}$, and $R_{43}$ are preferable.

Preferred examples of the substituent in each of the groups include an alkyl group, a cycloalkyl group, an aryl group, an amino group, an amide group, a ureide group, a urethane group, a hydroxy group, a carboxy group, a halogen atom, an alkoxy group, a thioether group, an acyl group, an acyloxy group, an alkoxycarbonyl group, a cyano group, and a nitro group. The substituent preferably has 8 or less carbon atoms.

$Ar_4$ represents an (n+1)-valent aromatic ring group. The divalent aromatic ring group in a case where n is 1 may have a substituent, and is preferably, for example, an arylene group having 6 to 18 carbon atoms, such as a phenylene group, a tolylene group, a naphthylene group, and an anthracenylene group, or an aromatic ring group including a heterocycle such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

Specific examples of the (n+1)-valent aromatic ring group in a case where n is an integer of 2 or more include groups formed by removing any (n−1) hydrogen atoms from the above-described specific examples of the divalent aromatic ring group.

The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group as mentioned above include the alkyl group; the alkoxy group such as a methoxy group, an ethoxy group, a hydroxyethoxy group, a propoxy group, a hydroxypropoxy group, and a butoxy group; an aryl group such as a phenyl group; and the like, as mentioned for each of $R_{41}$, $R_{42}$, and $R_{43}$ in General Formula (I).

Examples of the alkyl group of $R_{64}$ in —$CONR_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms is preferable.

As $X_4$, the single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, and a biphenylene ring group are more preferable.

The repeating unit represented by General Formula (I) preferably comprises a hydroxystyrene structure. That is, $Ar_4$ is preferably the benzene ring group.

The repeating unit represented by General Formula (I) is preferably a repeating unit represented by General Formula (1).

(1)

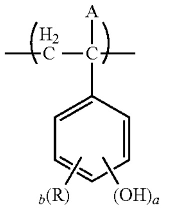

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where a plurality of R's are present, R's may be the same as or different from each other. In a case where there are a plurality of R's, R's may be combined with each other to form a ring. As R, the hydrogen atom is preferable.

a represents an integer of 1 to 3.

b represents an integer of 0 to (3-a).

Specific examples of the repeating unit represented by General Formula (I) will be shown below, but the present invention is not limited thereto. In the formula, a represents 1 or 2.

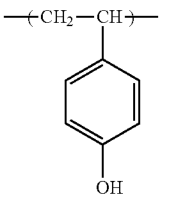

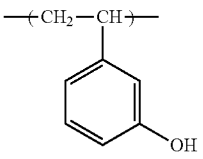

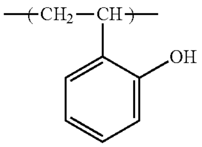

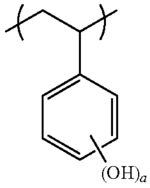

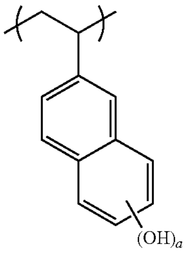

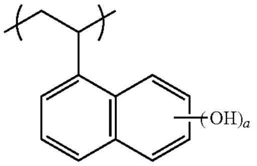

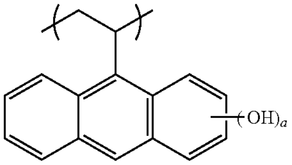

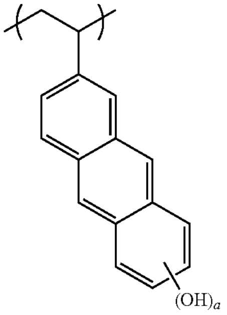

-continued
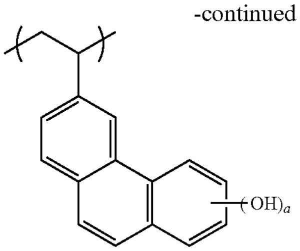
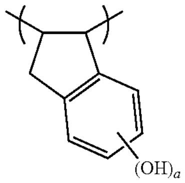
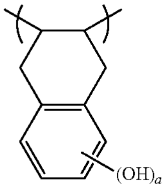
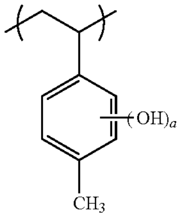
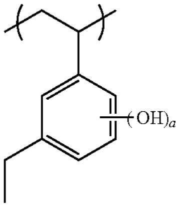
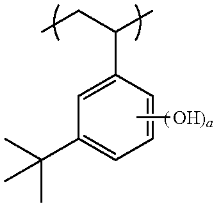
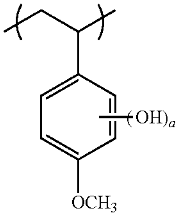
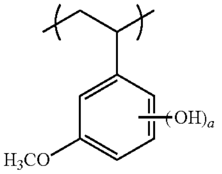
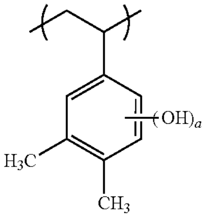
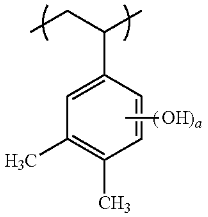
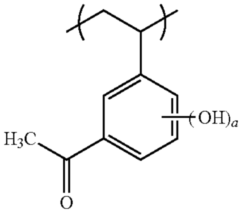
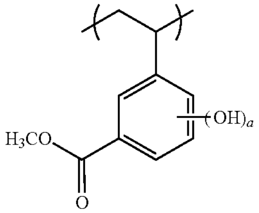
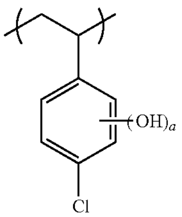
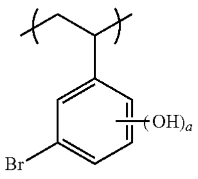
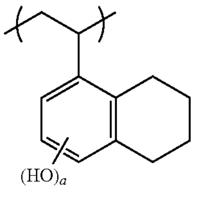
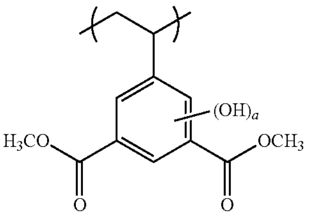
-continued
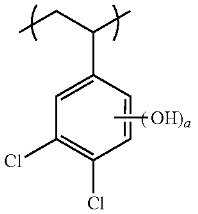
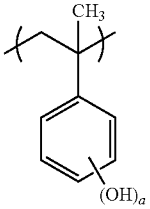
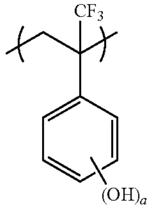
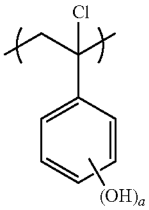
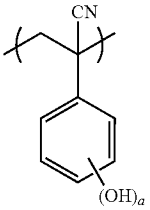
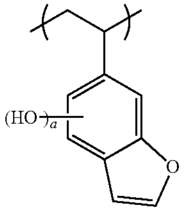
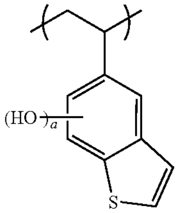
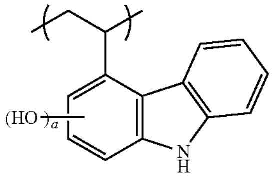
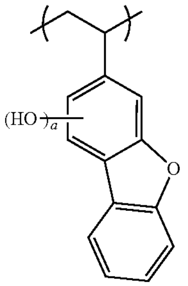
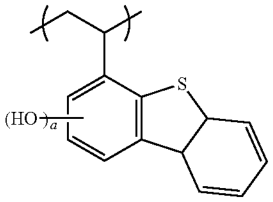
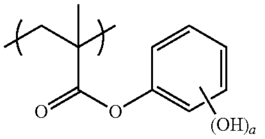
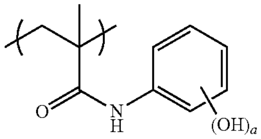
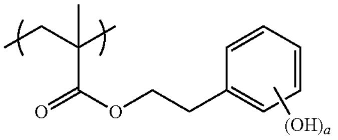
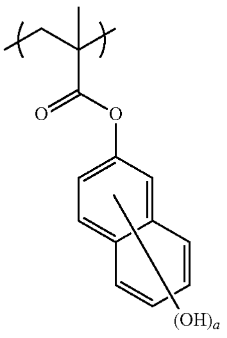
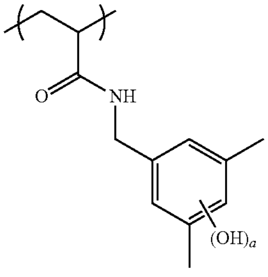

-continued

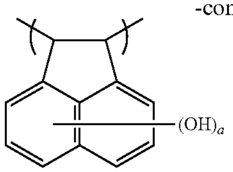

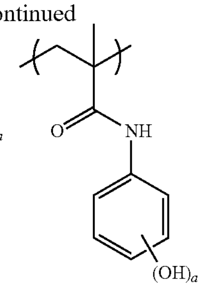

Moreover, among the repeating units, the repeating units specifically described below are preferable. In the formulae, R represents a hydrogen atom or a methyl group, and a represents 1, 2, or 3.

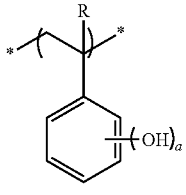

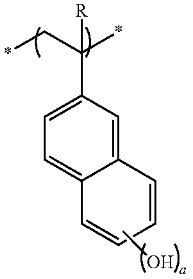

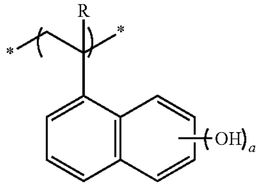

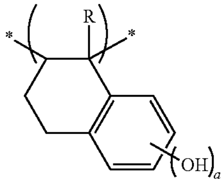

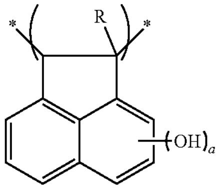

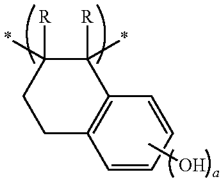

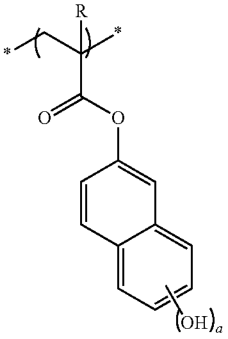

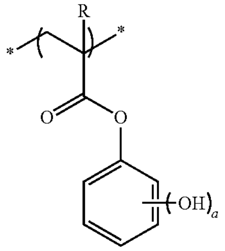

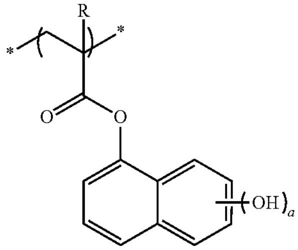

-continued

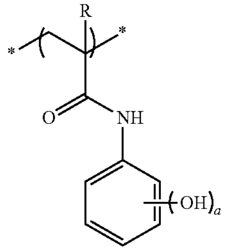

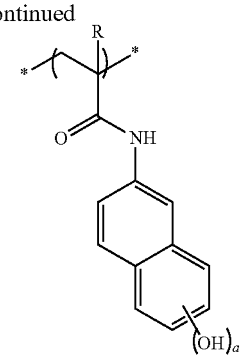

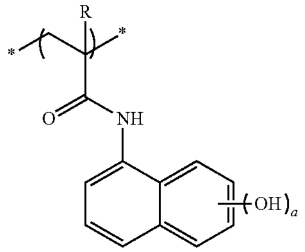

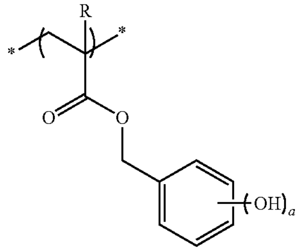

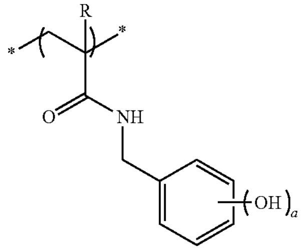

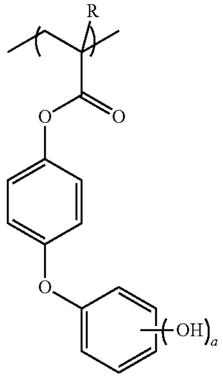

A content of the repeating unit having an acid group is preferably 10% to 90% by mole, more preferably 10% to 80% by mole, still more preferably 15% to 75% by mole, and particularly preferably 20% to 70% by mole with respect to all the repeating units in the resin (A).

The resin (A) may have a variety of repeating units, in addition to the above-mentioned repeating structural units, for the purpose of adjusting dry etching resistance, suitability for a standard developer, adhesiveness to a substrate, a resist profile, a resolving power, heat resistance, sensitivity, and the like; and other purposes.

The resin (A) can be synthesized in accordance with an ordinary method (for example, radical polymerization). Examples of the general synthesis method include (1) a batch polymerization method in which polymerization is performed by dissolving monomer species and an initiator in a solvent and heating the solution, and (2) a dropwise addition polymerization method in which a solution containing monomer species and an initiator is added dropwise to a heating solvent for 1 to 10 hours.

The weight-average molecular weight (Mw) of the resin (A) is preferably 1,000 to 200,000, more preferably 2,000 to 30,000, and still more preferably 3,000 to 25,000. The dispersity (Mw/Mn) is usually 1.0 to 3.0, preferably 1.0 to 2.6, more preferably 1.0 to 2.0, and still more preferably 1.1 to 2.0.

The resin (A) may be used alone or in combination of two or more kinds thereof.

A content of the resin (A) in the composition of the embodiment of the present invention is usually 20% by mass or more in many cases, preferably 40% by mass or more, more preferably 50% by mass or more, and still more preferably 60% by mass or more with respect to the total solid content. The upper limit is not particularly limited, but is preferably 99.5% by mass or less, more preferably 99% by mass or less, and still more preferably 98% by mass or less.

Furthermore, the total solid content of the composition of the embodiment of the present invention means other components (components that can constitute an actinic ray-sensitive or radiation-sensitive film) excluding the solvent.

[(B) Compound Represented by General Formula (b1), which Generates Acid Upon Irradiation with Actinic Rays or Radiation]

The actinic ray-sensitive or radiation-sensitive resin composition of the embodiment of the present invention contains a compound represented by General Formula (b1), which generates an acid upon irradiation with actinic rays or radiation (also referred to as a "compound (B)" or an "acid generator (B)").

The compound (B) is a compound that generates an acid upon irradiation with actinic rays or radiation (photoacid generator).

$$_{n}(A-L)-X-SO_3^- \ M^+ \qquad (b1)$$

In General Formula (b1), L represents a single bond or a divalent linking group. In a case where there are a plurality of L's, the plurality of L's may be the same as or different from each other. A represents a group that decomposes by the action of an acid. In a case where there are a plurality of A's, the plurality of A's may be the same as or different from each other. n represents an integer from 1 to 5. X represents an (n+1)-valent linking group. $M^+$ represents a sulfonium ion or an iodonium ion.

In General Formula (b1), X represents an (n+1)-valent linking group.

The linking group represented by X is not particularly limited, but examples thereof include an aliphatic group (which may be linear, branched, or cyclic), an aromatic group, —O—, —CO—, —COO—, —OCO—, and a group formed by a combination of two or more of these groups.

As the aliphatic group, a group obtained by removing n pieces of hydrogen atoms from an alkyl group (which may be linear or branched, and is preferably an alkyl group having 1 to 20 carbon atoms, and more preferably an alkyl group having 1 to 10 carbon atoms) and a group obtained by removing n pieces of hydrogen atoms from a cycloalkyl group (which may be either a monocycle or a polycycle, and is preferably a cycloalkyl group having 3 to 20 carbon atoms, and more preferably a cycloalkyl group having 5 to 10 carbon atoms) are preferable.

The aliphatic group may have a substituent, and examples of the substituent include the substituent T.

The aliphatic group may have a heteroatom (for example, a sulfur atom, an oxygen atom, and a nitrogen atom) between carbon atoms.

As the aromatic group, a group obtained by removing n pieces of hydrogen atoms from an aryl group (preferably an aryl group having 6 to 20 carbon atoms, and more preferably an aryl group having 6 to 18 carbon atoms, in which the aryl group is also preferably an aryl group having 6 to 10 carbon atoms and specific examples of the aryl group include a phenyl group and a terphenyl group) is preferable.

The aromatic group may have a substituent, and examples of the substituent include the substituent T.

The aromatic group may have a heteroatom (for example, a sulfur atom, an oxygen atom, and a nitrogen atom) between carbon atoms.

X is preferably an (n+1)-valent aromatic group.

In General Formula (b1), n represents an integer of 1 to 5, preferably represents an integer of 1 to 3, more preferably represents 2 or 3, and still more preferably represents 3.

In General Formula (b1), L represents a single bond or a divalent linking group.

The divalent linking group represented by L is not particularly limited, but examples thereof include an aliphatic group (which may be linear, branched, or cyclic), an aromatic group, —O—, —CO—, —COO—, —OCO—, and a group formed by a combination of two or more of these groups.

As the aliphatic group, an alkylene group (which may be linear or branched, and is preferably an alkylene group having 1 to 20 carbon atoms, and more preferably an alkylene group having 1 to 10 carbon atoms) and a cycloalkylene group (which may be either a monocycle or a polycycle, and is preferably a cycloalkylene group having 3 to 20 carbon atoms, and more preferably a cycloalkylene group having 5 to 10 carbon atoms) are preferable.

The aliphatic group may have a substituent, and examples of the substituent include the substituent T.

The aliphatic group may have a heteroatom (for example, a sulfur atom, an oxygen atom, and a nitrogen atom) between carbon atoms.

As the aromatic group, an arylene group (preferably an arylene group having 6 to 20 carbon atoms, and more preferably an arylene group having 6 to 10 carbon atoms) is preferable.

The aromatic group may have a substituent, and examples of the substituent include the substituent T.

The aromatic group may have a heteroatom (for example, a sulfur atom, an oxygen atom, and a nitrogen atom) between carbon atoms.

L is preferably an arylene group.

In General Formula (b1), A represents a group that decomposes by the action of an acid.

The group that decomposes by the action of an acid represented by A (acid-decomposable group) is not particularly limited, and examples thereof include the acid-decomposable group described in the resin (A).

The acid-decomposable group preferably has a structure in which a polar group is protected with a group that leaves through decomposition by the action of an acid (leaving group).

As the polar group, a carboxy group, a phenolic hydroxy group, or an alcoholic hydroxy group is preferable.

The group that decomposes by the action of an acid represented by A is preferably at least one selected from the group consisting of a group represented by General Formula (T-1) and a group represented by General Formula (T-2), and more preferably the group represented by General Formula (T-1). It is considered that the group represented by General Formula (T-1) has a high reactivity with respect to an acid, the reaction easily proceeds uniformly, and therefore, the LWR performance is particularly good.

(T-1)

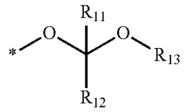

(T-2)

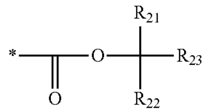

In General Formula (T-1), $R_{11}$ represents a hydrogen atom or an alkyl group.

$R_{12}$ represents a hydrogen atom, an alkyl group, a cycloalkyl group, or an aryl group, and the alkyl group and the cycloalkyl group may each include an ether bond or a carbonyl bond.

$R_{13}$ represents an alkyl group, a cycloalkyl group, or an aryl group, and the alkyl group and the cycloalkyl group may each include an ether bond or a carbonyl bond.

$R_{11}$ and $R_{12}$ may be bonded to each other to form a ring.

$R_{12}$ and $R_{13}$ may be bonded to each other to form a ring.

* represents a bond.

In General Formula (T-2), $R_{21}$, $R_{22}$, and $R_{23}$ each independently represent an alkyl group.

Two of $R_{21}$ to $R_{23}$ may be bonded to each other to form a ring.

* represents a bond.

In General Formula (T-1), $R_{11}$ represents a hydrogen atom or an alkyl group.

In a case where $R_{11}$ represents the alkyl group, the alkyl group may be linear or branched, and is preferably an alkyl group having 1 to 10 carbon atoms, more preferably an alkyl group having 1 to 5 carbon atoms, and still more preferably an alkyl group having 1 to 3 carbon atoms. Examples of the alkyl group include a methyl group, an ethyl group, a propyl group, an n-butyl group, a sec-butyl group, a hexyl group, and an octyl group.

The alkyl group may have a substituent, and examples of the substituent include the substituent T.

$R_{11}$ is preferably the hydrogen atom or the alkyl group having 1 to 3 carbon atoms, and more preferably the hydrogen atom.

In General Formula (T-1), $R_{12}$ represents a hydrogen atom, an alkyl group, a cycloalkyl group, or an aryl group.

In a case where $R_{12}$ represents the alkyl group, the alkyl group may be linear or branched, and is preferably an alkyl group having 1 to 10 carbon atoms, and more preferably an alkyl group having 1 to 5 carbon atoms. Examples of the alkyl group include a methyl group, an ethyl group, a propyl group, an n-butyl group, a sec-butyl group, a tert-butyl group, a hexyl group, and an octyl group.

The alkyl group may have a substituent, and examples of the substituent include the substituent T.

The alkyl group may include an ether bond or a carbonyl bond.

In a case where $R_{12}$ represents the cycloalkyl group, the cycloalkyl group may be a monocycle or a polycycle, and is preferably a cycloalkyl group having 3 to 20 carbon atoms, more preferably a cycloalkyl group having 5 to 15 carbon atoms, and still more preferably a cycloalkyl group having 5 to 10 carbon atoms. Examples of the cycloalkyl group include a cyclopropyl group, a cyclobutyl group, a cyclopentyl group, a cyclohexyl group, a cyclooctyl group, an adamantyl group, a norbornyl group, an isobornyl group, a camphanyl group, a dicyclopentyl group, an α-pinene group, a tricyclodecanyl group, a tetracyclododecyl group, and an androstanyl group.

The cycloalkyl group may have a substituent, and examples of the substituent include the substituent T.

The cycloalkyl group may include an ether bond or a carbonyl bond.

In a case where $R_{12}$ represents the aryl group, the aryl group is preferably an aryl group having 6 to 20 carbon atoms, more preferably an aryl group having 6 to 15 carbon atoms, and still more preferably an aryl group having 6 to 10 carbon atoms. Examples of the aryl group include a phenyl group and a naphthyl group.

The aryl group may have a substituent, and examples of the substituent include the substituent T.

$R_{12}$ is preferably the hydrogen atom or the alkyl group having 1 to 5 carbon atoms.

In General Formula (T-1), $R_{13}$ represents an alkyl group, a cycloalkyl group, or an aryl group The alkyl group, the cycloalkyl group, or the aryl group represented by $R_{13}$ is the same as the alkyl group, the cycloalkyl group, or the aryl group described as represented by $R_{12}$, respectively.

$R_{13}$ is preferably the alkyl group having 1 to 5 carbon atoms.

$R_{11}$ and $R_{12}$ may be bonded to each other to form a ring.

The ring formed by the mutual bonding of $R_{11}$ and $R_{12}$ is preferably an aliphatic ring. The aliphatic ring is preferably a cycloalkane having 3 to 20 carbon atoms, and more preferably a cycloalkane having 5 to 15 carbon atoms. The cycloalkane group may be either a monocycle or a polycycle.

The aliphatic ring may have a substituent, and examples of the substituent include the substituent T.

The aliphatic ring may have a heteroatom (for example, a sulfur atom, an oxygen atom, and a nitrogen atom) between carbon atoms.

$R_{12}$ and $R_{13}$ may be bonded to each other to form a ring.

The ring formed by the mutual bonding of $R_{12}$ and $R_{13}$ is preferably an aliphatic ring containing an oxygen atom as a ring member.

The aliphatic ring preferably has 3 to 20 carbon atoms, and more preferably has 5 to 15 carbon atoms. The aliphatic ring may be either a monocycle or a polycycle.

The aliphatic ring may have a substituent, and examples of the substituent include the substituent T.

The aliphatic ring may have a heteroatom other than an oxygen atom (for example, a sulfur atom and a nitrogen atom) between carbon atoms.

An aspect in which in General Formula (T-1), $R_{11}$ and $R_{12}$ are not bonded to each other, and $R_{12}$ and $R_{13}$ are bonded to each other to form a ring is one of preferred aspects of the present invention.

In General Formula (T-2), $R_{21}$, $R_{22}$, and $R_{23}$ each independently represent an alkyl group.

In a case where $R_{21}$, $R_{22}$, and $R_{23}$ represent the alkyl group, the alkyl group is not particularly limited and may be linear or branched. As the alkyl group, an alkyl group having 1 to 4 carbon atoms, such as a methyl group, an ethyl group, an n-propyl group, an isopropyl group, an n-butyl group, an isobutyl group, and a t-butyl group, is preferable.

The alkyl group may have a substituent. Examples of the substituent include an aryl group (for example, an aryl group having 6 to 15 carbon atoms), a halogen atom, a hydroxy group, an alkoxy group (for example, an alkoxy group having 1 to 4 carbon atoms), a carboxy group, and an alkoxycarbonyl group (for example, an alkoxycarbonyl group having 2 to 6 carbon atoms). The substituent preferably has 8 or less carbon atoms.

Two of $R_{21}$ to $R_{23}$ may be bonded to each other to form a ring.

In a case where two of $R_{21}$ to $R_{23}$ are bonded to each other to form a ring, it is preferable that two of $R_{21}$ to $R_{23}$ are bonded to each other to form a cycloalkyl group. The cycloalkyl group may be either a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group. Among those, a monocyclic cycloalkyl group having 5 or 6 carbon atoms is preferable.

In the cycloalkyl group, for example, one of the methylene groups constituting the ring may be substituted with a heteroatom such as an oxygen atom or a group having a heteroatom, such as a carbonyl group.

In General Formula (b1), $M^+$ represents a sulfonium ion or an iodonium ion.

The sulfonium ion or the iodonium ion represented by $M^+$ preferably has no nitrogen atom. It is considered that in a case where the sulfonium ion or the iodonium ion has no nitrogen atom, an acid generated is not neutralized and the LWR performance is particularly good.

$M^+$ is not particularly limited, but is preferably a cation represented by General Formula (ZIA) or General Formula (ZIIA).

(ZIA)

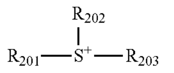

(ZIIA)

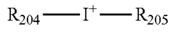

In General Formula (ZIA), $R_{201}$, $R_{202}$, and $R_{203}$ each independently represent an organic group.

The organic group as each of $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group) and $-CH_2-CH_2-O-CH_2-CH_2-$.

Preferred aspects of the cation as General Formula (ZIA) include a cation (ZI-11), a cation (ZI-12), a cation represented by General Formula (ZI-13) (cation (ZI-13)), and a cation represented by General Formula (ZI-14) (cation (ZI-14)), each of which will be described later.

The divalent or higher cation in a case where n is 2 or more may be a cation having a plurality of structures represented by General Formula (ZIA). Examples of such the cation include a divalent cation having a structure in which at least one of $R_{201}$, $R_{202}$, or $R_{203}$ of a cation represented by General Formula (ZIA) and at least one of $R_{201}$, $R_{202}$, or $R_{203}$ of another cation represented by General Formula (ZIA) are bonded via a single bond or a linking group.

First, the cation (ZI-11) will be described.

The cation (ZI-11) is a cation, that is, an arylsulfonium cation in which at least one of $R_{201}$, . . . , or $R_{203}$ of General Formula (ZIA) is an aryl group.

In the arylsulfonium cation, all of $R_{201}$ to $R_{203}$ may be aryl groups, or some of $R_{201}$ to $R_{203}$ may be aryl groups and the remainders may be alkyl groups or cycloalkyl groups.

Examples of the arylsulfonium cation include a triarylsulfonium cation, a diarylalkylsulfonium cation, an aryldialkylsulfonium cation, a diarylcycloalkylsulfonium cation, and an aryldicycloalkylsulfonium cation.

As the aryl group included in the arylsulfonium cation, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium cation has two or more aryl groups, the two or more aryl groups may be the same as or different from each other.

The alkyl group or the cycloalkyl group contained in the arylsulfonium cation, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R_{201}$ to $R_{203}$ may each independently have an alkyl group (for example, an alkyl group having 1 to 15 carbon atoms), a cycloalkyl group (for example, a cycloalkyl group having 3 to 15 carbon atoms), an aryl group (for example, an aryl group having 6 to 14 carbon atoms), an alkoxy group (for example, an alkoxy group having 1 to 15 carbon atoms), an alkylsulfonyl group (for example, an alkylsulfonyl group having 1 to 15 carbon atoms), an alkylcarbonyloxy group (for example, an alkylcarbonyloxy group having 2 to 15 carbon atoms), a halogen atom, a hydroxy group, a lactone ring group, or a phenylthio group as a substituent. These substituents may further have a substituent.

Examples of the lactone ring group include groups obtained by removing a hydrogen atom from a structure represented by any of (KA-1-1) to (KA-1-17) which will be described later.

Next, the cation (ZI-12) will be described.

The cation (ZI-12) is a compound in which $R_{201}$ to $R_{203}$ in Formula (ZIA) each independently represent an organic group having no aromatic ring. Here, the aromatic ring also includes an aromatic ring including a heteroatom.

The organic group having no aromatic ring as each of $R_{201}$ to $R_{203}$ generally has 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Preferred examples of the alkyl group and the cycloalkyl group of each of $R_{201}$ to $R_{203}$ include a linear alkyl group having 1 to 10 carbon atoms or branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

$R_{201}$ to $R_{203}$ may be further substituted with a halogen atom, an alkoxy group (for example, having 1 to 5 carbon atoms), a hydroxy group, a cyano group, or a nitro group.

Next, the cation (ZI-13) will be described.

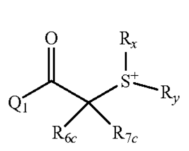

(ZI-13)

In General Formula (ZI-13), $Q_1$ represents an alkyl group, a cycloalkyl group, or an aryl group, and in a case where M has a ring structure, the ring structure may include at least one of an oxygen atom, a sulfur atom, an ester bond, an amide bond, or a carbon-carbon double bond. $R_{6c}$ and $R_{7c}$ each independently represent a hydrogen atom, an alkyl group, a cycloalkyl group, a halogen atom, a cyano group, or an aryl group. $R_{6c}$ and $R_{7c}$ may be bonded to each other to form a ring. $R_x$ and $R_y$ each independently represent an alkyl group, a cycloalkyl group, or an alkenyl group. $R_x$ and $R_y$ may be bonded to each other to form a ring. In addition, at least two selected from $Q_1$, $R_{6c}$, or $R_{7c}$ may be bonded to each other to form a ring structure, and the ring structure may include a carbon-carbon double bond.

In General Formula (ZI-13), as the alkyl group and the cycloalkyl group represented by $Q_1$, a linear alkyl group having 1 to 15 carbon atoms (preferably having 1 to 10 carbon atoms), a branched alkyl group having 3 to 15 carbon atoms (preferably having 3 to 10 carbon atoms), or a cycloalkyl group having 3 to 15 carbon atoms (preferably having 1 to 10 carbon atoms) is preferable, and specific examples thereof include a methyl group, an ethyl group, a propyl group, an n-butyl group, a sec-butyl group, a t-butyl group, a cyclopropyl group, a cyclobutyl group, a cyclohexyl group, and a norbornyl group.

The aryl group represented by $Q_1$ is preferably a phenyl group or a naphthyl group, and more preferably the phenyl group. The aryl group may be an aryl group which has a heterocyclic structure having an oxygen atom, a sulfur atom, or the like. Examples of the heterocyclic structure include a furan ring, a thiophene ring, a benzofuran ring, and a benzothiophene ring.

$Q_1$ may further have a substituent. In this aspect, examples of $Q_1$ include a benzyl group.

In addition, in a case where $Q_1$ has a ring structure, the ring structure may include at least one of an oxygen atom, a sulfur atom, an ester bond, an amide bond, or a carbon-carbon double bond.

Examples of the alkyl group, the cycloalkyl group, and the aryl group represented by each of $R_{6c}$ and $R_{7c}$ include the same ones as those of $Q_1$ as mentioned above, and preferred aspects thereof are also the same. In addition, $R_{6c}$ and $R_{7c}$ may be bonded to each other to form a ring.

Examples of the halogen atom represented by each of $R_{6c}$ and $R_{7c}$ include a fluorine atom, a chlorine atom, a bromine atom, and an iodine atom.

Examples of the alkyl group and the cycloalkyl group represented by each of $R_x$ and $R_y$ include the same ones as those of $Q_1$ as mentioned above, and preferred aspects thereof are also the same.

As the alkenyl group represented by each of $R_x$ and $R_y$, an allyl group or a vinyl group is preferable.

$R_x$ and $R_y$ may further have a substituent. In this aspect, examples of each of $R_x$ and $R_y$ include a 2-oxoalkyl group or an alkoxycarbonylalkyl group.

Examples of the 2-oxoalkyl group represented by each of $R_x$ and $R_y$ include those having 1 to 15 carbon atoms (preferably having 1 to 10 carbon atoms), and specifically a 2-oxopropyl group and a 2-oxobutyl group.

Examples of the alkoxycarbonylalkyl group represented by each of $R_x$ and $R_y$ include those having 1 to 15 carbon atoms (preferably having 1 to 10 carbon atoms). In addition, $R_x$ and $R_y$ may be bonded to each other to form a ring.

The ring structure formed by the mutual linkage of $R_x$ and $R_y$ may include an oxygen atom, a sulfur atom, an ester bond, an amide bond, or a carbon-carbon double bond.

In General Formula (ZI-13), $Q_1$ and $R_{6c}$ may be bonded to each other to form a ring structure, and the ring structure formed may include a carbon-carbon double bond.

Among those, the cation (ZI-13) is preferably a cation (ZI-13A).

The cation (ZI-13A) is a phenacylsulfonium cation represented by General Formula (ZI-13A).

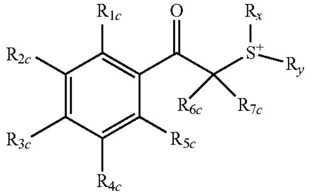

(ZI-13A)

In General Formula (ZI-13A), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxy group, a nitro group, an alkylthio group, or an arylthio group.

$R_{6c}$ and $R_{7c}$ have the same definitions as $R_{6c}$ and $R_{7c}$ in General Formula (ZI-13) as mentioned above, respectively, and preferred aspects thereof are also the same.

$R_x$ and $R_y$ have the same definitions as $R_x$ and $R_y$, respectively, in General Formula (ZI-13) described above, and preferred aspects thereof are also the same.

Any two or more of $R_{1c}$, . . . , or $R_{5c}$, or $R_x$ and $R_y$ may be bonded to each other to form a ring structure, and the ring structure may each independently include an oxygen atom, a sulfur atom, an ester bond, an amide bond, or a carbon-carbon double bond. Furthermore, $R_{5c}$ and $R_{6c}$, or $R_{5c}$ and $R_x$ may be bonded to each other to form a ring structure, and the ring structure may each independently include a carbon-carbon double bond. In addition, $R_{6c}$ and $R_{7c}$ may be bonded to each other to form a ring structure.

Examples of the ring structure include an aromatic or non-aromatic hydrocarbon ring, an aromatic or non-aromatic heterocycle, and a polycyclic fused ring in which two or more of these rings are combined. Examples of the ring structure include a 3- to 10-membered ring and the ring structure is preferably a 4- to 8-membered ring, and more preferably a 5- or 6-membered ring.

Examples of the group formed by the bonding of any two or more of $R_{1c}$, . . . , or $R_{5c}$, $R_{6c}$ and $R_{7c}$, and $R_x$ and $R_y$ include a butylene group and a pentylene group.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

Next, the cation (ZI-14) will be described.

The cation (ZI-14) is represented by General Formula (ZI-14).

(ZI-14)

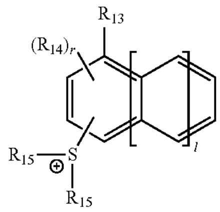

In General Formula (ZI-14), l represents an integer of 0 to 2.

r represents an integer of 0 to 8.

$R_{13}$ represents a group having a hydrogen atom, a fluorine atom, a hydroxy group, an alkyl group, a cycloalkyl group, an alkoxy group, an alkoxycarbonyl group, or a group having a monocyclic or polycyclic cycloalkyl skeleton. These groups may have a substituent.

In a case where a plurality of $R_{14}$'s are present, $R_{14}$'s each independently represent an alkyl group, a cycloalkyl group, an alkoxy group, an alkylsulfonyl group, a cycloalkylsulfonyl group, an alkylcarbonyl group, an alkoxycarbonyl group, or an alkoxy group having a monocyclic or polycyclic cycloalkyl skeleton. These groups may have a substituent.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to each other to form a ring, the ring skeleton may include a heteroatom such as an oxygen atom and a nitrogen atom. In one aspect, it is preferable that two $R_{15}$'s are alkylene groups and are bonded to each other to form a ring structure.

In General Formula (ZI-14), the alkyl group of each of $R_{13}$, $R_{14}$, and $R_{15}$ is linear or branched. The alkyl group preferably has 1 to 10 carbon atoms. As the alkyl group, a methyl group, an ethyl group, an n-butyl group, a t-butyl group, or the like is more preferable.

Next, General Formula (ZIIA) will be described.

In General Formula (ZIIA), $R_{204}$ and $R_{205}$ each independently represent an aryl group, an alkyl group, or a cycloalkyl group.

The aryl group of each of $R_{204}$ and $R_{205}$ is preferably a phenyl group or a naphthyl group, and more preferably the phenyl group. The aryl group of each of $R_{204}$ and $R_{205}$ may be an aryl group which has a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

As the alkyl group and the cycloalkyl group of each of $R_{204}$ and $R_{205}$, a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

The aryl group, the alkyl group, and the cycloalkyl group of each of $R_{204}$ and $R_{205}$ may each independently have a substituent. Examples of the substituent which may be contained in the aryl group, the alkyl group, or the cycloalkyl group of each of $R_{204}$ and $R_{205}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxy group, a lactone ring group, and a phenylthio group.

Examples of the lactone ring group include groups obtained by removing a hydrogen atom from a structure represented by any of (KA-1-1) to (KA-1-17).

KA-1-1

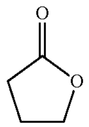

KA-1-2

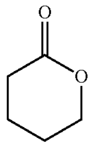

KA-1-3

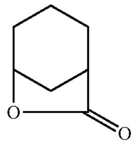

KA-1-4

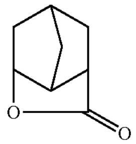

KA-1-5

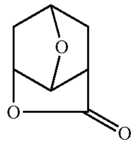

KA-1-6

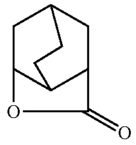

-continued
KA-1-7
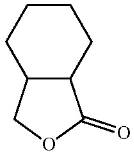
KA-1-8
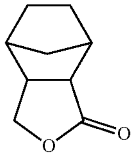
KA-1-9
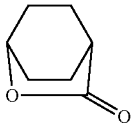
KA-1-10
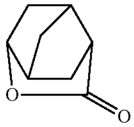
KA-1-11
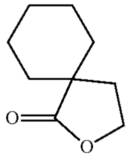
KA-1-12
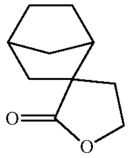
KA-1-13
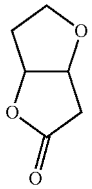
KA-1-14
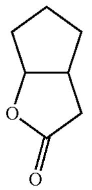
KA-1-15
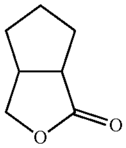
-continued
KA-1-16
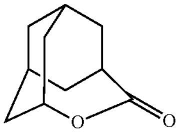
KA-1-17
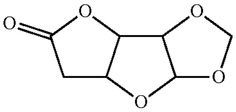
The structure containing the lactone ring structure may or may not have a substituent. Examples of the substituent include the substituent T.
Preferred examples of $M^+$ are shown below, but the present invention is not limited thereto. Me represents a methyl group and Bu represents an n-butyl group.
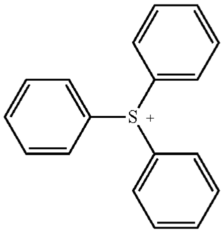
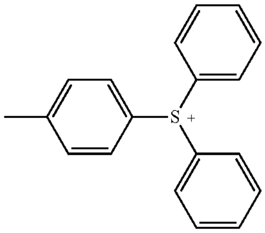
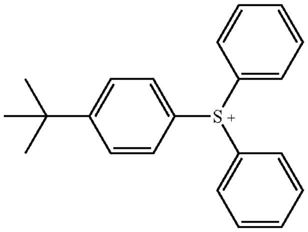
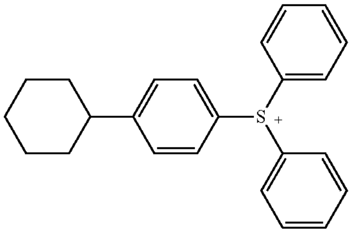
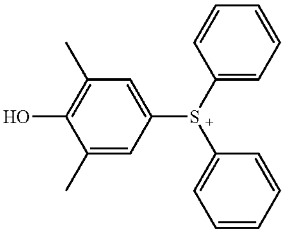
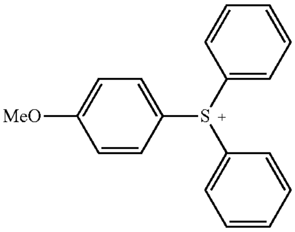

-continued
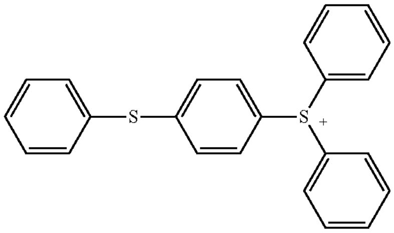
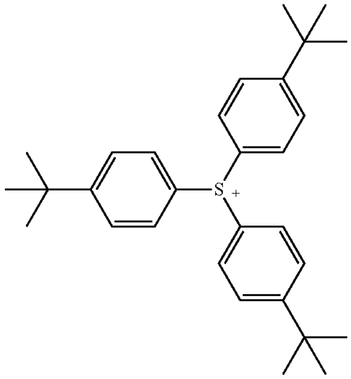
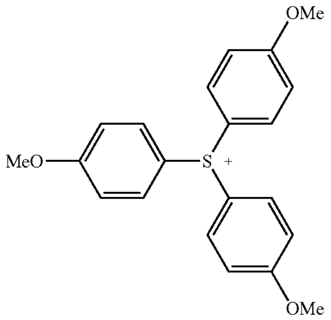
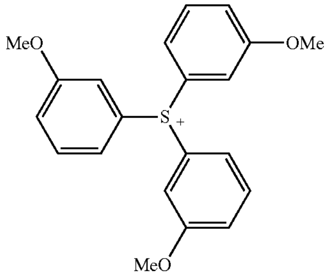
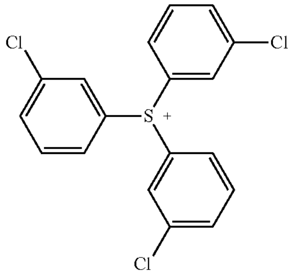
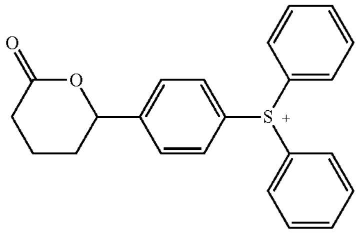
-continued
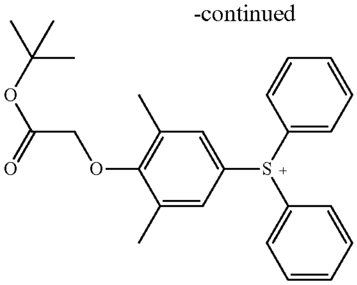
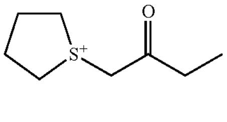
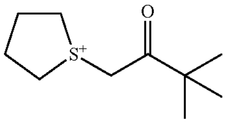
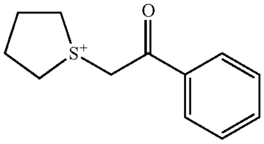
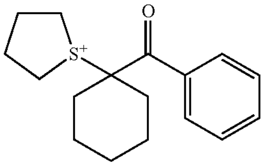
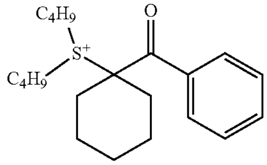
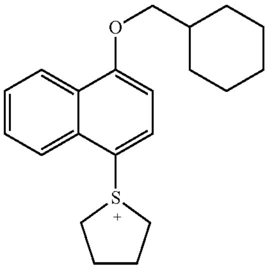
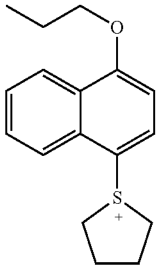
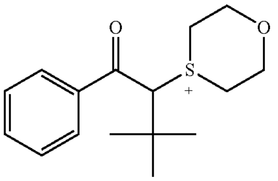
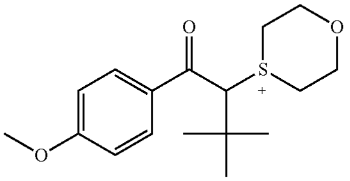
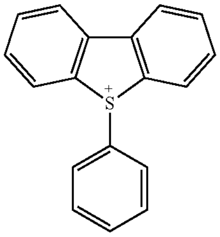
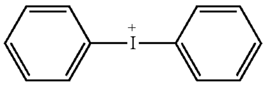

-continued
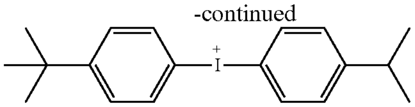
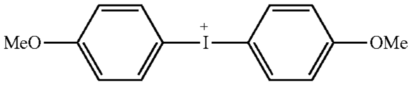
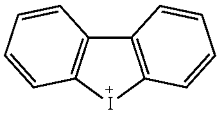
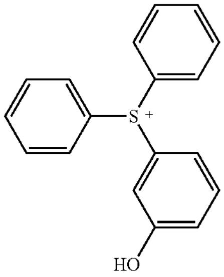
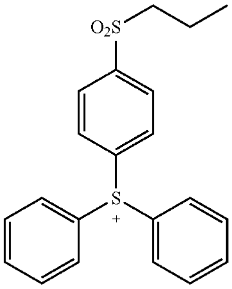
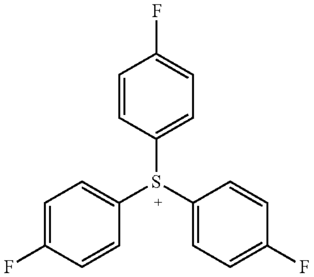
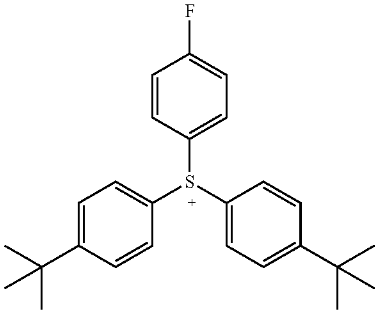
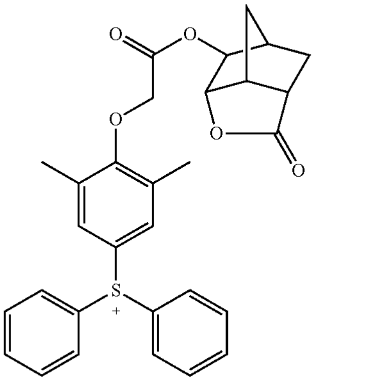
-continued
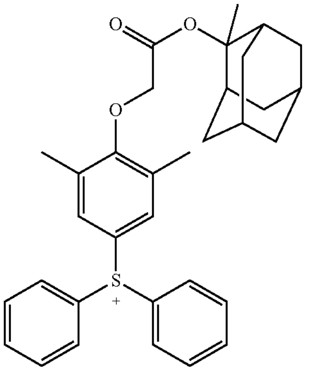
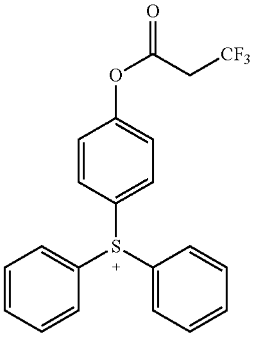
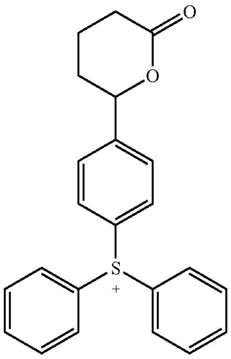
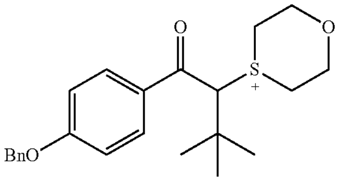
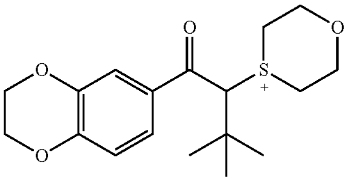
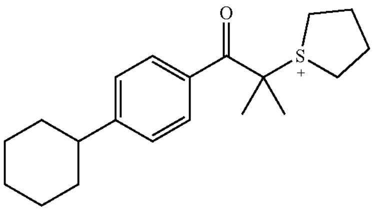

-continued

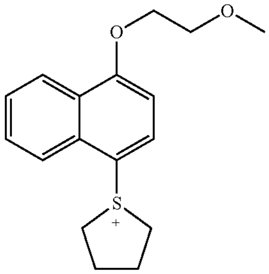

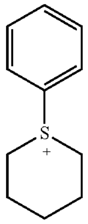

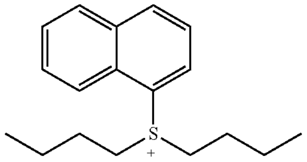

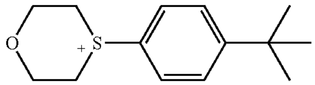

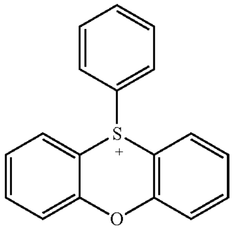

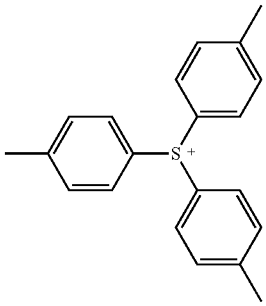

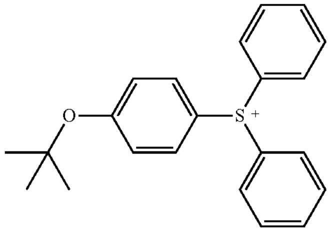

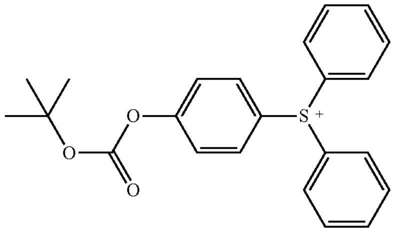

-continued

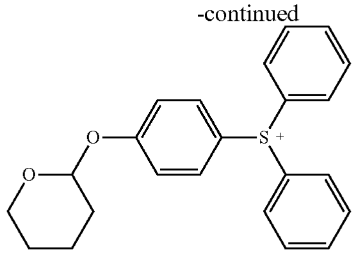

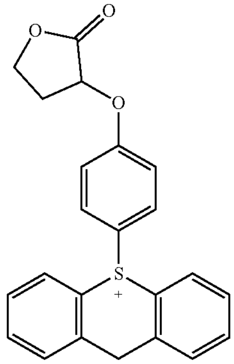

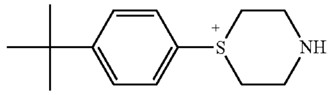

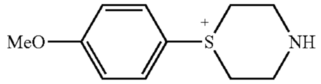

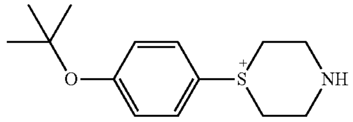

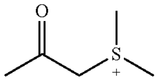

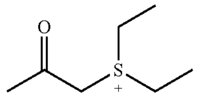

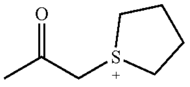

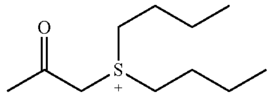

The compound (B) is preferably represented by General Formula (b2).

(b2)

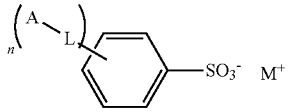

In General Formula (b2), L represents a single bond or a divalent linking group. In a case where there are a plurality of L's, the plurality of L's may be the same as or different from each other. A represents a group that decomposes by the action of an acid. In a case where there are a plurality of A's, the plurality of A's may be the same as or different from each other. n represents an integer from 1 to 5. $M^+$ represents a sulfonium ion or an iodonium ion.

L, A, n, and $M^+$ in General Formula (b2) are the same as L, A, n, and $M^+$ in General Formula (b1) described above, respectively.

The compound (B) is particularly preferably represented by General Formula (b3).

(b3)

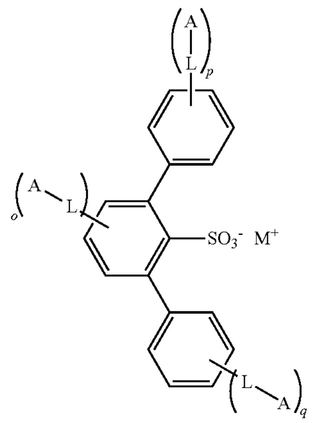

In General Formula (b3), L represents a single bond or a divalent linking group. In a case where there are a plurality of L's, the plurality of L's may be the same as or different from each other. A represents a group that decomposes by the action of an acid. In a case where there are a plurality of A's, the plurality of A's may be the same as or different from each other. o, p, and q each independently represent an integer from 0 to 5. It should be noted that a sum of o, p, and q is from 1 to 5. $M^+$ represents a sulfonium ion or an iodonium ion.

L, A, and $M^+$ in General Formula (b3) are the same as L, A, and Min General Formula (b1) described above, respectively.

o, p, and q in General Formula (b3) each independently preferably represent an integer of 0 to 3, more preferably represent an integer of 0 to 2, and still more preferably represent 0 or 1.

Preferred specific examples of the anionic moiety of the compound (B) are shown below, but the present invention is not limited thereto. Et represents an ethyl group.

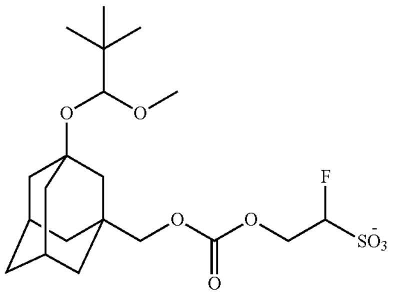

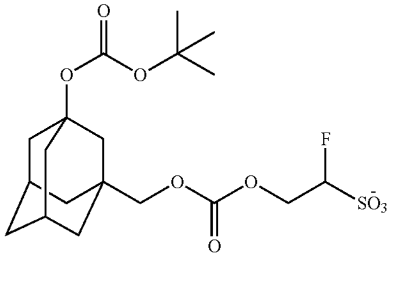

-continued

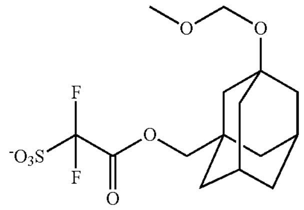

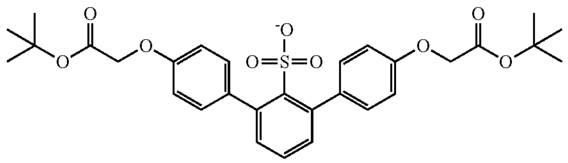

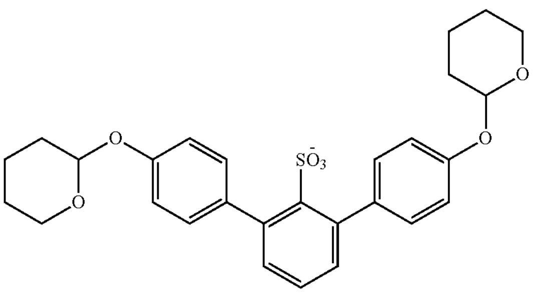

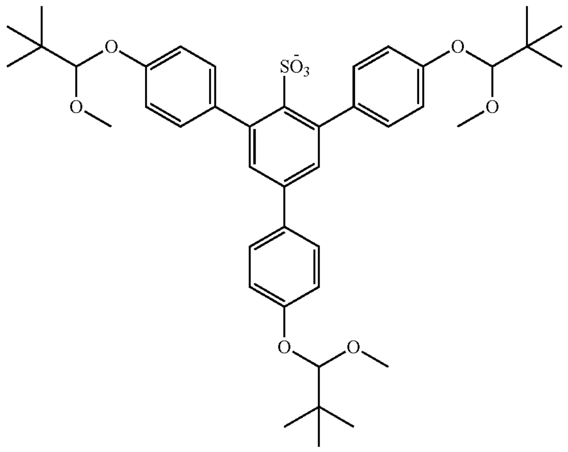

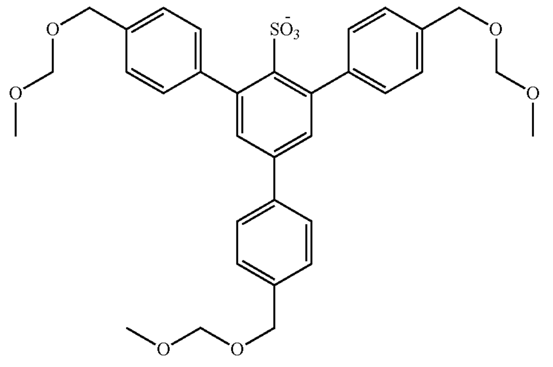

-continued
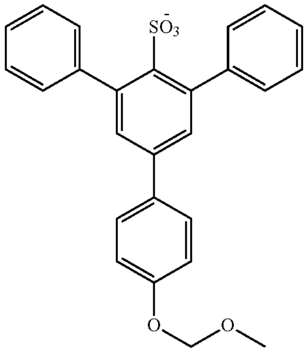
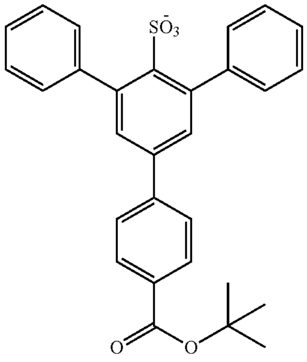
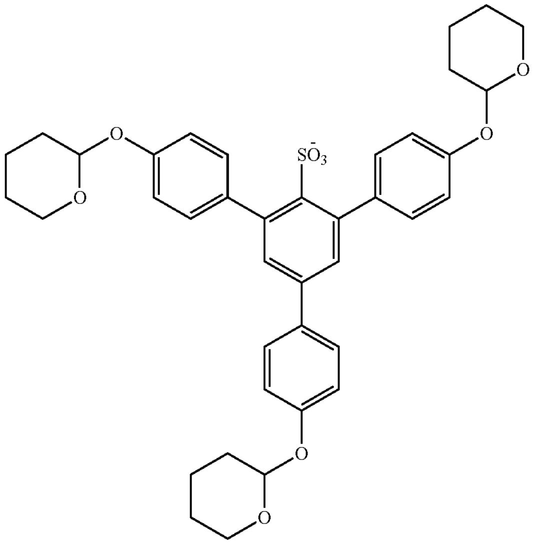
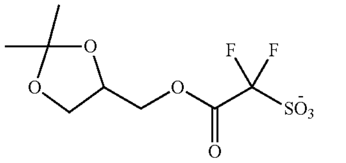
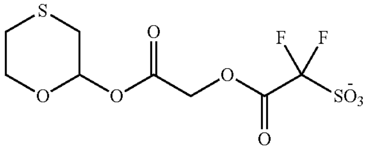
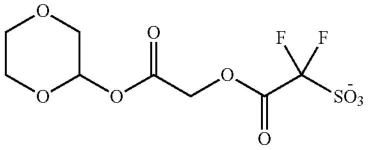
-continued
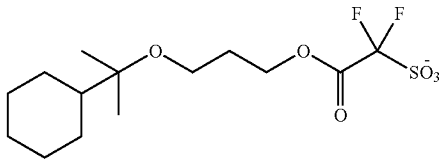
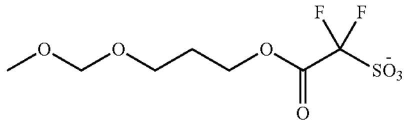
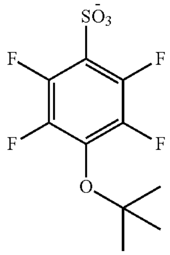
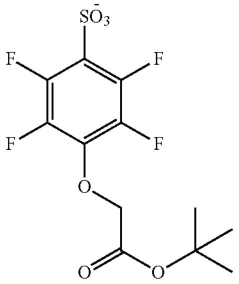
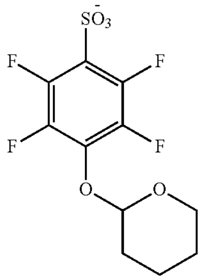
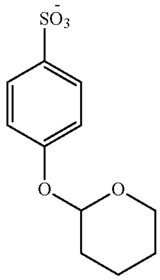
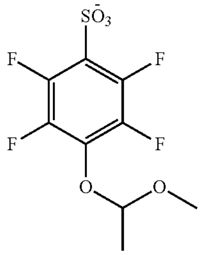
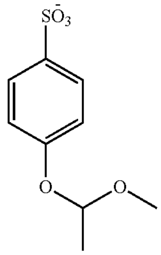
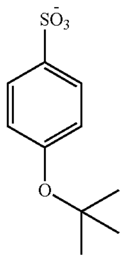
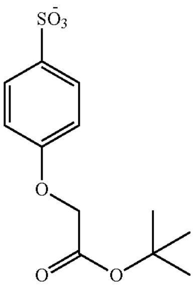

-continued

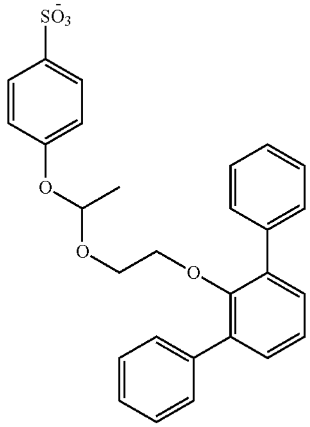

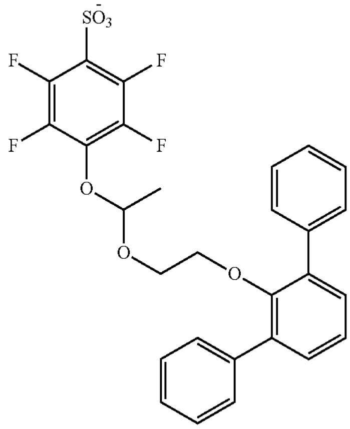

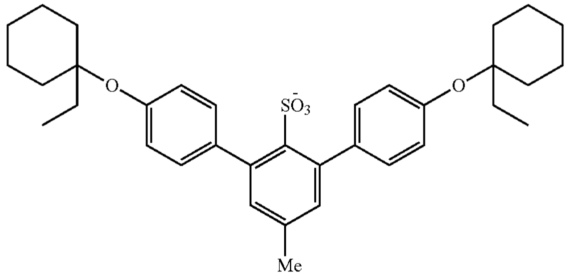

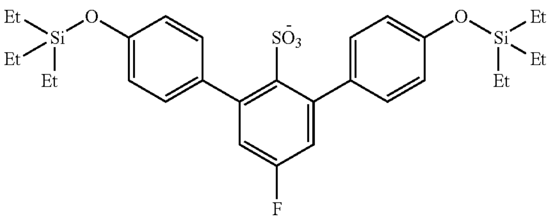

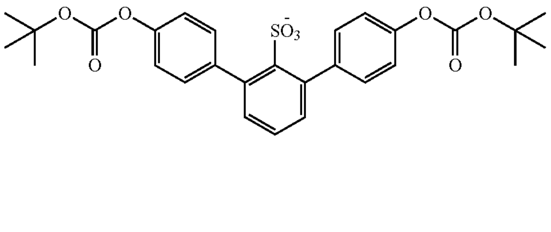

-continued

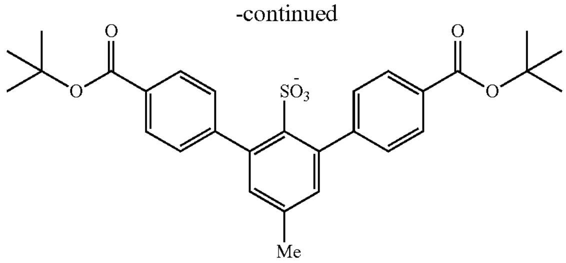

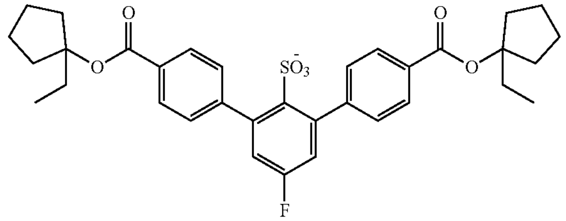

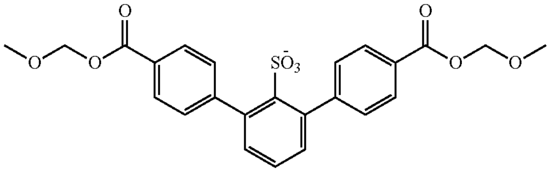

It is preferable that the pKa of an acid generated by the compound (B) is from −10 to 5.

The acid dissociation constant (pKa) refers to a pKa in an aqueous solution, and is defined in Chemical Handbook (II) (Revised 4th Edition, 1993, compiled by the Chemical Society of Japan, Maruzen Company, Ltd.). A lower value of the pKa indicates higher acid strength. Specifically, the pKa in an aqueous solution can be actually measured by using an infinite-dilution aqueous solution and measuring the acid dissociation constant at 25° C. Alternatively, the acid dissociation constant pKa can also be determined using the following software package 1 by computation from a value based on a Hammett's substituent constant and the database of publicly known literature values. Any of the pKa values described in the present specification indicate values determined by computation using the software package.

Software Package 1: Advanced Chemistry Development (ACD/Labs) Software V 8.14 for Solaris (1994-2007 ACD/Labs).

Preferred examples of the compound (B) include those shown in Examples and a compound obtained by a combination of the anion and the cation.

The compound (B) can be synthesized, for example, by a method using a coupling reaction.

For the coupling reaction, for example, Suzuki coupling or the like can be applied. The counter cation can be converted into a desired cation $M^+$ by, for example, a known anion exchange method or a conversion method using an ion exchange resin, as described in JP1994-184170A (JP-H06-184170A).

The compound (B) may be used singly or in combination of two or more kinds thereof.

A content of the compound (B) (in a case where a plurality of the compounds (B) are present, a total content thereof) in the composition of the embodiment of the present invention is preferably 0.1% to 35% by mass, more preferably 0.5% to 25% by mass, still more preferably 1% to 20% by mass, and particularly preferably 5% to 20% by mass, with respect to a total solid content of the composition.

[(C) Compound Represented by General Formula (c1), which Generates Acid Upon Irradiation with Actinic Rays or Radiation]

The actinic ray-sensitive or radiation-sensitive resin composition of the embodiment of the present invention contains a compound represented by General Formula (c1), which generates an acid upon irradiation with actinic rays or radiation (also referred to as a "compound (C)" or an "acid generator (C)").

The compound (C) is a compound that generates an acid upon irradiation with actinic rays or radiation (photoacid generator).

$$_{n}(B—L)—X—SO_3^- \ M^+ \qquad (c1)$$

In General Formula (c1), L represents a single bond or a divalent linking group. In a case where there are a plurality of L's, the plurality of L's may be the same as or different from each other. n represents an integer from 1 to 5. X represents an (n+1)-valent linking group. $M^+$ represents a sulfonium ion or an iodonium ion. It should be noted that L, n, X, and $M^+$ in General Formula (c1) are the same as L, n, X, and $M^+$ in General Formula (b1), respectively. B represents a group that decomposes by the action of an acid, a hydroxy group, or a carboxy group. In a case where there are a plurality of B's, the plurality of B's may be the same as or different from each other. It should be noted that at least one B represents the hydroxy group or the carboxy group.

In General Formula (c1), L, n, X, and $M^+$ are the same as L, n, X, and M in General Formula (b1), respectively.

In General Formula (c1), B represents a group that decomposes by the action of an acid, a hydroxy group, or a carboxy group.

In a case where B in General Formula (c1) represents the group decomposed by the action of an acid, the group decomposed by the action of an acid is the same as A in General Formula (b1).

At least one of B's in General Formula (c1) represents a hydroxy group or a carboxy group.

The compound (C) is preferably represented by General Formula (c2).

(c2)

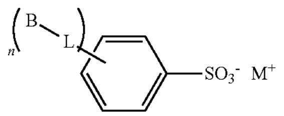

In General Formula (c2), L represents a single bond or a divalent linking group. In a case where there are a plurality of L's, the plurality of L's may be the same as or different from each other. n represents an integer from 1 to 5. $M^+$ represents a sulfonium ion or an iodonium ion. It should be noted that L, n, and $M^+$ in General Formula (c2) are the same as L, n, and $M^+$ in General Formula (b2), respectively. B represents a group that decomposes by the action of an acid, a hydroxy group, or a carboxy group. In a case where there area plurality of B's, the plurality of B's may be the same as or different from each other. It should be noted that at least one B represents the hydroxy group or the carboxy group.

B in General Formula (c2) is the same as B in General Formula (c1) described above.

The compound (C) is particularly preferably represented by General Formula (c3).

(c3)

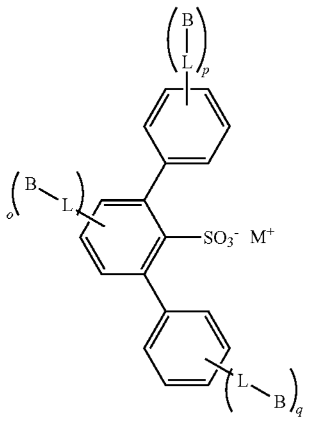

In General Formula (c3), L represents a single bond or a divalent linking group. In a case where there are a plurality of L's, the plurality of L's may be the same as or different from each other. o, p, and q each independently represent an integer from 0 to 5. It should be noted that a sum of o, p, and q is from 1 to 5. $M^+$ represents a sulfonium ion or an iodonium ion. It should be noted that L, o, p, q, and $M^+$ in General Formula (c3) are the same as L, o, p, q, and $M^+$ in General Formula (b3), respectively. B represents a group that decomposes by the action of an acid, a hydroxy group, or a carboxy group. In a case where there are a plurality of B's, the plurality of B's may be the same as or different from each other. It should be noted that at least one B represents the hydroxy group or the carboxy group.

B in General Formula (c3) is the same as B in General Formula (c1) described above.

In the present invention, it is preferable that the compound (B) is represented by General Formula (b2) and the compound (C) is represented by General Formula (c2), and it is more preferable that the compound (B) is represented by General Formula (b3) and the compound (C) is represented by General Formula (c3).

Preferred specific examples of the anionic moiety of the compound (C) are shown below, but the present invention is not limited thereto.

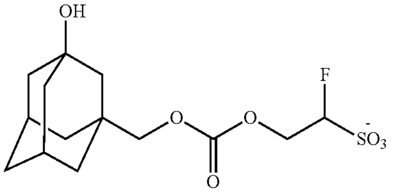

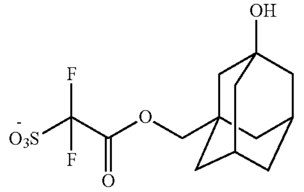

-continued
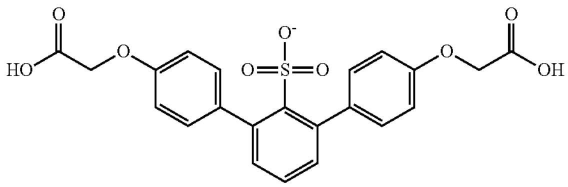
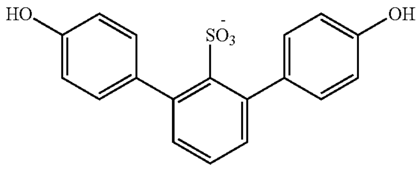
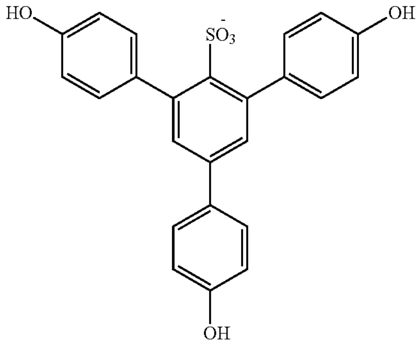
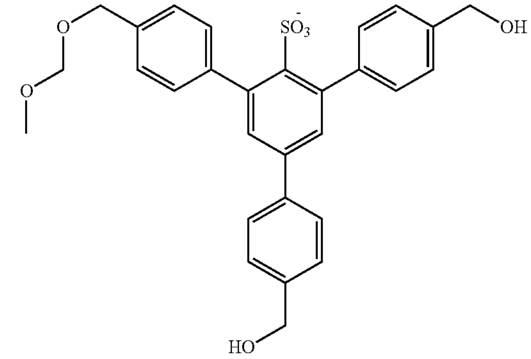
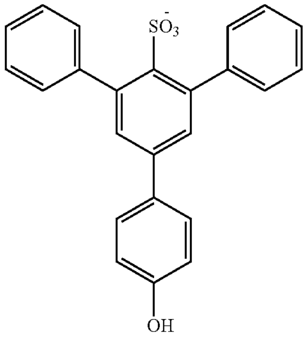
-continued
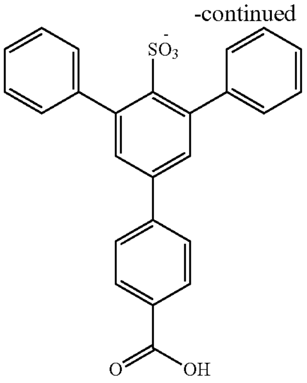
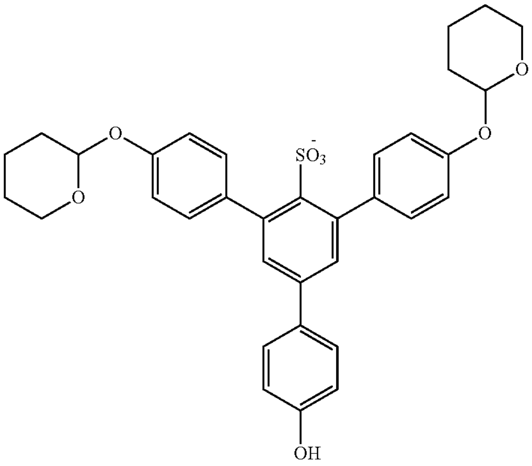
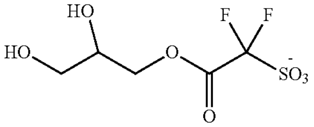
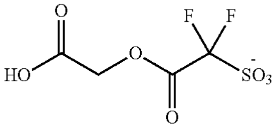
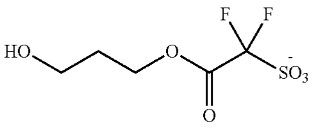
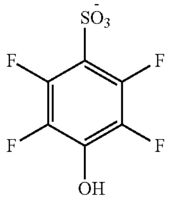
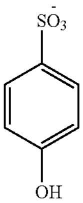
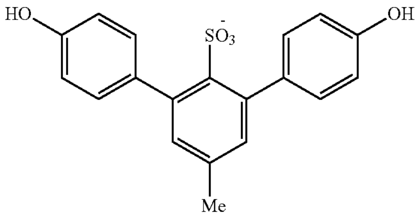
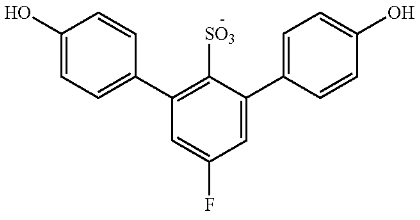

-continued

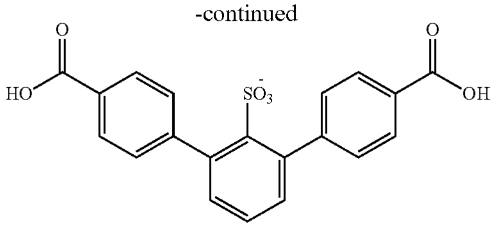

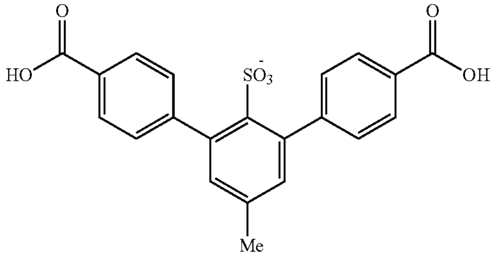

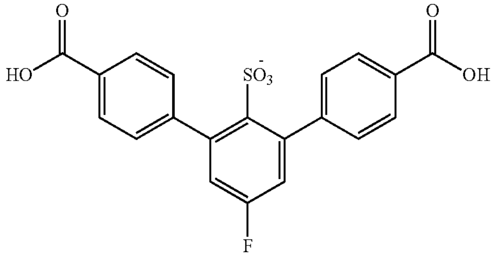

A pKa of an acid generated by the compound (C) is the same as the pKa of the acid generated by the compound (B).

Preferred examples of the compound (C) include those shown in Examples and a compound obtained by a combination of the anion and the cation (the cation mentioned in the description of the compound (B)).

The compound (C) can be synthesized, for example, by a method using a coupling reaction.

For the coupling reaction, for example, Suzuki coupling or the like can be applied. The counter cation can be converted into a desired cation $M^+$ by, for example, a known anion exchange method or a conversion method using an ion exchange resin, as described in JP1994-184170A (JP-H06-184170A).

The compound (C) may be used alone or in combination of two or more kinds thereof.

A content of the compound (C) in the composition of the embodiment of the present invention (a total thereof in a case where a plurality of the compounds (C) are present) is from 0.01% by mass to 10% by mass or less, preferably from 0.01% by mass to 5% by mass, more preferably from 0.01% by mass to 3% by mass, and still more preferably from 0.01% by mass to 1% by mass with respect to the content of the compound (B) in the composition of the embodiment of the present invention.

Moreover, the composition of the embodiment of the present invention can contain a compound that generates an acid upon irradiation with actinic rays or radiation other than the compound (B) and the compound (C) as long as the effect of the present invention is not impaired.

[Acid Diffusion Control Agent]

The composition of the embodiment of the present invention preferably contains an acid diffusion control agent. The acid diffusion control agent acts as a quencher that suppresses a reaction of an acid-decomposable resin in the unexposed area by excessive generated acids by trapping the acids generated from a photoacid generator and the like upon exposure.

For example, a basic compound (DA), a basic compound (DB) having basicity reduced or lost upon irradiation with actinic rays or radiation, an onium salt (DC) which is a weak acid relative to an acid generator, a low-molecular-weight compound (DD) having a nitrogen atom and a group that leaves by an action of an acid, an onium salt compound (DE) having a nitrogen atom in the cationic moiety, can be used as the acid diffusion control agent. In the composition of the embodiment of the present invention, a known acid diffusion control agent can be appropriately used. For example, the known compounds disclosed in paragraphs [0627] to [0664] of the specification of US2016/0070167A1, paragraphs [0095] to [0187] of the specification of US2015/0004544A1, paragraphs [0403] to [0423] of the specification of US2016/0237190A1, and paragraphs [0259] to [0328] of the specification of US2016/0274458A1 can be suitably used as the acid diffusion control agent.

As the basic compound (DA), compounds having structures represented by General Formulae (A) to (E) are preferable.

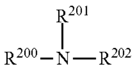

(A)

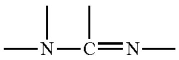

(B)

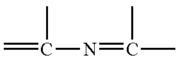

(C)

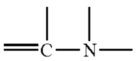

(D)

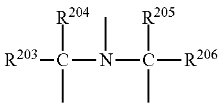

(E)

In General Formulae (A) and (E), $R^{200}$, $R^{201}$, and $R^{202}$ may be the same as or different from each other, and each independently represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may be bonded to each other to form a ring.

$R^{203}$, $R^{204}$, $R^{205}$, and $R^{206}$ may be the same as or different from each other and each independently represent an alkyl group having 1 to 20 carbon atoms.

The alkyl group in each of General Formulae (A) and (E) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl group in each of General Formulae (A) and (E) are more preferably unsubstituted.

As the basic compound (DA), thiazole, benzothiazole, oxazole, benzoxazole, guanidine, aminopyrrolidine, pyrazole, pyrazoline, piperazine, aminomorpholine, aminoalkylmorpholine, piperidine, or compounds having these structures are preferable; and a compound having a thiazole structure, a benzothiazole structure, an oxazole structure, a benzoxazole structure, an imidazole structure, a diazabicyclo structure, an onium hydroxide structure, an onium carboxylate structure, a trialkylamine structure, an aniline structure, or a pyridine structure, an alkylamine derivative having a hydroxy group and/or an ether bond, and an aniline derivative having a hydroxy group and/or an ether bond, or the like is more preferable.

The basic compound (DB) having basicity reduced or lost upon irradiation with actinic rays or radiation (hereinafter also referred to as a "compound (DB)") is a compound which has a proton-accepting functional group, and decomposes under irradiation with actinic rays or radiation to exhibit reduced proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

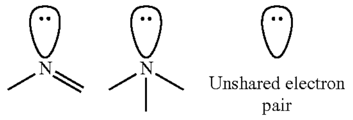

Preferred examples of the partial structure of the proton-accepting functional group include a crown ether structure, an azacrown ether structure, primary to tertiary amine structures, a pyridine structure, an imidazole structure, and a pyrazine structure.

The compound (DB) decomposes upon irradiation with actinic rays or radiation to generate a compound exhibiting reduced proton-accepting properties, no proton-accepting properties, or a change from the proton-accepting properties to acidic properties. Here, exhibiting reduced proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

The acid dissociation constant pKa of the compound generated by decomposition of the compound (DB) upon irradiation with actinic rays or radiation preferably satisfies $pKa<-1$, and more preferably satisfies $-13<pKa<-1$, and still more preferably satisfies $-13<pKa<-3$.

The acid dissociation constant pKa refers to an acid dissociation constant pKa in an aqueous solution, and is defined, for example, in Chemical Handbook (II) (Revised 4th Edition, 1993, compiled by the Chemical Society of Japan, Maruzen Company, Ltd.). A lower value of the acid dissociation constant pKa indicates a higher acid strength. Specifically, the acid dissociation constant pKa in an aqueous solution can be actually measured by using an infinite-dilution aqueous solution and measuring the acid dissociation constant at 25° C. Alternatively, the acid dissociation constant pKa can also be determined using the following software package 1 by computation from a value based on a Hammett's substituent constant and the database of publicly known literature values. Any of the pKa values described in the present specification indicate values determined by computation using the software package.

Software Package 1: Advanced Chemistry Development (ACD/Labs) Software V 8.14 for Solaris (1994-2007 ACD/Labs).

In the composition of the embodiment of the present invention, the onium salt (DC) which is a relatively weak acid with respect to a photoacid generator can be used as the acid diffusion control agent.

In a case where the photoacid generator and the onium salt that generates an acid which is a weak acid relative to an acid generated from the photoacid generator are mixed and used, an acid generated from the photoacid generator upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic activity, and thus, the acid is apparently deactivated and the acid diffusion can be controlled.

As the onium salt which serves as a relatively weak acid with respect to the photoacid generator, compounds represented by General Formulae (d1-1) to (d1-3) are preferable.

(d1-1)

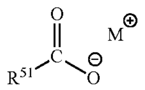

(d1-2)

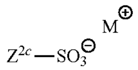

(d1-3)

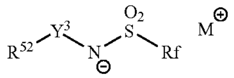

In the formula, $R^{51}$ is a hydrocarbon group which may have a substituent, $Z^{2c}$ is a hydrocarbon group having 1 to 30 carbon atoms, which may have a substituent (provided that carbon adjacent to S is not substituted with a fluorine atom), $R^{52}$ is an organic group, Y; is a linear, branched, or cyclic alkylene group or an arylene group, Rf is a hydrocarbon group including a fluorine atom, and $M^+$'s are each independently an ammonium cation, a sulfonium cation, or an iodonium cation.

Preferred examples of the sulfonium cation or iodonium cation represented by $M^+$ include the sulfonium cation exemplified for General Formula (ZIA) and the iodonium cation exemplified for General Formula (ZIIA).

The onium salt (DC) which is a weak acid relative to a photoacid generator may be a compound having a cationic moiety and an anionic moiety in the same molecule, in which the cationic moiety and the anionic moiety are linked by a covalent bond (hereinafter also referred to as a "compound (DCA)").

The compound (DCA) is preferably a compound represented by any of General Formulae (C-1) to (C-3).

(C-1)

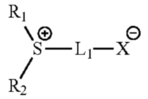

(C-2)

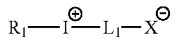

(C-3)

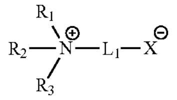

In General Formulae (C-1) to (C-3), $R_1$, $R_2$, and $R_3$ each independently represent a substituent having 1 or more carbon atoms.

$L_1$ represents a divalent linking group that links a cationic moiety with an anionic moiety, or a single bond.

$—X^-$ represents an anionic moiety selected from $—COO^-$, $—SO_3^-$, $—SO_2^-$, and $—N^-—R_4$. $R_4$ represents at least one of a monovalent substituent having a carbonyl group: —C(═O)—, a sulfonyl group: $—S(═O)_2—$, or a sulfinyl group: —S(═O)— at a site for linking to an adjacent N atom.

$R_1$, $R_2$, $R_3$, $R_4$, and $L_1$ may be bonded to each other to form a ring structure. In addition, in General Formula (C-3), two of $R_1$ to $R_3$ are combined with each other to represent one divalent substituent, and may be bonded to an N atom via a double bond.

Examples of the substituent having 1 or more carbon atoms in each of $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. The alkyl group, a cycloalkyl group, or the aryl group is preferable.

Examples of $L_1$ as a divalent linking group include a linear or branched alkylene group, a cycloalkylene group, an arylene group, a carbonyl group, an ether bond, an ester bond, an amide bond, a urethane bond, a urea bond, and a group formed by a combination of two or more of these groups. $L_1$ is preferably the alkylene group, the arylene group, the ether bond, the ester bond, and the group formed by a combination of two or more of these groups.

The low-molecular-weight compound (DD) having a nitrogen atom and having a group that leaves by the action of an acid (hereinafter also referred to as a "compound (DD)") is preferably an amine derivative having a group that leaves by the action of an acid on the nitrogen atom.

As the group that leaves by the action of an acid, an acetal group, a carbonate group, a carbamate group, a tertiary ester group, a tertiary hydroxy group, or a hemiaminal ether group is preferable, and the carbamate group or the hemiaminal ether group is more preferable.

The molecular weight of the compound (DD) is preferably 100 to 1,000, more preferably 100 to 700, and still more preferably 100 to 500.

The compound (DD) may have a carbamate group having a protective group on the nitrogen atom. The protective group constituting the carbamate group is represented by General Formula (d-1).

(d-1)

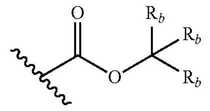

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). Rb's may be bonded to each other to form a ring.

The alkyl group, the cycloalkyl group, the aryl group, or the aralkyl group represented by $R_b$ may be each independently substituted with a functional group such as a hydroxy group, a cyano group, an amino group, a pyrrolidino group, a piperidino group, a morpholino group, and an oxo group, an alkoxy group, or a halogen atom. The same applies to the alkoxyalkyl group represented by $R_b$.

As $R_b$, a linear or branched alkyl group, a cycloalkyl group, or an aryl group is preferable, and the linear or branched alkyl group, or the cycloalkyl group is more preferable.

Examples of the ring formed by the mutual linkage of two $R_b$'s include an alicyclic hydrocarbon, an aromatic hydrocarbon, a heterocyclic hydrocarbon, and derivatives thereof.

Examples of the specific structure of the group represented by General Formula (d-1) include, but are not limited to, the structures disclosed in paragraph [0466] of the specification of US2012/0135348A1.

The compound (DD) preferably has a structure represented by General Formula (6).

(6)

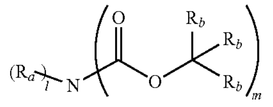

In General Formula (6), 1 represents an integer of 0 to 2, m represents an integer of 1 to 3, and these satisfy 1+m=3.

$R_a$ represents a hydrogen atom, an alkyl group, a cycloalkyl group, an aryl group, or an aralkyl group. In a case where 1 is 2, two $R_a$'s may be the same as or different from each other, and the two $R_a$'s may be linked to each other to form a heterocycle with the nitrogen atom in the formula. This heterocycle may include a heteroatom other than the nitrogen atom in the formula.

$R_b$ has the same definition as $R_b$ in General Formula (d-1), and preferred examples are also the same.

In General Formula (6), the alkyl group, the cycloalkyl group, the aryl group, and the aralkyl group as $R_a$ may be each independently substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (these groups may be substituted with the groups as described above) of $R_a$ include the same groups as the specific examples as described above with respect to $R_b$.

Specific examples of the particularly preferred compound (DD) in the present invention include, but are not limited to, the compounds disclosed in paragraph [0475] of the specification of US2012/0135348A1.

The onium salt compound (DE) having a nitrogen atom in the cationic moiety (hereinafter also referred to as a "compound (DE)") is preferably a compound having a basic moiety including a nitrogen atom in the cationic moiety. The basic moiety is preferably an amino group, and more preferably an aliphatic amino group. All of the atoms adjacent to the nitrogen atom in the basic moiety are still more preferably hydrogen atoms or carbon atoms. In addition, from the viewpoint of improving basicity, it is preferable that an electron-withdrawing functional group (such as a carbonyl group, a sulfonyl group, a cyano group, and a halogen atom) is not directly linked to the nitrogen atom.

Preferred specific examples of the compound (DE) include, but are not limited to, the compounds disclosed in paragraph [0203] of US2015/0309408A1.

Preferred examples of the acid diffusion control agent are shown below, but the present invention is not limited thereto. Me represents a methyl group.

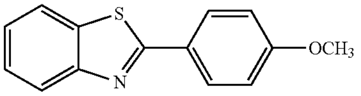
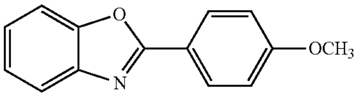
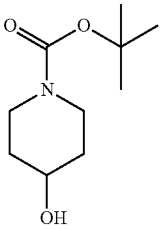
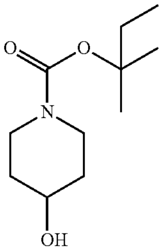
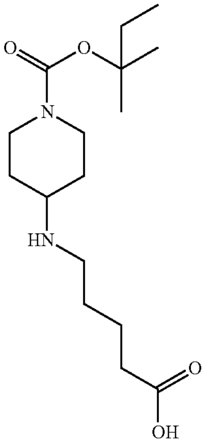
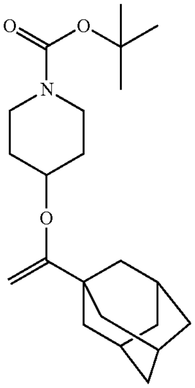
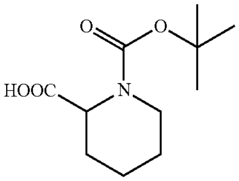
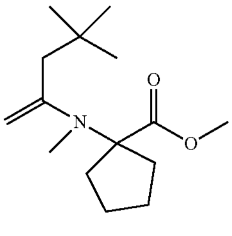

-continued

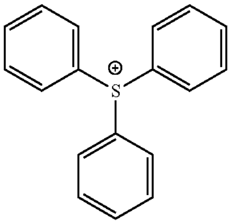
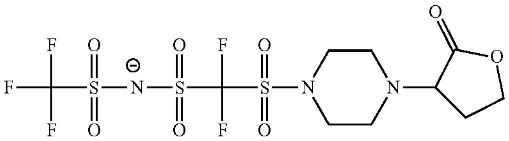
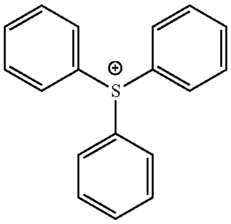
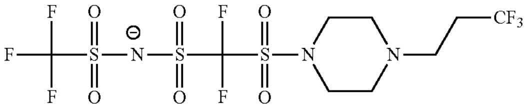
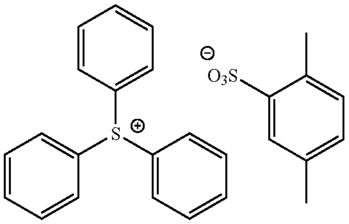
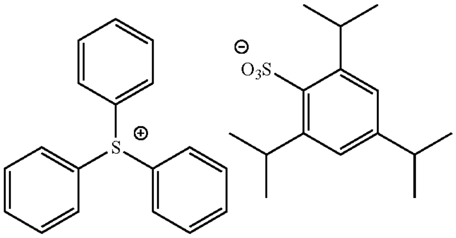
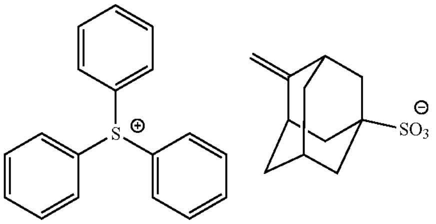
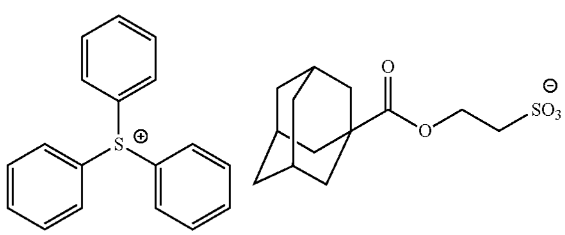

-continued
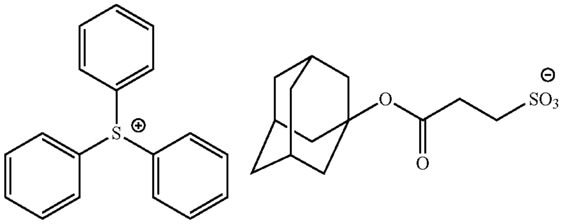
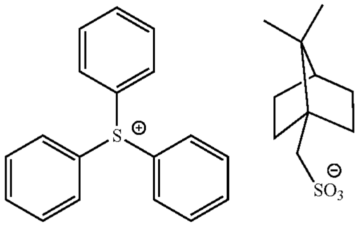
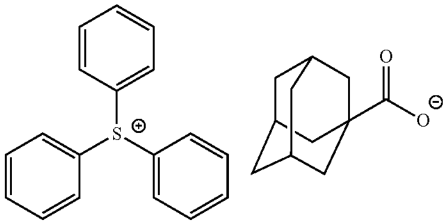
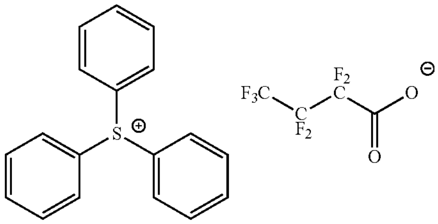
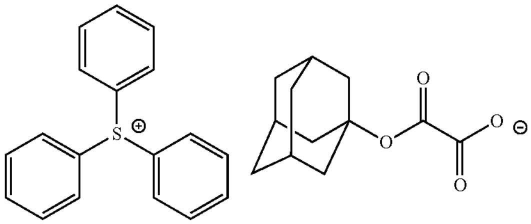
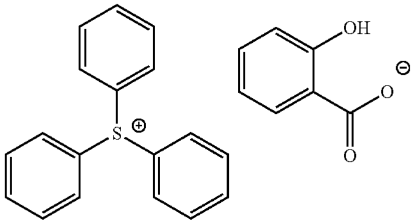
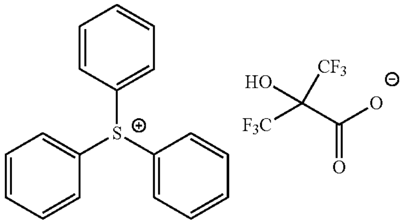
-continued
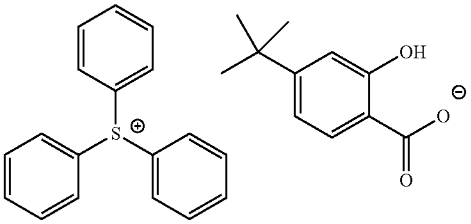
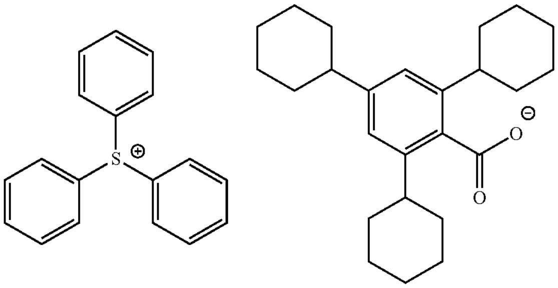
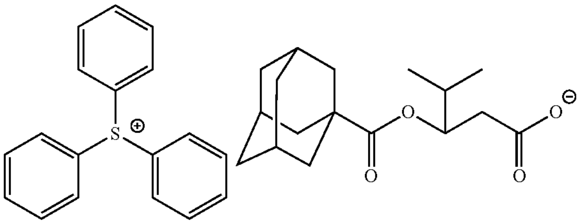
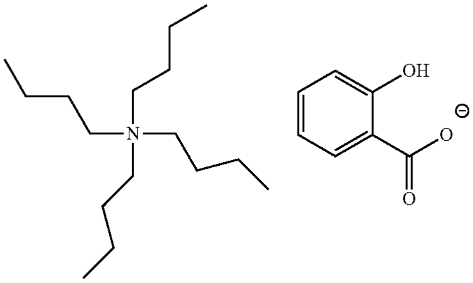
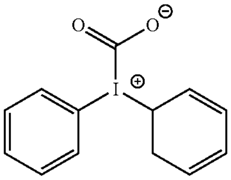
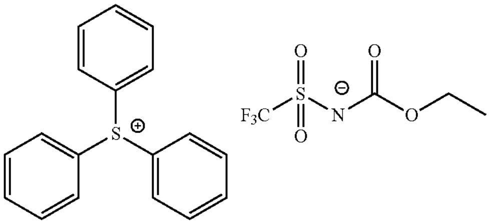
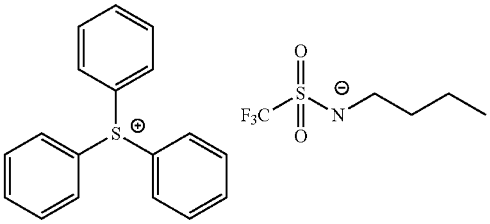

-continued
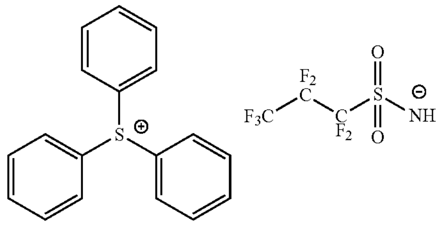
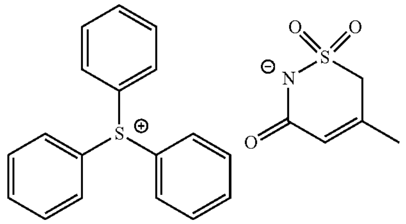
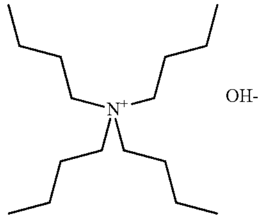
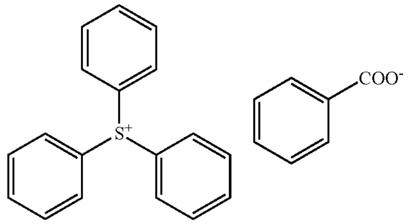
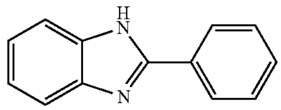
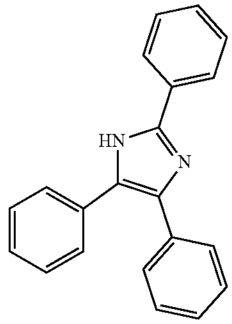
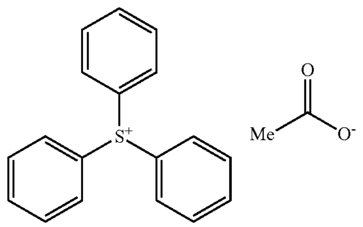
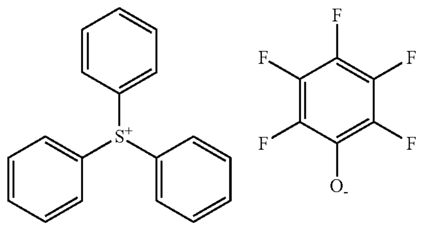
-continued
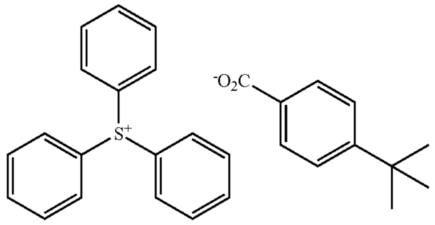
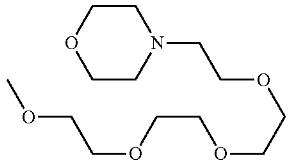
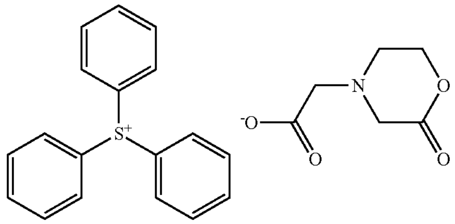
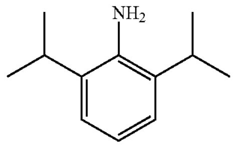
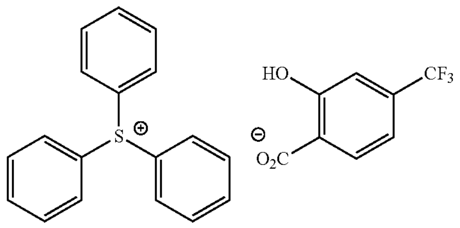
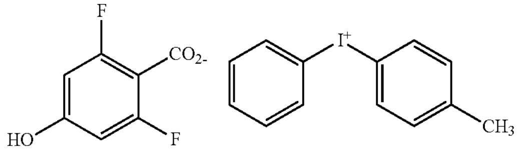
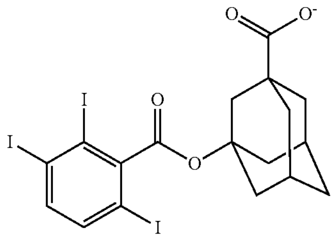
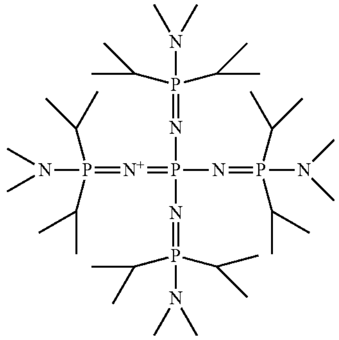

-continued

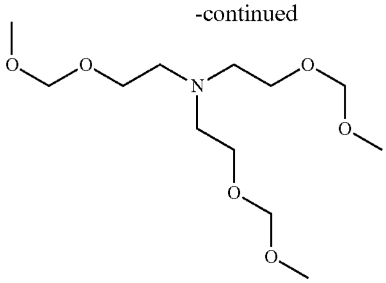

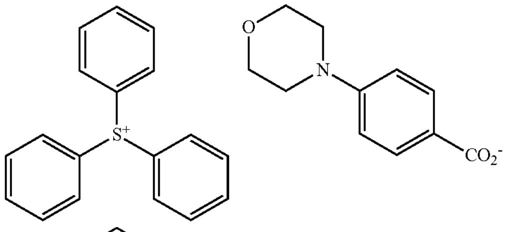

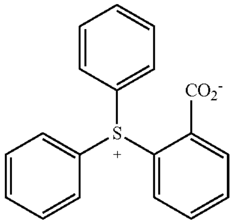

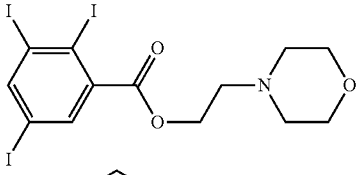

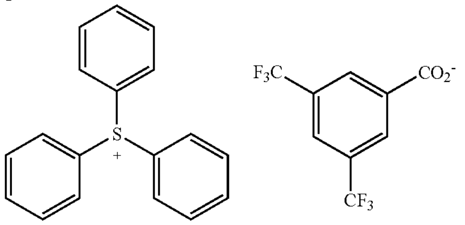

In the composition of the embodiment of the present invention, the acid diffusion control agents may be used alone or in combination of two or more kinds thereof.

A content of the acid diffusion control agent (in a case where a plurality of kinds of the acid diffusion control agents are present, a total content thereof) in the composition of the embodiment of the present invention is preferably 0.001% to 20% by mass, and more preferably 0.01% to 10% by mass with respect to the total solid content of the composition.

[(E) Fluorine-Containing Compound Having Group Having Solubility in Alkali Developer, which is Increased Upon Decomposition by Action of Alkali Developer]

The composition of the embodiment of the present invention may include (E) a fluorine-containing compound (referred to as a "fluorine-containing compound (E)") having a group having a solubility in an alkali developer that increases upon decomposition by the action of an alkali developer.

The fluorine-containing compound (E) can be unevenly distributed on a surface of the actinic ray-sensitive or radiation-sensitive film of the embodiment of the present invention by including fluorine, whereby it can exhibit desired performance.

The group having a solubility in an alkali developer that increases upon decomposition by the action of the alkali developer is also referred to as a "polarity conversion group", and specific examples thereof include a lactone group, a carboxylic acid ester group (—COO—), an acid anhydride group (—C(O)OC(O)—), an acid imide group (—NHCONH—), a carboxylic acid thioester group (—COS—), a carbonic acid ester group (—OC(O)O—), a sulfuric acid ester group (—$OSO_2O$—), and a sulfonic acid ester group (—$SO_2O$—).

Furthermore, the ester group directly linked to the main chain of the repeating unit, in the same manner as those in acrylate and the like, is deteriorated in a function of increasing a solubility in an alkali developer upon decomposition by the action of the alkali developer, and therefore, such the ester group is not included in the polarity conversion group in the present invention.

The fluorine-containing compound (E) preferably has a fluoroalkyl group from the viewpoint of surface uneven distribution.

The fluorine-containing compound (E) is more preferably a resin (also referred to as a "resin (E)").

The fluorine-containing compound (E) is more preferably a resin including a repeating unit having a polarity conversion group (also referred to as a "repeating unit (e)").

Examples of the repeating unit (e) include a repeating unit represented by General Formula (K0).

(K0)

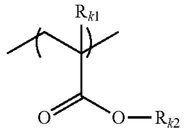

In General Formula (K0), $R_{k1}$ represents a hydrogen atom, a halogen atom, a hydroxy group, an alkyl group, a cycloalkyl group, an aryl group, or a group including a polarity conversion group.

$R_{k2}$ represents an alkyl group, a cycloalkyl group, an aryl group, or a group including a polarity conversion group.

It should be noted that at least one of $R_{k1}$ or $R_{k2}$ has a polarity conversion group.

In addition, the ester group directly linked to the main chain of the repeating unit represented by General Formula (K0) is not included in the polarity conversion group in the present invention, as described above.

The polarity conversion group is preferably a group represented by X in a partial structure represented by General Formula (KA-1) or (KB-1).

That is, it is preferable that the repeating unit (e) has at least one partial structure represented by General Formula (KA-1) or (KB-1), and the polarity conversion group is represented by X in the partial structure represented by has General Formula (KA-1) or (KB-1).

(KA-1)

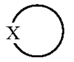

(KB-1)

$Y^1$—X—$Y^2$

X in General Formula (KA-1) or (KB-1) represents a carboxylic acid ester group: —COO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —$OSO_2O$—, and a sulfonic acid ester group: —$SO_2O$—.

$Y^1$ and $Y^2$ may be the same as or different from each other, and each represent an electron-withdrawing group.

In addition, the repeating unit (e) has a group having the partial structure represented by General Formula (KA-1) or (KB-1), and thus has a preferred polarity conversion group, but in a case where the partial structure does not have a bond, such as a case of the partial structure represented by General Formula (KA-1) and the partial structure represented by General Formula (KA-1) in which $Y^1$ and $Y^2$ are monovalent, the group having the partial structure is a group having a monovalent or higher-valent group obtained by removing at least any one hydrogen atom in the partial structure.

The partial structure represented by General Formula (KA-1) or (KB-1) is linked to the main chain of the resin (E) via a substituent at any position.

The partial structure represented by General Formula (KA-1) is a structure that forms a ring structure together with the group as X.

As X in General Formula (KA-1), a carboxylic acid ester group (that is, in a case of forming a lactone ring structure as KA-1), an acid anhydride group, or a carbonic acid ester group is preferable. The carboxylic acid ester group is more preferable.

The ring structure represented by General Formula (KA-1) may have a substituent, and for example, may have nka pieces of substituents $Z_{ka1}$.

In a case where a plurality of $Z_{ka1}$'s are present, $Z_{ka1}$'s each independently represent an alkyl group, a cycloalkyl group, an ether group, a hydroxy group, an amide group, an aryl group, a lactone ring group, or an electron-withdrawing group.

$Z_{ka1}$'s may be linked to each other to form a ring. Examples of the ring formed by the mutual linkage of $Z_{ka1}$'s include a cycloalkyl ring and a heterocycle (a cyclic ether ring, a lactone ring, and the like).

nka represents an integer of 0 to 10. nka is preferably an integer of 0 to 8, more preferably an integer of 0 to 5, still more preferably an integer of 1 to 4, and most preferably an integer of 1 to 3.

The electron-withdrawing group as $Z_{ka1}$ is the same as the electron-withdrawing group as each of $Y^1$ and $Y^2$ which will be described later, typified by a halogen atom.

In addition, the electron-withdrawing group may be substituted with another electron-withdrawing group.

$Z_{ka1}$ is preferably the alkyl group, the cycloalkyl group, the ether group, the hydroxy group, or the electron-withdrawing group, and more preferably the alkyl group, the cycloalkyl group, or the electron-withdrawing group. In addition, the ether group is preferably an ether group substituted with an alkyl group, a cycloalkyl group, or the like, that is, an alkyl ether group or the like. Preferred examples of the electron-withdrawing group are the same ones as those of the electron-withdrawing group as each of $Y^1$ and $Y^2$ which will be described later.

Examples of the halogen atom as $Z_{ka1}$ include a fluorine atom, a chlorine atom, a bromine atom, and an iodine atom, and the fluorine atom is preferable.

The alkyl group as $Z_{ka1}$ may have a substituent and may be either linear or branched. The linear alkyl group preferably has 1 to 30 carbon atoms, and more preferably has 1 to 20 carbon atoms, and examples thereof include a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, and an n-decanyl group. The branched alkyl group preferably has 3 to 30 carbon atoms, and more preferably has 3 to 20 carbon atoms, and examples thereof include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, and a t-decanoyl group. The alkyl groups having 1 to 4 carbon atoms, such as a methyl group, an ethyl group, an n-propyl group, an i-propyl group, an n-butyl group, an i-butyl group, and a t-butyl group, are preferable.

The cycloalkyl group as $Z_{ka1}$ may have a substituent, may be monocyclic or polycyclic, and may also be bridged. For example, the cycloalkyl group may have a bridged structure. As the monocyclic group, a cycloalkyl group having 3 to 8 carbon atoms is preferable, and examples thereof include a cyclopropyl group, a cyclopentyl group, a cyclohexyl group, a cyclobutyl group, and a cyclooctyl group. Examples of the polycyclic group include groups having 5 or more carbon atoms, having a bicyclo, tricyclo, or tetracyclo structure, or the like, cycloalkyl groups having 6 to 20 carbon atoms are preferable, and examples thereof include an adamantyl group, a norbornyl group, an isobornyl group, a camphanyl group, a dicyclopentyl group, an α-pinene group, a tricyclodecanyl group, a tetracyclododecyl group, and an androstanyl group. The following structure is also preferable as the cycloalkyl group. In addition, some of the carbon atoms in the cycloalkyl group may be substituted with heteroatoms such as an oxygen atom.

(1)

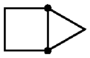

(2)

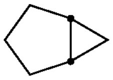

(3)

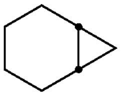

(4)

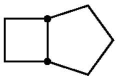

(5)

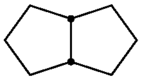

(6)

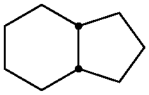

(7)

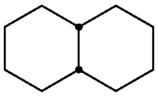

(8)

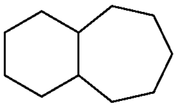

-continued
(9)
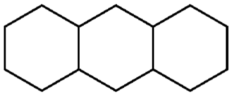
(10)
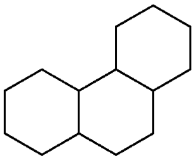
(11)
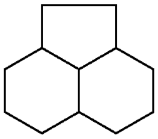
(12)
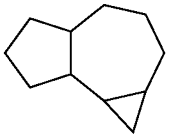
(13)
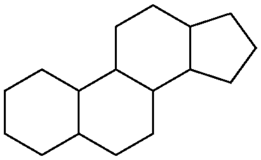
(14)
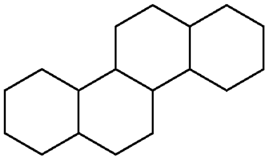
(15)
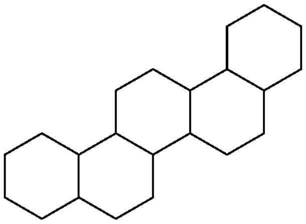
(16)
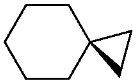
(17)
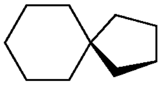
(18)
(19)
-continued
(20)
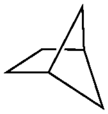
(21)
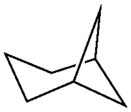
(22)
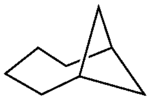
(23)
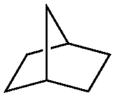
(24)
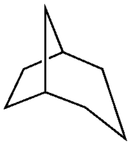
(25)
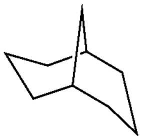
(26)
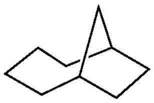
(27)
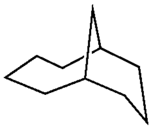
(28)
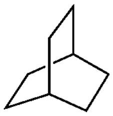
(29)
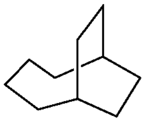
(30)
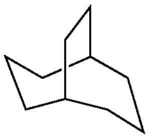
(31)
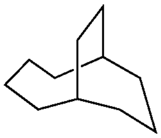

-continued

(32)
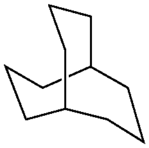

(33)
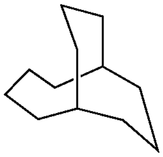

(34)
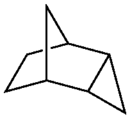

(35)
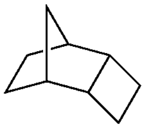

(36)
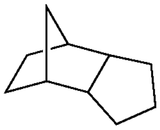

(37)
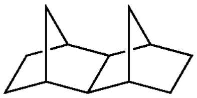

(38)

(39)
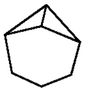

(40)
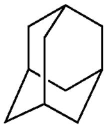

(41)
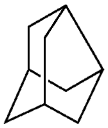

(42)
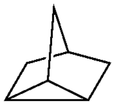

(43)
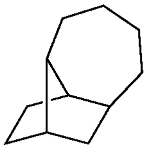

-continued

(44)
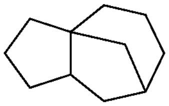

(45)
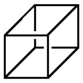

(46)
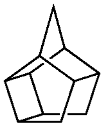

(47)
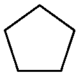

(48)

(49)
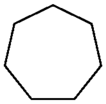

(50)
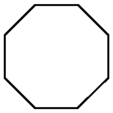

Preferred examples of the alicyclic moiety include an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group. More preferred are the adamantyl group, the decalin group, the norbornyl group, the cedrol group, the cyclohexyl group, the cycloheptyl group, the cyclooctyl group, the cyclodecanyl group, the cyclododecanyl group, and the tricyclodecanyl group.

Examples of the substituent having such the alicyclic structure include an alkyl group, a halogen atom, a hydroxy group, an alkoxy group, a carboxy group, and an alkoxycarbonyl group. The alkyl group preferably represents a lower alkyl group such as a methyl group, an ethyl group, a propyl group, an isopropyl group, and a butyl group, and more preferably represents the methyl group, the ethyl group, the propyl group, or the isopropyl group. As the alkoxy group, those having 1 to 4 carbon atoms, such as a methoxy group, an ethoxy group, a propoxy group, and a butoxy group, are preferable. Examples of the substituent which may be contained in each of the alkyl group and the alkoxy group include a hydroxy group, a halogen atom, and an alkoxy group (preferably having 1 to 4 carbon atoms).

Examples of the lactone ring group of $Z_{ka1}$ include groups obtained by removing a hydrogen atom from a structure represented by any of (KA-1-1) to (KA-1-17) which will be described later.

Examples of the aryl group of $Z_{ka1}$ include a phenyl group and a naphthyl group.

Examples of the substituent which can further be contained in the alkyl group, the cycloalkyl group, or the aryl group of $Z_{ka1}$ include a hydroxy group, a halogen atom (fluorine, chlorine, bromine, and iodine), a nitro group, a cyano group, an alkyl group, an alkoxy group such as a methoxy group, an ethoxy group, a hydroxyethoxy group, a propoxy group, a hydroxypropoxy group, an n-butoxy group, an isobutoxy group, a sec-butoxy group, and a t-butoxy group, an alkoxycarbonyl group such as a methoxycarbonyl group and an ethoxycarbonyl group, an aralkyl group such as a benzyl group, a phenethyl group, and a cumyl group, an aralkyloxy group, an acyl group such as a formyl group, an acetyl group, a butyryl group, a benzoyl group, a cyanamyl group, and a valeryl group, an acyloxy group such as a butyryloxy group, an alkenyl group, an alkenyloxy group such as a vinyloxy group, a propenyloxy group, an allyloxy group, and a butenyloxy group, an aryl group, an aryloxy group such as a phenoxy group, and an aryloxycarbonyl group such as a benzoyloxy group.

It is preferable that X in General Formula (KA-1) is the carboxylic acid ester group and the partial structure represented by General Formula (KA-1) is the lactone ring, and the partial structure is more preferably a 5- to 7-membered lactone ring.

In addition, as in (KA-1-1) to (KA-1-17), it is preferable that another ring structure is fused to the 5- to 7-membered lactone ring as the partial structure represented by General Formula (KA-1) to form a bicyclo structure or a spiro structure.

Examples of the peripheral ring structure to which the ring structure represented by General Formula (KA-1) may be bonded include the rings for (KA-1-1) to (KA-1-17), or a ring equivalent thereto.

As a structure containing the lactone ring structure represented by General Formula (KA-1), the structures represented by any of (KA-1-1) to (KA-1-17) are more preferable. Furthermore, the lactone structure may be directly bonded to the main chain. Preferred examples of the structure include (KA-1-1), (KA-1-4), (KA-1-5), (KA-1-6), (KA-1-13), (KA-1-14), and (KA-1-17).

KA-1-1

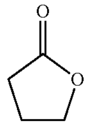

KA-1-2

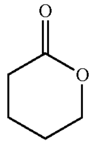

KA-1-3

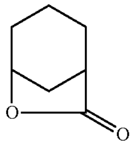

KA-1-4

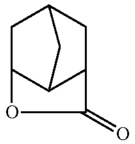

-continued

KA-1-5

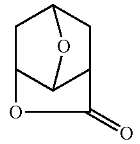

KA-1-6

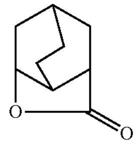

KA-1-7

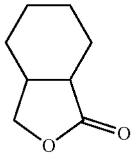

KA-1-8

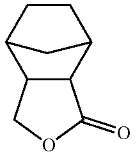

KA-1-9

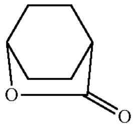

KA-1-10

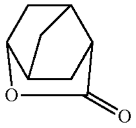

KA-1-11

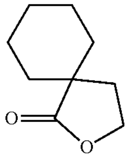

KA-1-12

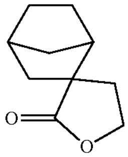

KA-1-13

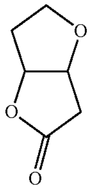

-continued

KA-1-14

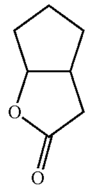

KA-1-15

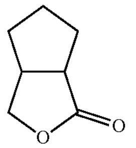

KA-1-16

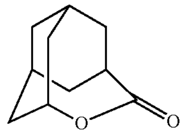

KA-1-17

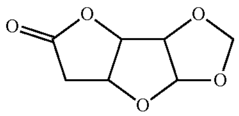

The structure containing the lactone ring structure may or may not have a substituent. Preferred examples of the substituent include the same ones as those of the substituent which may be contained in the ring structure represented by General Formula (KA-1).

The lactone structure may have an optically active substance, but any of optically active substance may be used. In addition, one kind of optically active substance may be used alone or a plurality of kinds of optically active substance may be mixed and used. In a case where one kind of optically active substance is mainly used, an optical purity (ee) thereof is preferably 90% or more, more preferably 95% or more, and most preferably 98% or more.

Preferred examples of X in General Formula (KB-1) include a carboxylic acid ester group (—COO—).

$Y^1$ and $Y^2$ in General Formula (KB-1) each independently represent an electron-withdrawing group.

The electron-withdrawing group is preferably a partial structure represented by Formula (EW). In Formula (EW), * represents a bond directly linked to (KA-1) or a bond directly linked to X in (KB-1).

(EW)

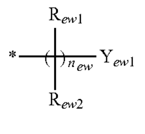

In Formula (EW), $n_{ew}$ is a repetition number of the linking groups represented by —C($R_{ew1}$)($R_{ew2}$)— and represents an integer of 0 or 1. In a case where $n_{ew}$ is 0, this indicates that the bonding is formed by a single bond and $Y_{ew1}$ is directly bonded.

$Y_{ew1}$ is a halogen atom, a cyano group, a nitrile group, a nitro group, a halo(cyclo)alkyl group or haloaryl group represented by —C($R_{f1}$)($R_{f2}$)—$R_{f3}$ which will be described later, an oxy group, a carbonyl group, a sulfonyl group, a sulfinyl group, or a combination thereof, and the electron-withdrawing group may be, for example, the following structure. In addition, the "halo(cyclo)alkyl group" represents an alkyl or cycloalkyl group which is at least partially halogenated. $R_{ew3}$ and $R_{ew4}$ each independently represent any structure. $R_{ew3}$ and $R_{ew4}$ may have any structure, and the partial structure represented by Formula (EW) has an electron-withdrawing property, and may be linked, for example, to the main chain of the resin but is preferably an alkyl group, a cycloalkyl group, or a fluorinated alkyl group.

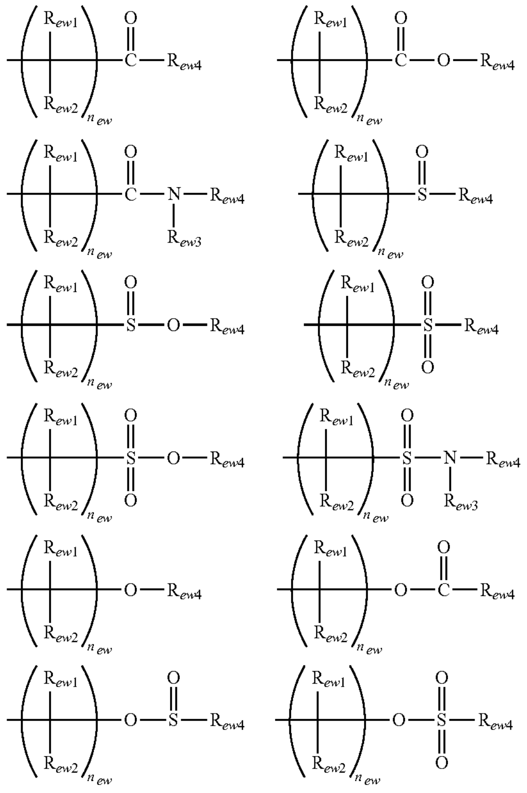

In a case where $Y_{ew1}$ is a divalent or higher valent group, the remaining bond forms a bond with any atom or substituent. At least any one group of $Y_{ew1}$, $R_{ew1}$, or $R_{ew2}$ may be linked to the main chain of the resin (E) via a further substituent.

$Y_{ew1}$ is preferably a halogen atom, or a halo(cyclo)alkyl group or haloaryl group represented by —C($R_{f1}$)($R_{f2}$)—$R_{f3}$.

$R_{ew1}$ and $R_{ew2}$ each independently represent any substituent, and represent, for example, a hydrogen atom, an alkyl group, a cycloalkyl group, or an aryl group.

At least two of $R_{ew1}$, $R_{ew2}$, or $Y_{ew1}$ may be linked to each other to form a ring.

Here, $R_{f1}$ represents a halogen atom, a perhaloalkyl group, a perhalocycloalkyl group, or a perhaloaryl group, more preferably represents a fluorine atom, the perfluoroalkyl group, or the perfluorocycloalkyl group, and still more preferably represents the fluorine atom or a trifluoromethyl group.

$R_{f2}$ and $R_{f3}$ each independently represent a hydrogen atom, a halogen atom, or an organic group, and $R_{f2}$ and $R_{f3}$ may be linked to each other to form a ring. The organic group represents, for example, an alkyl group, a cycloalkyl group, and an alkoxy group, and these may be substituted with a halogen atom (preferably a fluorine atom), and $R_{f2}$ and $R_{f3}$ are more preferably (halo)alkyl groups. It is more preferable that $R_{f2}$ represents the same group as $R_{f1}$ or is linked to $R_{f3}$ to form a ring.

$R_{f1}$ and $R_{f3}$ may be linked to form a ring, and examples of the ring formed include a (halo)cycloalkyl ring and a (halo) aryl ring.

Examples of the (halo)alkyl group in each of $R_{f1}$ to $R_{f3}$ include the alkyl group for $Z_{ka1}$ described above and a halogenated structure thereof.

Examples of the (per)halocycloalkyl group and the (per) haloaryl group in each of $R_{f1}$ to $R_{f3}$ or in the ring formed by the linkage between $R_{f2}$ and $R_{f3}$ include structures resulting from halogenation of the cycloalkyl groups in $Z_{ka1}$, and more preferably a fluorocycloalkyl group represented by $—C_{(n)}F_{(2n-2)}H$ and a perfluoroaryl group represented by $—C_{(n)}F_{(n-1)}$. Here, the number n of carbon atoms is not particularly limited, but is preferably 5 to 13, and more preferably 6.

Preferred examples of a ring which may be formed by the mutual linkage of at least two of $R_{ew1}$, $R_{ew2}$, or $Y_{ew1}$ include a cycloalkyl group and a heterocyclic group, and as the heterocyclic group, a lactone ring group is preferable. Examples of the lactone ring include the structures represented by Formulae (KA-1-1) to (KA-1-17).

Moreover, the repeating unit (e) may have a plurality of the partial structures represented by General Formula (KA-1), a plurality of the partial structures represented by General Formula (KB-1), or both the partial structures of General Formula (KA-1) and General Formula (KB-1).

Furthermore, a part or a whole of the partial structure of General Formula (KA-1) may also serve as the electron-withdrawing group as $Y^1$ or $Y^2$ in General Formula (KB-1). For example, in a case where X in General Formula (KA-1) is a carboxylic acid ester group, the carboxylic acid ester group can function as an electron-withdrawing group as $Y^1$ or $Y^2$ in General Formula (KB-1).

The repeating unit (e) may be any of a repeating unit (e') having a fluorine atom and a polarity conversion group on one side chain; a repeating unit (e*) having a polarity conversion group but not having a fluorine atom; and a repeating unit (e") having a polarity conversion group on one side chain and having a fluorine atom on a side chain different from the side chain in the same repeating unit; however, it is more preferable that the resin (E) has the repeating unit (e') as the repeating unit (e). That is, it is more preferable that the repeating unit (e) having at least one polarity conversion group has a fluorine atom.

Furthermore, in a case where the resin (E) has the repeating unit (e*), it is preferably a copolymer with a repeating unit having a fluorine atom (a repeating unit (e1) which will be described later). In addition, it is preferable that the side chain having a polarity conversion group and the side chain having a fluorine atom in the repeating unit (e") are bonded to the same carbon atom in the main chain, that is, the side chains are in a positional relationship as in Formula (K1).

In the formula, B1 represents a partial structure having a polarity conversion group and B2 represents a partial structure having a fluorine atom.

(K1)

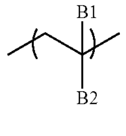

Moreover, in the repeating unit (e*) and the repeating unit (e"), the polarity conversion group is more preferably a partial structure represented by —COO— in the structure represented by General Formula (KA-1).

The hydrolysis rate of the resin (E) with respect to an alkali developer is preferably 0.001 nm/sec or more, more preferably 0.01 nm/sec or more, still more preferably 0.1 nm/sec or more, and most preferably 1 nm/sec or more.

Here, the hydrolysis rate of the resin (E) with respect to the alkali developer refers to a rate of a decrease in the thickness of a resin film formed only of the resin (E) in an aqueous tetramethylammonium hydroxide (TMAH) solution (2.38%-by-mass) at 23° C.

The resin (E) of the present invention is preferably a resin (E1) which contains a repeating unit (e) having at least two or more polarity conversion groups and has a fluorine atom.

In a case where the repeating unit (e) has at least two polarity conversion groups, it is preferable that the repeating unit (e) has a partial structure represented by General Formula (KY-1), which has two polarity conversion groups. In addition, in a case where the structure represented by General Formula (KY-1) does not have a bond, it is a monovalent or higher-valent group obtained by removing at least any one hydrogen atom in the structure.

(KY-1)

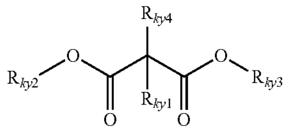

In General Formula (KY-1), $R_{ky1}$ and $R_{ky4}$ each independently represent a hydrogen atom, a halogen atom, an alkyl group, a cycloalkyl group, a carbonyl group, a carbonyloxy group, an oxycarbonyl group, an ether group, a hydroxy group, a cyano group, an amide group, or an aryl group. Alternatively, $R_{ky1}$ and $R_{ky4}$ may be bonded to the same atom to form a double bond, and for example, $R_{ky1}$ and $R_{ky4}$ may be bonded to the same oxygen atom to form a part of a carbonyl group (=O).

$R_{ky2}$ and $R_{ky3}$ are each independently an electron-withdrawing group, or $R_{ky1}$ and $R_{ky2}$ are linked to each other to form a lactone ring and $R_{ky3}$ is an electron-withdrawing group. As the lactone ring to be formed, the structures of (KA-1-1) to (KA-1-17) are preferable. Examples of the electron-withdrawing group include the same ones as those of $Y^1$ and $Y^2$ in Formula (KB-1), and the electron-withdrawing group is preferably a halogen atom, or a halo(cyclo)alkyl group or haloaryl group represented by $—C(R_{f1})(R_{f2})—R_{f3}$. Preferably, $R_{ky3}$ is a halogen atom, or a halo(cyclo)alkyl group or haloaryl group represented by $—C(R_{f1})(R_{f2})—R_{f3}$, and $R_{ky2}$ is linked to $R_{ky1}$ to form a lactone ring or is an electron-withdrawing group having no halogen atom.

$R_{ky1}$, $R_{ky2}$, and $R_{ky4}$ may be linked to each other to form a monocyclic or polycyclic structure.

Specific examples of $R_{ky1}$ and $R_{ky4}$ include the same groups as $Z_{ka1}$ in Formula (KA-1).

As the lactone ring formed by the linkage of $R_{ky1}$ and $R_{ky2}$, the structures (KA-1-1) to (KA-1-17) are preferable. Examples of the electron-withdrawing group include the same ones as those of $Y^1$ and $Y^2$ in Formula (KB-1).

The structure represented by General Formula (KY-1) is more preferably a structure represented by General Formula (KY-2). Furthermore, the structure represented by General Formula (KY-2) is a monovalent or higher-valent group obtained by removing at least one of any hydrogen atoms in the structure.

(KY-2)

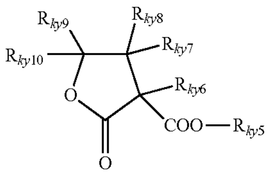

In Formula (KY-2), $R_{ky6}$ to $R_{ky10}$ each independently represent a hydrogen atom, a halogen atom, an alkyl group, a cycloalkyl group, a carbonyl group, a carbonyloxy group, an oxycarbonyl group, an ether group, a hydroxy group, a cyano group, an amide group, or an aryl group.

Two or more of $R_{ky6}$, . . . , or $R_{ky10}$ may be linked to each other to form a monocyclic or polycyclic structure.

$R_{ky5}$ represents an electron-withdrawing group. Examples of the electron-withdrawing group include the same ones as those in $Y^1$ and $Y^2$, and the electron-withdrawing group is preferably a halogen atom, or a halo(cyclo)alkyl group or haloaryl group represented by $-C(R_{f1})(R_{f2})-R_{f3}$.

Specific examples of $R_{ky5}$ to $R_{ky10}$ include the same groups as $Z_{ka1}$ in Formula (KA-1).

The structure represented by Formula (KY-2) is more preferably a partial structure represented by General Formula (KY-3).

(KY-3)

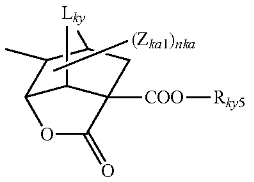

In Formula (KY-3), $Z_{ka1}$ and nka each have the same definitions as in General Formula (KA-1). $R_{ky5}$ has the same definition as in Formula (KY-2).

$L_{ky}$ represents an alkylene group, an oxygen atom, or a sulfur atom. Examples of the alkylene group of $L_{ky}$ include a methylene group and an ethylene group. $L_{ky}$ is preferably the oxygen atom or the methylene group, and more preferably the methylene group.

The repeating unit (e) is not limited as long as it is a repeating unit obtained by polymerization such as addition polymerization, condensation polymerization, and addition condensation, but is preferably a repeating unit obtained by addition polymerization of carbon-carbon double bonds. Examples of the repeating unit (e) include an acrylate-based repeating unit (including a system having a substituent at the α- or β-position), a styrene-based repeating unit (including a system having a substituent at the α- or β-position), a vinyl ether-based repeating unit, a norbornene-based repeating unit, and a maleic acid derivative (maleic acid anhydride or a derivative thereof, maleimide, and the like) repeating unit, and the acrylate-based repeating unit, the styrene-based repeating unit, the vinyl ether-based repeating unit, or the norbornene-based repeating unit is preferable, the acrylate-based repeating unit, the vinyl ether-based repeating unit, or the norbornene-based repeating unit is more preferable, and the acrylate-based repeating unit is most preferable.

As a more specific structure of the repeating unit (e), a repeating unit having a partial structure shown below is preferable.

The repeating unit (e) can be a repeating unit having a partial structure shown below.

(cc)

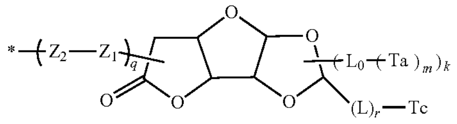

In General Formula (ee),

In a case where a plurality of $Z_1$'s are present, $Z_1$'s each independently represent a single bond, an ether bond, an ester bond, an amide bond, a urethane bond, or a urea bond, and preferably represent the ester bond.

In a case where a plurality of $Z_2$'s are present, $Z_2$'s each independently represent a chain or cyclic alkylene group, and preferably represent an alkylene group having 1 or 2 carbon atoms or a cycloalkylene group having 5 to 10 carbon atoms.

Ta's each independently represent an alkyl group, a cycloalkyl group, an alkoxy group, a nitrile group, a hydroxy group, an amide group, an aryl group, or an electron-withdrawing group (having the same definition as that of the electron-withdrawing group as each of $Y^1$ and $Y^2$ in General Formula (KB-1)), preferably represent the alkyl group, the cycloalkyl group, or the electron-withdrawing group, and more preferably represent the electron-withdrawing group. In a case where a plurality of Ta's are present, Ta's may be bonded to each other to form a ring.

$L_0$ represents a single bond or an m+1-valent hydrocarbon group (preferably having 20 or less carbon atoms), and preferably represents a single bond. The single bond as $L_0$ corresponds to a case where m is 1. The m+1-valent hydrocarbon group as $L_0$ represents, for example, an alkylene group, a cycloalkylene group, a phenylene group, or a m+1-valent hydrocarbon group obtained by removing any m−1 hydrogen atoms from a combination of those groups.

L's each independently represent a carbonyl group, a carbonyloxy group, or an ether group.

Tc represents a hydrogen atom, an alkyl group, a cycloalkyl group, a nitrile group, a hydroxy group, an amide group, an aryl group, or an electron-withdrawing group (having the same definition as that of the electron-withdrawing group as each of $Y^1$ and $Y^2$ in General Formula (KB-1)).

* represents a bond to the main chain or a side chain of the resin. That is, the partial structure represented by Formula (ee) may be directly linked to the main chain, and the partial structure represented by Formula (ee) may be bonded to the side chain of the resin. Furthermore, the bond to the main chain is a bond to an atom which exists in a bond constituting the main chain, and the bond to a side chain is a bond to an atom which exists in a part other than a bond constituting the main chain.

m represents an integer of 1 or 28, and is preferably an integer of 1 to 3, and more preferably 1.

k represents an integer of 0 to 2, and is preferably 1.

q represents a repetition number of the groups ($Z_2$-$Z_1$), represents an integer of 0 to 5, and is preferably 0 to 2.

r represents an integer of 0 to 5.

In addition, -(L)r-Tc may be substituted with -$L_0$-(Ta)m.

A case where a sugar lactone has a fluorine atom at a terminal thereof and a case where the sugar lactone has a fluorine atom on a side chain different from the side chain on the sugar lactone side in the same repeating unit (repeating unit (e")) are also preferable.

In a case where the chain alkylene group as $Z_2$ is a linear alkylene group, it preferably has 1 to 30 carbon atoms, and more preferably has 1 to 20 carbon atoms; and in a case where the chain alkylene group is a branched alkylene group, it preferably has 3 to 30 carbon atoms, and more preferably has 3 to 20 carbon atoms. Specific examples of the chain alkylene group as $R_2$ include a group obtained by removing one of any hydrogen atoms from the specific examples of the alkyl group as $Z_{ka1}$.

The cyclic alkylene group as $Z_2$ preferably has 3 to 8 carbon atoms, and specific examples thereof include a group obtained by removing one of any hydrogen atoms from the cycloalkyl group as $Z_{ka1}$.

The preferred number of carbon atoms and preferred specific examples of the alkyl group and cycloalkyl group as each of Ta and Tc are each the same ones as those described for the alkyl group and the cycloalkyl group as $Z_{ka1}$.

The alkoxy group as Ta preferably has 1 to 8 carbon atoms, and examples thereof include a methoxy group, an ethoxy group, a propoxy group, and a butoxy group.

Preferred examples of the aryl group as each of Ta and Tc include an aryl group having 6 to 12 carbon atoms, for example, a phenyl group and a naphthyl group.

The preferred number of carbon atoms and preferred specific examples of the alkylene group and cycloalkylene group as $L_0$ are each the same ones as those described for the chain alkylene group and the cyclic alkylene group as $Z_2$.

As a more specific structure of the repeating unit (e), a repeating unit having a partial structure shown below is preferable.

(ca-2)

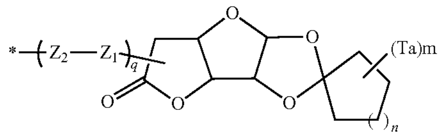

(cb-2)

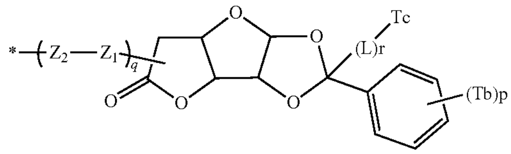

In General Formulae (ea-2) and (eb-2), n represents an integer of 0 to 11, preferably represents an integer of 0 to 5, and more preferably represents 1 or 2.

p represents an integer of 0 to 5, preferably represents an integer of 0 to 3, and more preferably represents 1 or 2.

Tb's independently represent an alkyl group, a cycloalkyl group, an alkoxy group, a nitrile group, a hydroxy group, an amide group, an aryl group, or an electron-withdrawing group (having the same definition as that of the electron-withdrawing group as each of $Y^1$ and $Y^2$ in General Formula (KB-1)), and preferably represent the alkyl group, the cycloalkyl group, or the electron-withdrawing group. In a case where there are a plurality of Tb's, Tb's may be bonded to each other to form a ring.

* represents a bond to the main chain or a side chain of the resin. That is, the partial structure represented by Formula (ea-2) or (eb-2) may be directly linked to the main chain, or the partial structure represented by Formula (ea-2) or (eb-2) may be bonded to the side chain of the resin.

$Z_1$, $Z_2$, Ta, Tc, L, *, m, q, and r have the same definitions as in General Formula (ee), and preferred ones are also the same.

Examples of a more specific structure of the repeating unit (e) include a repeating unit having a partial structure shown below.

(KY-4)

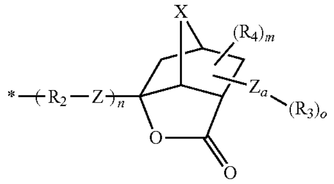

In General Formula (KY-4), $R_2$ represents a chain or cyclic alkylene group, and in a case where a plurality of $R_2$'s are present, $R_2$'s may be the same as or different from each other.

$R_3$ represents a linear, branched, or cyclic hydrocarbon group in which some or all of the hydrogen atoms on the constituent carbon are substituted with fluorine atoms.

$R_4$ represents a halogen atom, a cyano group, a hydroxy group, an amide group, an alkyl group, a cycloalkyl group, an alkoxy group, a phenyl group, an acyl group, an alkoxycarbonyl group, or a group represented by R—C(=O)— or R—C(=O)O— (R represents an alkyl group or a cycloalkyl group). In a case where there are a plurality of $R_4$'s, $R_4$'s may be the same as or different from each other, and two or more $R_4$'s may be bonded to each other to form a ring.

X represents an alkylene group, an oxygen atom, or a sulfur atom.

In a case where a plurality of each of Z's and Za's are present, Z's and Za's each independently represent a single bond, an ether bond, an ester bond, an amide bond, a urethane bond, or a urea bond, and in a case where a plurality of Z's and Za's are present, Z's and Za's may be each the same as or different from each other.

* represents a bond to the main chain or a side chain of the resin.

o is the number of substituents and represents an integer of 1 to 7.

m is the number of substituents and represents an integer of 0 to 7.

n represents the repetition number and represents an integer of 0 to 5.

As the structure of —$R_2$—Z—, a structure represented by —$(CH_2)_l$—COO— is preferable (l represents an integer of 1 to 5).

The preferred number of carbon atoms and preferred specific examples of the chain or cyclic alkylene group as $R_2$ are each the same ones as those described for the chain alkylene group and the cyclic alkylene group for $Z_2$ in General Formula (ee).

With regard to the number of carbon atoms of the linear, branched, or cyclic hydrocarbon group as $R_3$, in a case where $R_3$ is a linear hydrocarbon group, the number of carbon atoms is preferably 1 to 30, and more preferably 1 to 20; in a case where $R_3$ is a branched hydrocarbon group, the number of carbon atoms is preferably 3 to 30, and more preferably 3 to 20; and in a case where $R_3$ is a cyclic hydrocarbon group, the number of carbon atoms is 6 to 20. Specific examples of $R_3$ include the specific examples of the alkyl group and the cycloalkyl group as $Z_{ka1}$ described above. The preferred number of carbon atoms and preferred specific examples of the alkyl group and the cycloalkyl group as each of $R_4$ are each the same ones as those described for the alkyl group and the cycloalkyl group as $Z_{ka1}$ described above.

The acyl group as $R_4$ preferably has 1 to 6 carbon atoms, and examples thereof include a formyl group, an acetyl group, a propionyl group, a butyryl group, an isobutyryl group, a valeryl group, and a pivaloyl group.

Examples of the alkyl moiety in each of the alkoxy group and the alkoxycarbonyl group as $R_4$ include a linear, branched, or cyclic alkyl moiety, and the preferred number of carbon atoms and specific examples of the alkyl moiety are each the same ones as those described for the alkyl group and the cycloalkyl group as $Z_{ka1}$.

Examples of the alkylene group as X include a chain or cyclic alkylene group, and the preferred number of carbon atoms and specific example of the alkylene group are each the same ones as those described for the chain alkylene group and the cyclic alkylene group as $R_2$ A repeating unit having a partial structure represented by General Formula (KY-5) is more preferable.

(KY-5)

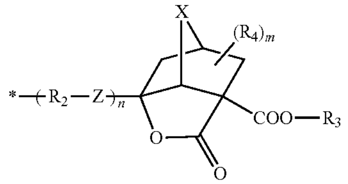

In General Formula (KY-5), $R_2$ represents a chain or cyclic alkylene group, and in a case where a plurality of $R_2$'s are present, $R_2$'s may be the same as or different from each other.

$R_3$ represents a linear, branched, or cyclic hydrocarbon group in which some or all of the hydrogen atoms on the constituent carbon are substituted with fluorine atoms.

$R_4$ represents a halogen atom, a cyano group, a hydroxy group, an amide group, an alkyl group, a cycloalkyl group, an alkoxy group, a phenyl group, an acyl group, an alkoxycarbonyl group, or a group represented by R—C(═O)— or R—C(═O)O— (R represents an alkyl group or a cycloalkyl group). In a case where there are a plurality of $R_4$'s, $R_4$'s may be the same as or different from each other, and two or more $R_4$'s may be bonded to each other to form a ring.

X represents an alkylene group, an oxygen atom, or a sulfur atom.

Z represents a single bond, an ether bond, an ester bond, an amide bond, a urethane bond, or a urea bond, and in a case where a plurality of Z's are present, Z's may be the same as or different from each other.

* represents a bond to the main chain or a side chain of the resin.

n represents the repetition number and represents an integer of 0 to 5.

m is the number of substituents and represents an integer of 0 to 7.

The preferable range and specific examples of the number of carbon atoms for each of $R_2$ to $R_4$ and X are the same ones as those described in General Formula (KY-4).

As the structure of $—R_2—Z—$, a structure represented by $—(CH_2)_l—COO—$ is preferable (l represents an integer of 1 to 5).

Examples of a more specific structure of the repeating unit (e) include a repeating unit having a partial structure shown below.

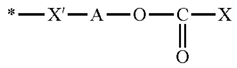

(rf-1)

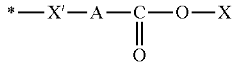

(rf-2)

In General Formulae (rf-1) and (rf-2),

X' represents an electron-withdrawing substituent, and is preferably a carbonyloxy group, an oxycarbonyl group, an alkylene group substituted with a fluorine atom, or a cycloalkylene group substituted with a fluorine atom.

A represents a single bond or a divalent linking group represented by —C(Rx)(Ry)-. Here, Rx and Ry each independently represent a hydrogen atom, a fluorine atom, an alkyl group (which preferably has 1 to 6 carbon atoms and may be substituted with a fluorine atom or the like), or a cycloalkyl group (which preferably has 5 to 12 carbon atoms and may be substituted with a fluorine atom or the like). Rx and Ry are preferably the hydrogen atom, the alkyl group, or the alkyl group substituted with a fluorine atom.

X represents an electron-withdrawing group, and is preferably a fluorinated alkyl group, a fluorinated cycloalkyl group, an aryl group substituted with fluorine or a fluorinated alkyl group, an aralkyl group substituted with fluorine or a fluorinated alkyl group.

* represents a bond to the main chain or a side chain of the resin. That is, * represents a bond which bonds to the main chain of the resin through a single bond or a linking group.

In addition, in a case where X is a carbonyloxy group or an oxycarbonyl group, A is not a single bond.

In a case where the alkylene group in the alkylene group substituted with a fluorine atom as X' is a linear alkylene group, it preferably has 1 to 30 carbon atoms, and has more preferably 1 to 20 carbon atoms, and in a case where the alkylene group is a branched alkylene group, it preferably 3 to 30 carbon atoms, and more preferably has 3 to 20 carbon atoms. Specific examples of the alkylene group include groups obtained by removing any one hydrogen atom from the specific examples of the alkyl group as $Z_{ka1}$ described above. The alkylene group substituted with a fluorine atom is preferably a perfluoroalkylene group.

The cycloalkylene group in the cycloalkylene group substituted with a fluorine atom as X' preferably has 3 to 8 carbon atoms, and specific examples thereof include a group obtained by removing any one hydrogen atom from the specific examples of the cycloalkyl group as $Z_{ka1}$. The cycloalkylene group substituted with a fluorine atom is preferably a perfluorocycloalkylene group.

In a case where the alkyl group in the fluorinated alkyl group as X is a linear alkyl group, it preferably has 1 to 30 carbon atoms, and more preferably 1 to 20 carbon atoms; and in a case where the alkyl group is a branched alkyl group, it preferably has 3 to 30 carbon atoms, and more preferably has 3 to 20 carbon atoms. Specific examples of the alkyl group include the specific examples of the alkyl group as $Z_{ka1}$ described above. The fluorinated alkyl group is preferably a perfluoroalkyl group.

The cycloalkyl group in the fluorinated cycloalkyl group as X preferably has 3 to 8 carbon atoms, and specific examples thereof include the specific examples of the cycloalkyl group as $Z_{ka1}$. The fluorinated cycloalkyl group is preferably a perfluorocycloalkyl group.

The aryl group in the aryl group substituted with fluorine or a fluorinated alkyl group as X is preferably an aryl group having 6 to 12 carbon atoms, for example, a phenyl group and a naphthyl group. In addition, specific examples of the fluorinated alkyl group in the aryl group substituted with a fluorinated alkyl group are the same ones as those described for the fluorinated alkyl group as X.

Preferred examples of the aralkyl group in the aralkyl group substituted with fluorine or a fluorinated alkyl group as X include an aralkyl group having 6 to 12 carbon atoms, for example, a benzyl group, a phenethyl group, a naphthylmethyl group, a naphthylethyl group, and a naphthylbutyl group. Furthermore, specific examples of the fluorinated alkyl group in the aralkyl group substituted with a fluorinated alkyl group are the same ones as those described for the fluorinated alkyl group as X.

The resin (E) preferably has a repeating unit represented by General Formula (2) as the repeating unit (e).

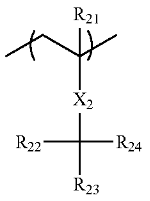

(2)

In General Formula (2), $R_{21}$ represents a hydrogen atom or a monovalent organic group. $X_2$ represents a divalent linking group. $R_{22}$ and $R_{23}$ each independently represent a fluoroalkyl group. $R_{24}$ represents a hydrogen atom, a fluorine atom, or a monovalent organic group.

As the divalent linking group represented by $X_2$ in General Formula (2), a divalent linking group having the above-mentioned polarity conversion group is preferable, and a divalent linking group having a lactone structure is particularly preferable.

In General Formula (2), $R_{21}$ preferably represents a hydrogen atom or an alkyl group, and more preferably represents the hydrogen atom or an alkyl group having 1 to 5 carbon atoms.

In General Formula (2), $R_{22}$ and $R_{23}$ each independently represent a fluoroalkyl group, preferably represent a fluoroalkyl group having 1 to 10 carbon atoms, and more preferably represent a fluoroalkyl group having 1 to 5 carbon atoms.

In General Formula (2), $R_{24}$ preferably represents a hydrogen atom, a fluorine atom, or a fluoroalkyl group having 1 to 10 carbon atoms, and more preferably represents the hydrogen atom, the fluorine atom, or a fluoroalkyl group having 1 to 5 carbon atoms.

Specific examples of the repeating unit (e) having a polarity conversion group are shown below, but the present invention is not limited thereto.

Ra represents a hydrogen atom, a fluorine atom, a methyl group, or a trifluoromethyl group.

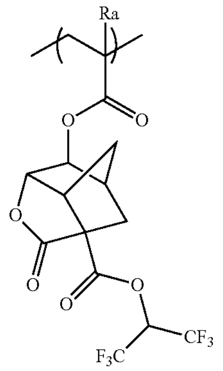

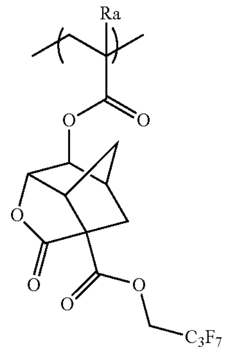

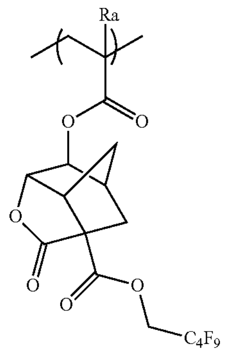

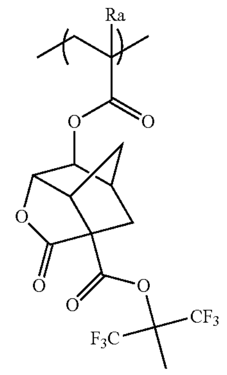

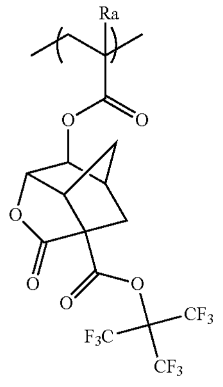

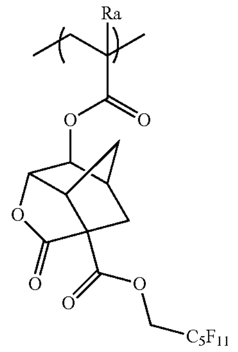

-continued
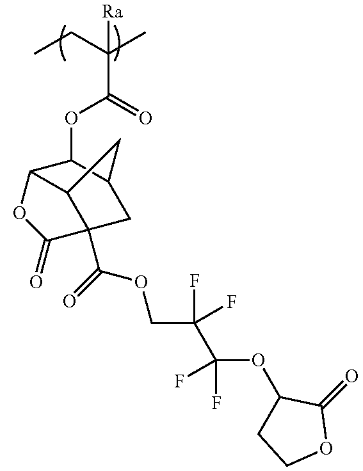
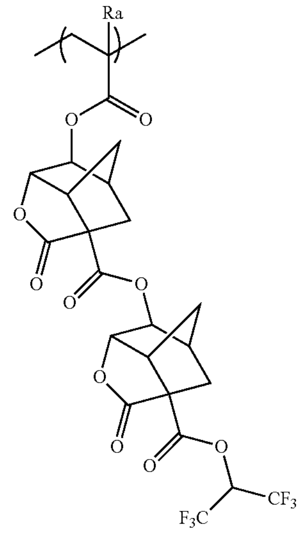
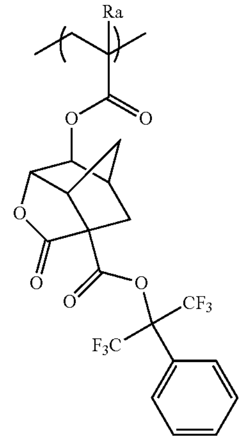
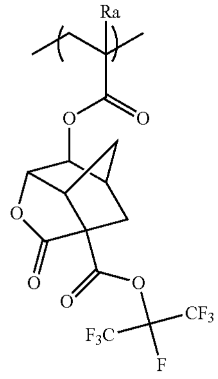
-continued
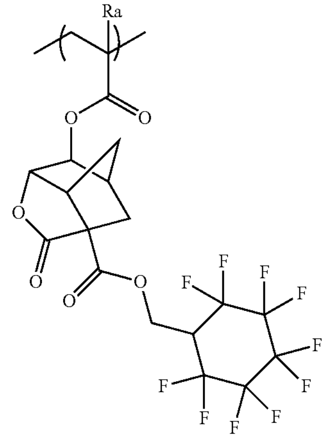
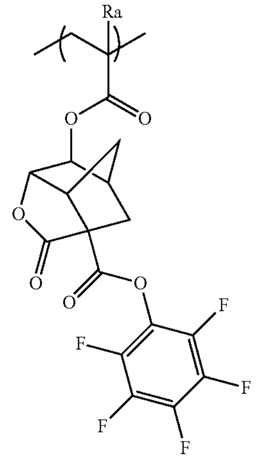
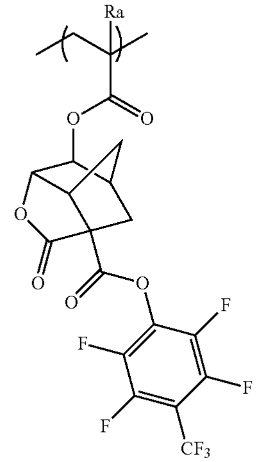
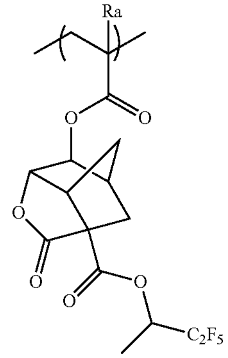
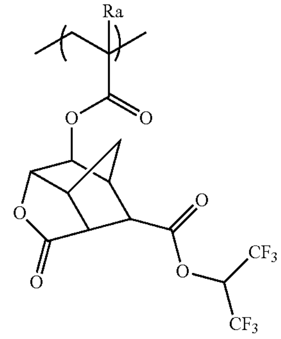
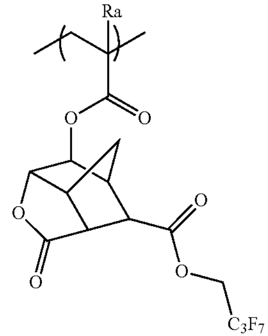

-continued
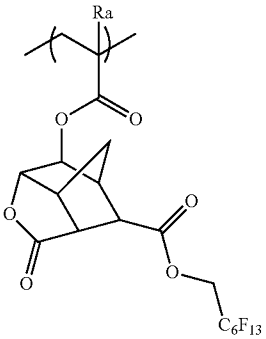
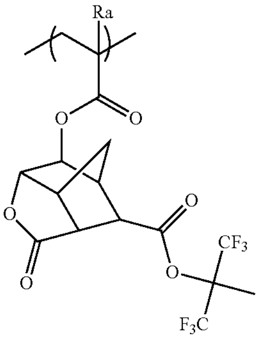
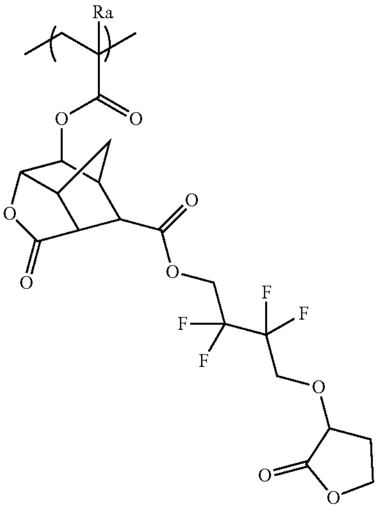
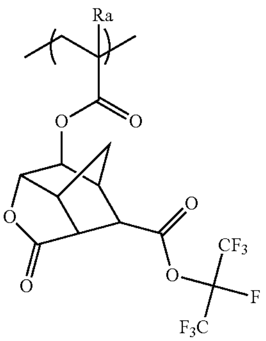
-continued
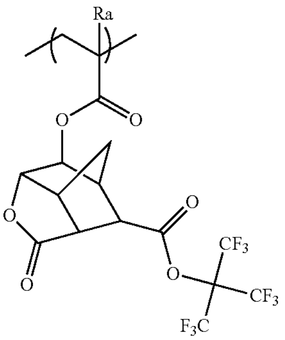
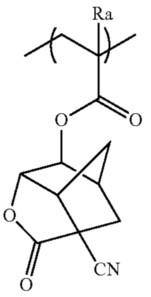
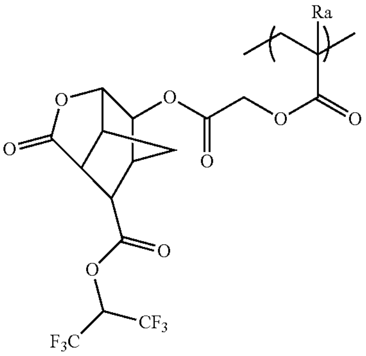
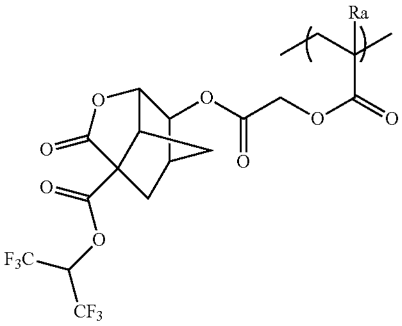
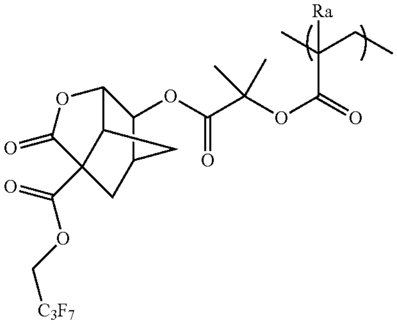
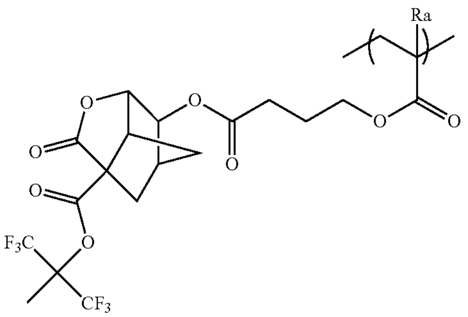

-continued
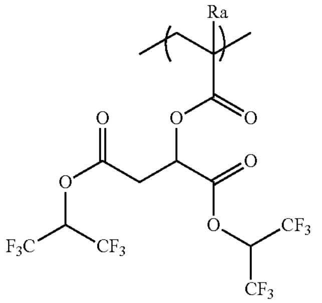
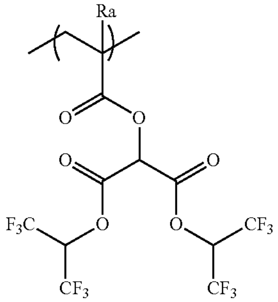
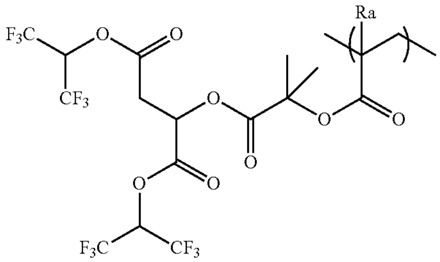
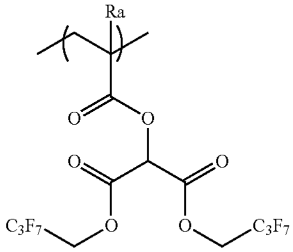
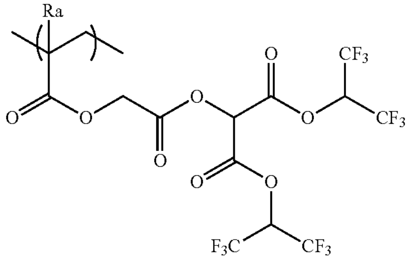
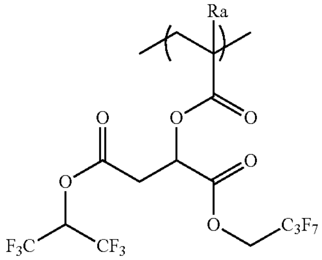
-continued
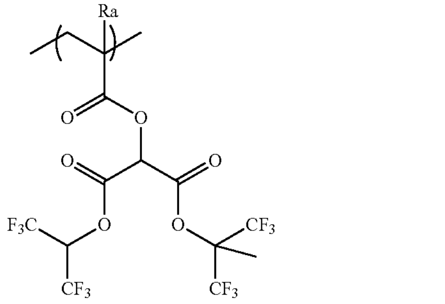
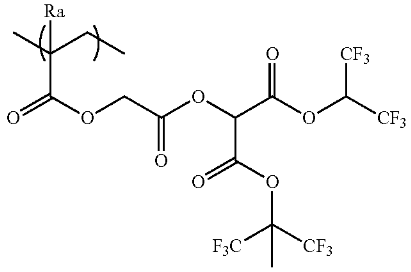
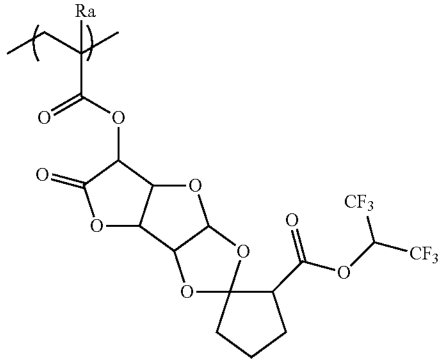
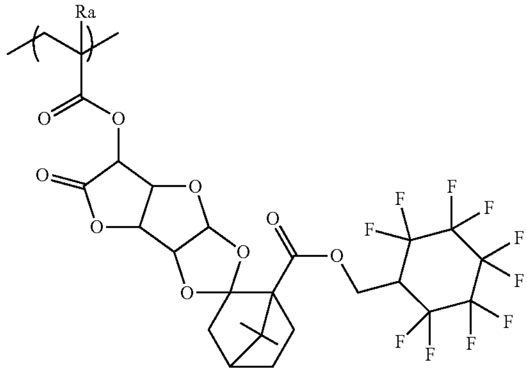
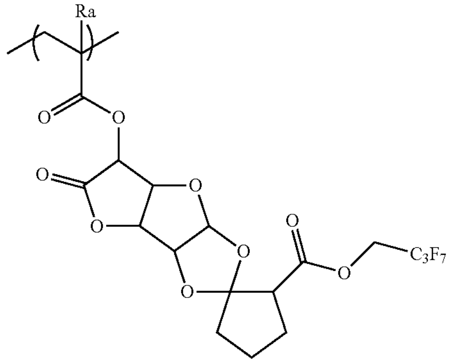

-continued

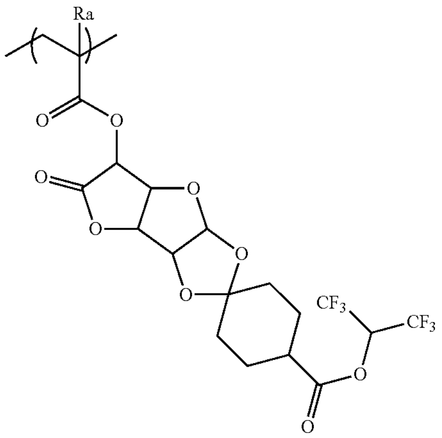

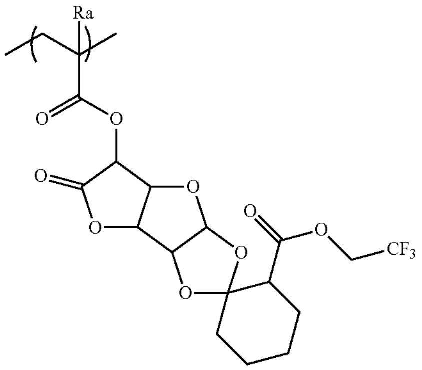

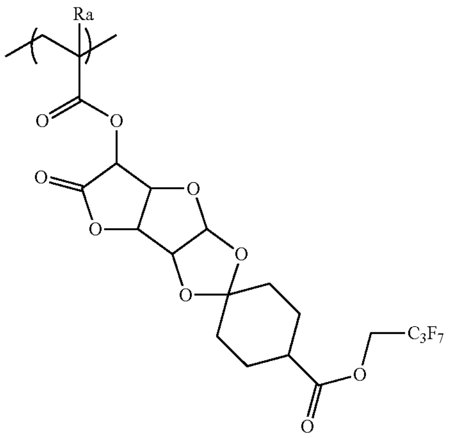

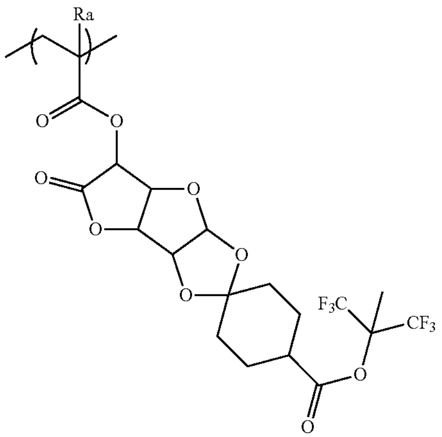

-continued

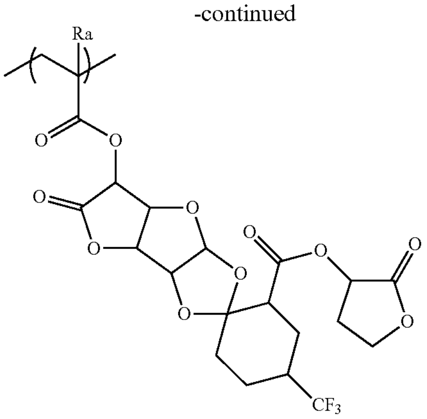

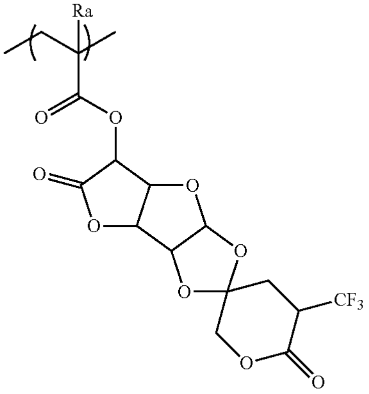

A content of the repeating unit (e) in the resin (E) is preferably 10% to 100% by mole, more preferably 20% to 100% by mole, still more preferably 30% to 100% by mole, and most preferably 40% to 100% by mole with respect to all the repeating units in the resin (E).

A content of the repeating unit (e') is preferably 10% to 100% by mole, more preferably 20% to 100% by mole, still more preferably 30% to 100% by mole, and most preferably 40% to 100% by mole with respect to all the repeating units in the resin (E).

A content of the repeating unit (e*) is preferably 5% to 70% by mole, more preferably 5% to 60% by mole, still more preferably 10% to 50% by mole, and most preferably 10% to 40% by mole with respect to all the repeating units in the resin (E). A content of the repeating unit having a fluorine atom, which is used together with the repeating unit (e*), is preferably 10% to 95% by mole, more preferably 15% to 85% by mole, still more preferably 20% to 80% by mole, and most preferably 25% to 75% by mole with respect to all the repeating units in the resin (E).

A content of the repeating unit (e") is preferably 10% to 100% by mole, more preferably 20% to 100% by mole, still more preferably 30% to 100% by mole, and most preferably 40% to 100% by mole with respect to all the repeating units in the resin (E).

The fluorine atom in the resin (E) may be contained in the main chain of the resin or may be substituted in a side chain of the resin.

The resin (E) may further have another repeating unit. Preferred aspects of the other repeating units include the following ones.

(ey1) A repeating unit which has a fluorine atom, and is stable to an acid, and sparingly soluble or insoluble in an alkali developer.

(ey2) A repeating unit which has no fluorine atom, and is stable to an acid, and sparingly soluble or insoluble in an alkali developer.

(ey3) A repeating unit which has a fluorine atom and a polar group other than (x) and (z) described above.

(ey4) A repeating unit which has no fluorine atom and has a polar group other than (x) and (z) described above.

In the repeating units of (ey1) and (ey2), "being sparingly soluble or insoluble in an alkali developer" means that (ey1) and (ey2) do not include an alkali-soluble group or a group that produces an alkali-soluble group by the action of an acid or an alkali developer (for example, an acid-decomposable group or a polarity conversion group).

The repeating units (ey1) and (ey2) preferably have an alicyclic hydrocarbon structure having no polar group.

Preferred aspects of the repeating units (ey1) to (ey4) are shown below.

The repeating units (ey1) and (ey2) are each preferably a repeating unit represented by General Formula (CIII).

(CIII)

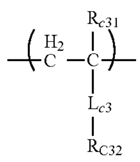

In General Formula (CIII), $R_{c31}$ represents a hydrogen atom, an alkyl group which may be substituted with a fluorine atom, a cyano group, or a —$CH_2$—O-$Rac_2$ group. In the formula, $Rac_2$ represents a hydrogen atom, an alkyl group, or an acyl group. $R_{c31}$ is preferably a hydrogen atom, a methyl group, a hydroxymethyl group, or a trifluoromethyl group, and particularly preferably the hydrogen atom or the methyl group.

$R_{c32}$ represents a group having an alkyl group, a cycloalkyl group, an alkenyl group, a cycloalkenyl group, or an aryl group. These groups may be substituted with a group including a silicon atom, a fluorine atom, or the like.

$L_{c3}$ represents a single bond or a divalent linking group.

In General Formula (CIII), the alkyl group of $R_{32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably a phenyl group having 6 to 20 carbon atoms or a naphthyl group, and these may have a substituent.

$R_{c32}$ is preferably an unsubstituted alkyl group or an alkyl group substituted with a fluorine atom. The divalent linking group of $L_{c3}$ is preferably an alkylene group (preferably having 1 to 5 carbon atoms), an oxy group, a phenylene group, or an ester bond (a group represented by —COO—).

The repeating units (ey1) and (ey2) are each preferably a repeating unit represented by General Formula (C4) or (C).

(C4)

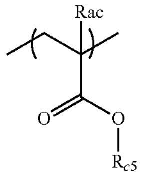

(C5)

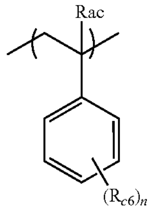

In General Formulae (C4) and (C5), $R_{c5}$ represents a hydrocarbon group which has at least one cyclic structure and has neither a hydroxy group nor a cyano group.

Rac represents a hydrogen atom, an alkyl group which may be substituted with a fluorine atom, a cyano group, or a —$CH_2$—O-$Rac_2$ group. In the formula, $Rac_2$ represents a hydrogen atom, an alkyl group, or an acyl group. Rac is preferably the hydrogen atom, a methyl group, a hydroxymethyl group, or a trifluoromethyl group, and particularly preferably the hydrogen atom or the methyl group.

The cyclic structure contained in $R_{c5}$ includes a monocyclic hydrocarbon group and a polycyclic hydrocarbon group. Examples of the monocyclic hydrocarbon group include a cycloalkyl group having 3 to 12 carbon atoms and a cycloalkenyl group having 3 to 12 carbon atoms. A preferred monocyclic hydrocarbon group is a monocyclic hydrocarbon group having 3 to 7 carbon atoms.

Examples of the polycyclic hydrocarbon group include a ring-assembled hydrocarbon group and a crosslinked cyclic hydrocarbon group. Examples of the crosslinked cyclic hydrocarbon ring include a bicyclic hydrocarbon ring, a tricyclic hydrocarbon ring, and a tetracyclic hydrocarbon ring. Furthermore, other examples of the crosslinked cyclic hydrocarbon ring include a fused cyclic hydrocarbon ring (for example, a fused ring formed by fusing a plurality of 5- to 8-membered cycloalkane rings). Preferred examples of the crosslinked cyclic hydrocarbon ring include a norbornyl group and an adamantyl group.

These alicyclic hydrocarbon groups may have a substituent, and preferred examples of the substituent include a halogen atom, an alkyl group, a hydroxy group protected with a protective group, and an amino group protected with a protective group. Preferred examples of the halogen atom include bromine, chlorine, and fluorine atoms, and preferred examples of the alkyl group include methyl, ethyl, butyl, and t-butyl groups. The alkyl group may further have a substituent, and examples of the substituent which may further be contained include a halogen atom, an alkyl group, a hydroxy group protected with a protective group, and an amino group protected with a protective group.

Examples of the protective group include an alkyl group, a cycloalkyl group, an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms; preferred examples of the substituted methyl group include methoxymethyl, methoxythiomethyl, benzyloxymethyl, t-butoxymethyl, and 2-methoxyethoxymethyl groups; preferred examples of the substituted ethyl group include 1-ethoxyethyl and 1-methyl-1-methoxyethyl; preferred examples of the acyl group include an aliphatic acyl group having 1 to 6 carbon atoms, such as formyl, acetyl, propionyl, butyryl, isobutyryl, valeryl, and pivaloyl groups; and examples of the alkoxycarbonyl group include an alkoxycarbonyl group having 2 to 4 carbon atoms.

$R_{c6}$ represents an alkyl group, a cycloalkyl group, an alkenyl group, a cycloalkenyl group, an alkoxycarbonyl group, or an alkylcarbonyloxy group. These groups may be substituted with a fluorine atom or a silicon atom.

The alkyl group of $R_{c6}$ is preferably a linear or branched alkyl group having 1 to 20 carbon atoms. The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The alkoxycarbonyl group is preferably an alkoxycarbonyl group having 2 to 20 carbon atoms.

The alkylcarbonyloxy group is preferably an alkylcarbonyloxy group having 2 to 20 carbon atoms.

n represents an integer of 0 to 5. In a case where n is 2 or more, a plurality of $R_{c6}$'s may be the same as or different from each other.

$R_{c6}$ is preferably an unsubstituted alkyl group or an alkyl group substituted with a fluorine atom, and particularly preferably a trifluoromethyl group or a t-butyl group.

It is also preferable that (ey1) and (ey2) are each a repeating unit represented by General Formula (CII-AB).

(CII-AB)

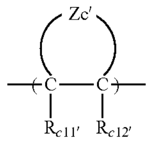

In Formula (CII-AB), $R_{c11}$' and $R_{c12}$' each independently represent a hydrogen atom, a cyano group, a halogen atom, or an alkyl group.

Zc' represents an atomic group for forming an alicyclic structure, which includes two bonded carbon atoms (C—C).

Furthermore, General Formula (CII-AB) is more preferably General Formula (CII-AB1) or General Formula (CII-AB2).

CII-AB1

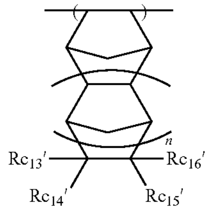

-continued

CII-AB2

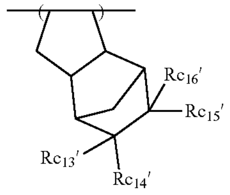

In Formulae (CII-AB1) and (CII-AB2), $Rc_{13}$' to $Rc_{16}$' each independently represent a hydrogen atom, a halogen atom, an alkyl group, or a cycloalkyl group.

In addition, at least two of $Rc_{13}$', . . . , or $Rc_{16}$' may be bonded to each other to form a ring.

n represents 0 or 1.

Specific examples of (ey1) and (ey2) are shown below, but the present invention is not limited thereto. In the formulae, Ra represents H, $CH_3$, $CH_2OH$, $CF_3$, or CN.

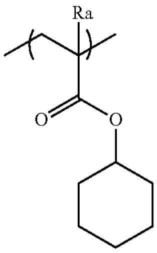
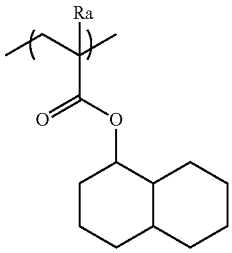
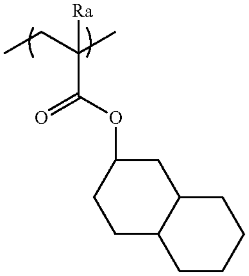
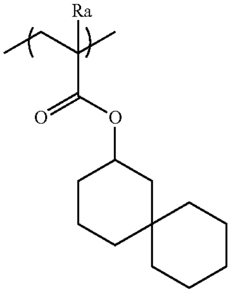
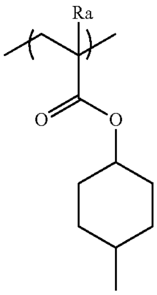
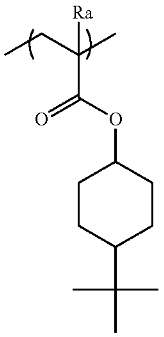
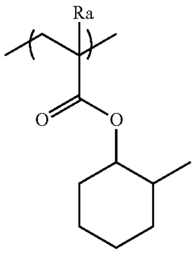
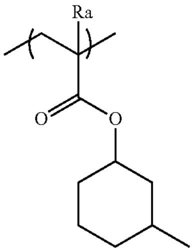
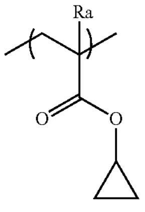
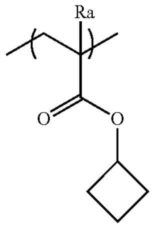

-continued
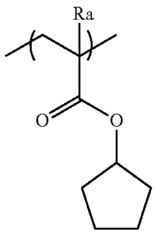
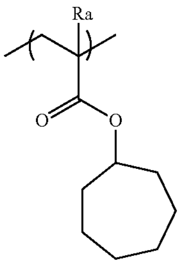
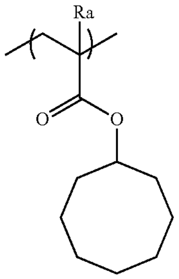
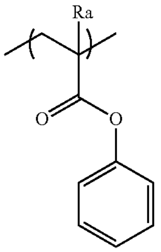
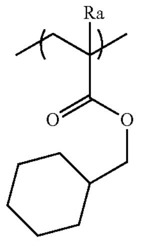
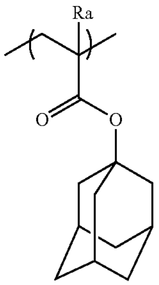
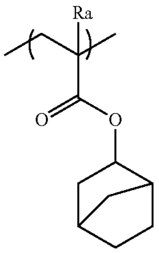
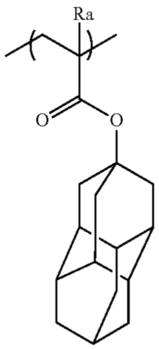
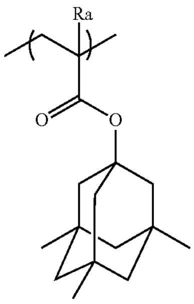
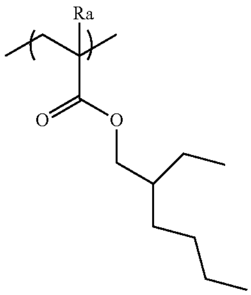
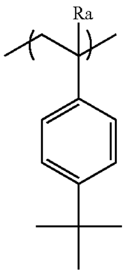
-continued
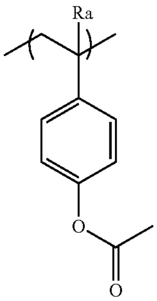
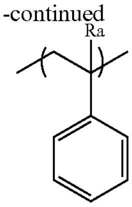
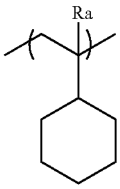
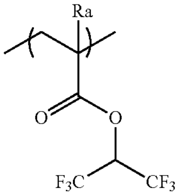
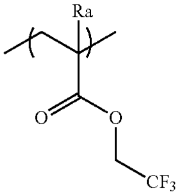
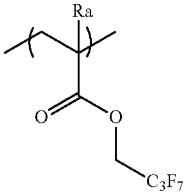
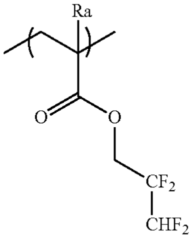
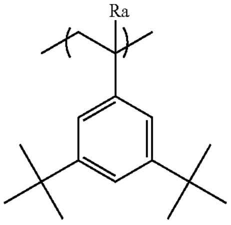
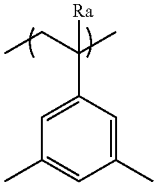
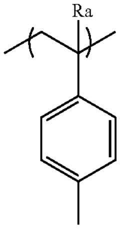
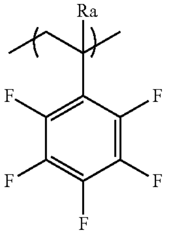
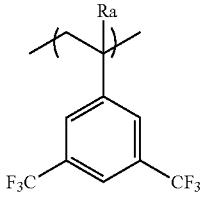
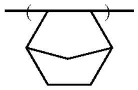
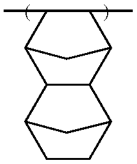
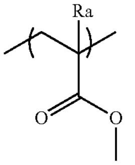
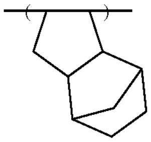
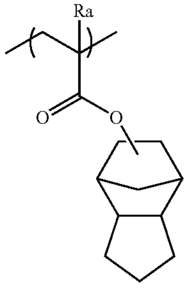
Each of (ey3) and (ey4) is preferably a repeating unit having a hydroxy group or a cyano group as a polar group.

This improves the affinity for the developer. The repeating unit having a hydroxy group or a cyano group is preferably a repeating unit having an alicyclic hydrocarbon structure substituted with a hydroxy group or a cyano group. In the alicyclic hydrocarbon structure substituted with a hydroxy group or a cyano group, the alicyclic hydrocarbon structure is preferably an adamantyl group, a diamantyl group, or a norbornyl group. Preferred examples of the alicyclic hydrocarbon structure substituted with a hydroxy group or a cyano group include a monohydroxyadamantyl group, a dihydroxyadamantyl group, a monohydroxydiadamantyl group, a dihydroxyadamantyl group, and a norbornyl group substituted with a cyano group.

Examples of the repeating unit having the atomic group include repeating units represented by General Formulae (CAIIa) to (CAIId).

(CAIIa)

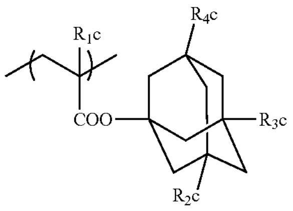

(CAIIb)

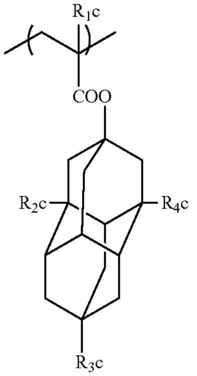

(CAIIc)

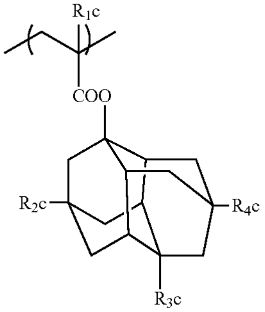

(CAIId)

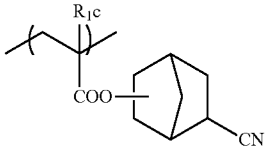

In General Formulae (CAIIa) to (CAIId), $R_1c$ represents a hydrogen atom, a methyl group, a trifluoromethyl group, or a hydroxymethyl group.

$R_2c$ to $R_4c$ each independently represent a hydrogen atom, a hydroxy group, or a cyano group. It should be noted that at least one of $R_2c$, . . . , or $R_4c$ represents a hydroxy group or a cyano group. Preferably, one or two of $R_2c$ to $R_4c$ are hydroxy groups, and the remaining is a hydrogen atom. In General Formula (CAIIa), it is more preferable that two of $R_2c$ to $R_4c$ are hydroxy groups and the remaining is a hydrogen atom.

Specific examples of the repeating units represented by (ey3) and (ey4) are shown below, but the present invention is not limited thereto.

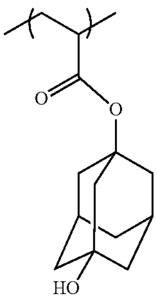

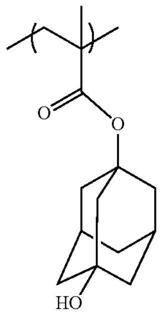

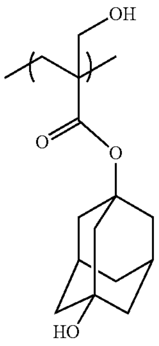

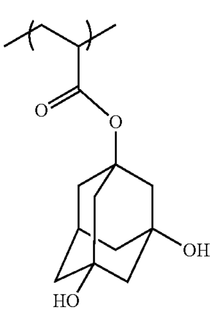

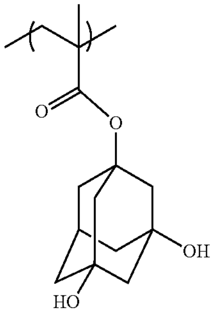

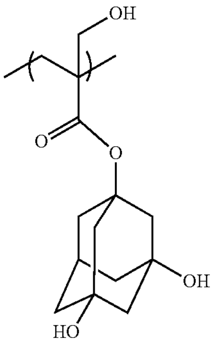

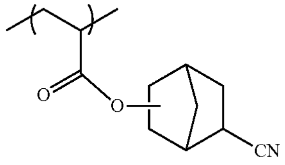

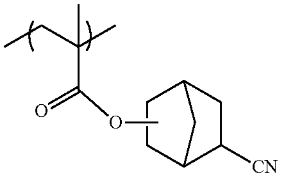

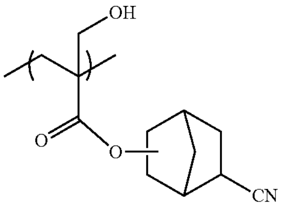

-continued

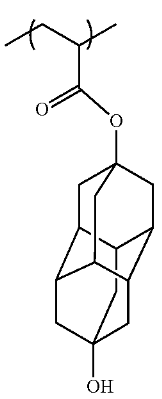

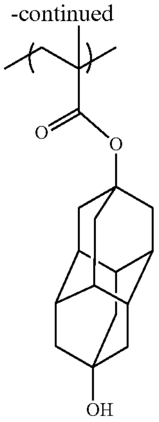

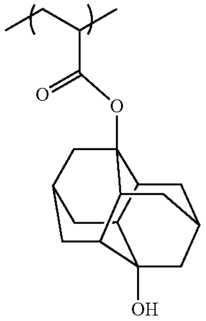

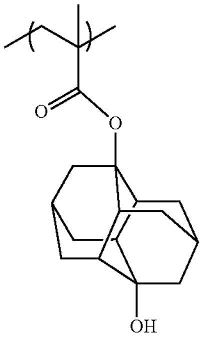

The content of the repeating units represented by (ey1) to (ey4) is preferably 5% to 40% by mole, more preferably 5% to 30% by mole, and still more preferably 10% to 25% by mole with respect to all the repeating units in the resin (E).

The resin (E) may have a plurality of repeating units represented by (ey1) to (ey4).

The content of fluorine atoms in the resin (E) is preferably 5% to 80% by mass, and more preferably 10% to 80% by mass, with respect to the molecular weight of the resin (E). Furthermore, the repeating unit containing a fluorine atom is preferably 10% to 100% by mass, and more preferably 30% to 100% by mass with respect to all the repeating units in the resin (E).

From the viewpoint of improving the uneven distribution, the molecular weight of the fluorine-containing compound (E) is preferably 1,000 to 100,000.

The weight-average molecular weight of the resin (E) is preferably 1,000 to 100,000, more preferably 1,000 to 50,000, and still more preferably 2,000 to 15,000.

The molecular weight distribution (Mw/Mn, also referred to as a dispersity) of the resin (E) is preferably in the range of 1 to 3, more preferably 1 to 2, still more preferably 1 to 1.8, and most preferably in the range of 1 to 1.5.

As the resin (E), various commercially available products can be used, and in the same manner as for the resin (A), the resin (E) can be synthesized according to an ordinary method (for example, radical polymerization).

The fluorine-containing compound (E) can be used alone or in combination of two or more kinds thereof.

From the viewpoint of resolution, the content of the fluorine-containing compound (E) in the composition of the embodiment of the present invention is preferably 0.01% to 10% by mass, more preferably 0.1% to 10% by mass, and still more preferably 0.1% to 5% by mass with respect to the total solid content of the composition of the embodiment of the present invention.

[Solvent]

The composition of the embodiment of the present invention preferably contains a solvent.

In the composition of the embodiment of the present invention, a known resist solvent can be appropriately used. For example, the known solvents disclosed in paragraphs [0665] to [0670] of the specification of US2016/0070167A1, paragraphs [0210] to [0235] of the specification of US2015/0004544A1, paragraphs [0424] to [0426] of the specification of US2016/0237190A1, and paragraphs [0357] to [0366] of the specification of US2016/0274458A1 can be suitably used.

Examples of the solvent which can be used in the preparation of the composition include organic solvents such as alkylene glycol monoalkyl ether carboxylate, alkylene glycol monoalkyl ether, alkyl lactic acid ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

As the organic solvent, a mixed solvent obtained by mixing a solvent having a hydroxy group in the structure and a solvent having no hydroxy group may be used.

As the solvent having a hydroxy group and the solvent having no hydroxy group, the above-exemplified compounds can be appropriately selected, but as the solvent having a hydroxy group, alkylene glycol monoalkyl ether or alkyl lactate is preferable, and propylene glycol monomethyl ether (PGME), propylene glycol monoethyl ether (PGEE), methyl 2-hydroxyisobutyrate, or ethyl lactate is more preferable. In addition, as the solvent having no hydroxy group, alkylene glycol monoalkyl ether acetate, alkyl alkoxypropionate, a monoketone compound which may have a ring, a cyclic lactone, alkyl acetate, or the like is preferable, and among these, propylene glycol monomethyl ether acetate (PGMEA), ethyl ethoxypropionate, 2-heptanone, γ-butyrolactone, cyclohexanone, cyclopentanone, or butyl acetate is more preferable, and propylene glycol monomethyl ether acetate, γ-butyrolactone, ethyl ethoxypropionate, cyclohexanone, cyclopentanone, or 2-heptanone is still more preferable. As a solvent having no hydroxy group, propylene carbonate is also preferable.

A mixing ratio (mass ratio) of the solvent having a hydroxy group to the solvent having no hydroxy group is 1/99 to 99/1, preferably 10/90 to 90/10, and more preferably 20/80 to 60/40. A mixed solvent containing 50% by mass or more of the solvent having no hydroxy group is preferable from the viewpoint of coating evenness.

The solvent preferably contains propylene glycol monomethyl ether acetate, and may be either a single solvent of propylene glycol monomethyl ether acetate or a mixed solvent of two or more kinds containing propylene glycol monomethyl ether acetate.

[Surfactant]

The composition of the embodiment of the present invention may further include a surfactant. By containing the surfactant, in a case where an exposure light source at a wavelength of 250 nm or less, in particular, 220 nm or less is used, it is possible to form a pattern with good sensitivity and resolution, excellent adhesiveness, and less development defects.

It is particularly preferable to use a fluorine-based and/or silicon-based surfactant as the surfactant.

Examples of the fluorine- and/or silicon-based surfactants include the surfactants described in [0276] of US2008/0248425A. In addition, EFTOP EF301 or EF303 (manufactured by Shin-Akita Chemical Co., Ltd.); FLORAD FC430, 431, or 4430 (manufactured by Sumitomo 3M Inc.); MEGA- FACE F171, F173, F176, F189, F113, F110, F177, F120, or R08 (manufactured by DIC Corporation), SURFLON S-382, SC101, 102, 103, 104, 105, or 106 (manufactured by Asahi Glass Co., Ltd.); TROYSOL S-366 (manufactured by Troy Chemical Corporation); GF-300 or GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); or FTX-204G, 208G, 218G, 230G, 204D, 208D, 212D, 218D, or 222D (manufactured by NEOS COMPANY LIMITED) may be used. In addition, a polysiloxane polymer, KP-341 (manufactured by Shin-Etsu Chemical Co., Ltd.), can also be used as the silicon-based surfactant.

In addition, the surfactant may be synthesized using a fluoroaliphatic compound produced by a telomerization method (also referred to as a telomer method) or an oligomerization method (also referred to as an oligomer method), in addition to the known surfactants as shown above. Specifically, a polymer including a fluoroaliphatic group derived from fluoroaliphatic compound may be used as the surfactant. The fluoroaliphatic compound can be synthesized in accordance with the method described in JP2002-90991A.

In addition, another surfactant other than the fluorine-based and/or silicon-based surfactants, described in [0280] of US2008/0248425A, may also be used.

These surfactants may be used alone or in combination of two or more kinds thereof.

In a case where the composition of the embodiment of the present invention includes a surfactant, a content thereof is preferably 0% to 2% by mass, more preferably 0.0001% to 2% by mass, and still more preferably 0.0005% to 1% by mass with respect to the total solid content of the composition.

[Other Additives]

The composition of the embodiment of the present invention can contain, in addition to the components described above, a carboxylic acid, an onium carboxylate salt, a dissolution inhibiting compound having a molecular weight of 3,000 or less described in Proceeding of SPIE, 2724,355 (1996) and the like, a dye, a plasticizer, a photosensitizer, a light absorber, an antioxidant, and the like as appropriate.

In particular, carboxylic acid can be preferably used for improving the performance. The carboxylic acid is preferably an aromatic carboxylic acid such as benzoic acid or naphthoic acid.

In a case where the composition of the embodiment of the present invention includes a carboxylic acid, the content of the carboxylic acid is preferably 0.01% to 10% by mass, more preferably 0.01% to 5% by mass, and still more preferably 0.01% to 3% by mass with respect to the total solid content of the composition.

The actinic ray-sensitive or radiation-sensitive resin composition of the embodiment of the present invention is used with a film thickness of preferably 10 to 250 nm, more preferably 20 to 200 nm, and still more preferably 30 to 100 nm, from the viewpoint of improving a resolving power. Such a film thickness can be obtained by setting the concentration of solid contents in the composition to an appropriate range to provide the composition with a suitable viscosity and improve the coating property and the film forming property.

The concentration of solid contents of the actinic ray-sensitive or radiation-sensitive resin composition in the embodiment of the present invention is usually 1.0% to 10% by mass, preferably 2.0% to 5.7% by mass, and more preferably 2.0% to 5.3% by mass. By setting the concentration of solid contents within the range, the resist solution can be uniformly applied onto a substrate, and further, it is possible to form a resist pattern having excellent line width roughness.

The concentration of solid contents is a mass percentage of the mass of other components excluding the solvent with respect to the total mass of the actinic ray-sensitive or radiation-sensitive resin composition.

[Use]

The composition of the embodiment of the present invention relates to an actinic ray-sensitive or radiation-sensitive resin composition having properties which change by undergoing a reaction upon irradiation with actinic rays or radiation. More specifically, the composition of the embodiment of the present invention relates to an actinic ray-sensitive or radiation-sensitive resin composition which is used in a step of manufacturing a semiconductor such as an integrated circuit (IC), for the manufacture of a circuit board for a liquid crystal, a thermal head, or the like, the manufacture of a mold structure for imprinting, other photofabrication steps, or production of a planographic printing plate or an acid-curable composition. A pattern formed in the present invention can be used in an etching step, an ion implantation step, a bump electrode forming step, a rewiring forming step, a microelectromechanical system (MEMS), or the like.

[Actinic Ray-Sensitive or Radiation-Sensitive Film]

The present invention also relates to an actinic ray-sensitive or radiation-sensitive film (preferably a resist film) formed with the actinic ray-sensitive or radiation-sensitive composition of the embodiment of the present invention. Such a film is formed, for example, by applying the composition of the embodiment of the present invention onto a support such as a substrate. The thickness of the actinic ray-sensitive or radiation-sensitive film of the present invention is preferably 0.02 to 0.1 μm. As a method for applying the composition on the substrate, a suitable application method such as spin coating, roll coating, flow coating, dip coating, spray coating, and doctor coating is applied on a substrate, but the spin coating is preferable and the rotation speed is preferably 1,000 to 3,000 rotations per minute (rpm). The coating film is prebaked at 60° C. to 150° C. for 1 to 20 minutes, and preferably at 80° C. to 120° C. for 1 to 10 minutes to form a thin film.

For a material constituting a substrate to be processed and an outermost layer thereof, for example, in a case of a semiconductor wafer, a silicon wafer can be used, and examples of the material forming the outermost layer include Si, $SiO_2$, SiN, SiON, and TiN, WSi, BPSG, SOG, and an organic antireflection film.

Before forming the resist film, an antireflection film may be previously coated on the substrate.

As the antireflection film, any of an inorganic film type antireflection film such as titanium, titanium dioxide, titanium nitride, chromium oxide, carbon, and amorphous silicon, and an organic film type antireflection film formed of a light absorber and a polymer material can be used. Furthermore, as the organic antireflection film, a commercially available organic antireflection film such as DUV30 series or DUV-40 series manufactured by Brewer Science Inc., or AR-2, AR-3, or AR-5 manufactured by Shipley Co., Ltd. can be used.

Moreover, in the pattern forming method of the embodiment of the present invention, a topcoat may be formed on the upper layer of the resist film. It is preferable that the topcoat is not mixed with the resist film and can be uniformly applied to the upper layer of the resist film.

The topcoat is not particularly limited, a topcoat known in the related art can be formed by a method known in the related art, and for example, the topcoat can be formed in accordance with the description in paragraphs 0072 to 0082 of JP2014-059543A.

For example, it is preferable that a topcoat containing a basic compound as described in JP2013-61648A is formed on a resist film. Specific examples of the basic compound which can be included in the topcoat include the same ones as those for the above-mentioned acid diffusion inhibitor.

In addition, the topcoat preferably includes a compound which includes at least one group or bond selected from the group consisting of an ether bond, a thioether bond, a hydroxy group, a thiol group, a carbonyl bond, and an ester bond.

Furthermore, the topcoat preferably contains a resin. The resin which can be contained in the topcoat is not particularly limited, but the same resin as the hydrophobic resin which can be included in the actinic ray-sensitive or radiation-sensitive composition can be used.

With regard to the hydrophobic resin, reference can be made to the descriptions in [0017] to [0023] of JP2013-61647A ([0017] to [0023] of the corresponding US2013/244438A), and [0016] to [0165] of JP2014-56194A, the contents of which are incorporated herein by reference.

The topcoat preferably includes a resin containing a repeating unit having an aromatic ring. By containing the repeating unit having an aromatic ring, a secondary electron-generating efficiency and an acid-generating efficiency from a compound that generates an acid with actinic rays or radiation increase, particularly upon irradiation with electron beams or EUV exposure, and thus, an effect of realizing high sensitivity and high resolution in the formation of a pattern can be expected.

In a case where the topcoat includes a plurality of resins, it is preferable that the topcoat includes at least one resin (XA) having a fluorine atom and/or a silicon atom. It is more preferable that the topcoat composition includes at least one resin (XA) having a fluorine atom and/or a silicon atom, and a resin (XB) having a content of a fluorine atom and/or silicon atom which is smaller than that of the resin (XA). As a result, in a case where a topcoat film is formed, the resin (XA) is unevenly distributed on a surface of the topcoat film, and thus, that it is possible to improve performance such as development characteristics and immersion liquid followability.

In addition, the topcoat may contain an acid generator and a crosslinking agent.

The topcoat is typically formed from a composition for forming a topcoat.

For the composition for forming a topcoat, it is preferable that the respective components are dissolved in a solvent and filtered using a filter. The filter is preferably made of polytetrafluoroethylene, polyethylene, or nylon, which has a pore size of 0.1 μm or less, more preferably 0.05 μm or less, and still more preferably 0.03 μm or less. Furthermore, in a case where the concentration of solid contents of the composition is high (for example, 25% by mass or more), the pore size of a filter used for filtration using a filter is preferably 3 μm or less, more preferably 0.5 μm or less, still more preferably 0.3 μm or less. The filter is preferably a polytetrafluoroethylene-made, polyethylene-made, or nylon-made filter. In the filtration using a filter as shown in the specification of JP2002-62667A, circulatory filtration may be performed or the filtration may be performed by connection of a plurality of kinds of filters in series or in parallel. In addition, the composition may be filtered in plural times. Furthermore, the composition may be subjected to a deaeration treatment or the like before or after filtration using a filter.

The composition for forming a topcoat preferably does not include impurities such as a metal. The content of the metal components included in these materials is preferably 10 ppm or less, more preferably 5 ppm or less, and still more preferably 1 ppm or less, and it is particularly preferable that substantially no metal component is included (below a detection limit of the measuring apparatus).

It is also preferable to partially or wholly subjecting the inside of a device used in a producing step (a step for synthesizing a raw material, and the like) of a raw material (a resin, a photoacid generator, and the like) of a resist composition to a glass lining treatment so that a content of metal impurities of the resist composition is adjusted to be small (for example, on the order of ppm by mass). Such a method is described, for example, in The Chemical Daily, Dec. 21, 2017.

In a case where the exposure which will be described later is liquid immersion exposure, the topcoat is arranged between the resist film and the immersion liquid, and also functions as a layer which does not bring the resist film into direct contact with the immersion liquid. In this case, preferred characteristics required for the topcoat (composition for forming a topcoat) are coating suitability onto the resist film, transparency to radiation, particularly to light at 193 nm, and sparing solubility in an immersion liquid (preferably water). Furthermore, it is preferable that the topcoat is not mixed with the resist film and can be uniformly applied onto a surface of the resist film.

Moreover, in order to uniformly apply the composition for forming a topcoat onto a surface of the resist film while not dissolving the resist film, it is preferable that the composition for forming a topcoat contains a solvent in which the resist film is not dissolved. It is more preferable to use a solvent of a component different from a developer (organic developer) containing an organic solvent which will be described in detail later as the solvent in which the resist film is not dissolved.

A method for applying the composition for forming a topcoat is not particularly limited, and a spin coating method, a spray method, a roller coating method, a dip method, or the like which is known in the related art can be used.

The thickness of the topcoat is not particularly limited, but is usually 5 nm to 300 nm, preferably 10 nm to 300 nm, more preferably 20 nm to 200 nm, and still more preferably 30 nm to 100 nm, from the viewpoint of transparency to an exposure light source.

After forming the topcoat, the substrate is post-baked (PB) as necessary.

From the viewpoint of resolution, it is preferable that the refractive index of the topcoat is close to that of the resist film.

The topcoat is preferably insoluble in an immersion liquid, and more preferably insoluble in water.

With regard to the receding contact angle of the topcoat, the receding contact angle (23° C.) of the immersion liquid with respect to the topcoat is preferably 50 to 100 degrees, and more preferably 80 to 100 degrees, from the viewpoint of immersion liquid followability.

In the liquid immersion exposure, from the viewpoint that the immersion liquid needs to move on a wafer following the movement of an exposure head that is scanning the wafer at a high speed and forming an exposure pattern, the contact angle of the immersion liquid with respect to the topcoat in a dynamic state is important, and in order to obtain better resist performance, it is preferable that the immersion liquid has a receding contact angle in the range.

During the release of the topcoat, an organic developer may be used, and another release agent may be separately used. As the release agent, a solvent hardly permeating the resist film is preferable. From the viewpoint that the release of the topcoat can be carried out at the same time as the development of the resist film, the topcoat is preferably releasable by an organic developer. The organic developer used for the release is not particularly limited as long as it makes it possible to dissolve and remove a less exposed area of the resist film.

From the viewpoint of the release with the organic developer, the dissolution rate of the topcoat in the organic developer is preferably 1 to 300 nm/sec, and more preferably 10 to 100 nm/sec.

Here, the dissolution rate of the topcoat in the organic developer is a film thickness decreasing rate in a case where the topcoat is exposed to a developer after film formation, and in the present invention, it is a rate in a case where the topcoat is dipped in butyl acetate at 23° C.

An effect of reducing development defects after developing a resist film is accomplished by adjusting the dissolution rate of a topcoat in an organic developer to 1 nm/sec or more, and preferably 10 nm/sec or more. In addition, by setting the dissolution rate to 300 nm/sec or less, and preferably 100 nm/sec, an effect that the line edge roughness of a pattern after the development of the resist film is improved is accomplished, possibly due to an effect of reducing the exposure unevenness during the liquid immersion exposure.

The topcoat may be removed using another known developer, for example, an aqueous alkali solution. Specific examples of the usable aqueous alkali solution include an aqueous tetramethylammonium hydroxide solution.

[Pattern Forming Method]

The present invention also relates to a pattern forming method including a resist film forming step of forming a resist film using the actinic ray-sensitive or radiation-sensitive resin composition of the embodiment of the present invention, an exposing step of exposing the resist film, and a developing step of developing the exposed resist film, using a developer.

In the present invention, the exposure is preferably carried out using electron beams, an ArF excimer laser, or extreme ultraviolet rays, and more preferably electron beams or extreme ultraviolet rays.

For exposure (pattern forming step) on a resist film in the production of a precision integrated circuit element, first, irradiation with an ArF excimer laser, electron beams, or extreme ultraviolet rays (EUV) is preferably performed patternwise on the resist film of the present invention. In a case of the ArF excimer laser, the exposure dose is approximately 1 to 100 $mJ/cm^2$, preferably approximately 20 to 60 $mJ/cm^2$; in a case of the electron beams, the exposure dose is approximately 0.1 to 20 $\mu C/cm^2$, and preferably approximately 3 to 10 $\mu C/cm^2$; and in a case of the extreme ultraviolet rays, the exposure dose is approximately 0.1 to 20 $mJ/cm^2$, and preferably approximately 3 to 15 $mJ/cm^2$.

Subsequently, post-exposure baking is performed on a hot plate, preferably at 60° C. to 150° C. for 5 seconds to 20 minutes, more preferably at 80° C. to 120° C. for 15 seconds to 10 minutes, and still more preferably at 80° C. to 120° C. for 1 to 10 minutes, and then development, rinsing, and drying are performed to form a pattern. Here, the post-exposure baking is appropriately adjusted depending on the acid decomposability of the repeating unit having an acid-decomposable group in the resin (A). In a case where the acid decomposability is low, it is also preferable that the temperature for post-exposure baking is 110° C. or higher and the heating time is 45 seconds or longer.

The developer is appropriately selected, but an alkali developer (typically an aqueous alkali solution) or a developer containing an organic solvent (also referred to as an organic developer) is preferably used. In a case where the developer is an aqueous alkali solution, development is performed with an aqueous alkali solution of tetramethylammonium hydroxide (TMAH), tetrabutylammonium hydroxide (TBAH), or the like at 0.1% to 5% by mass, and preferably 2% to 3% by mass for 0.1 to 3 minutes, and preferably 0.5 to 2 minutes by an ordinary method such as a dip method, a puddle method, a spray method, or the like. An appropriate amount of an alcohol and/or a surfactant may be added to the alkali developer. Thus, in the formation of a negative tone pattern, the film in the unexposed area is dissolved and the exposed area is hardly dissolved in the developer; and in the formation of a positive tone pattern, the film in the exposed area is dissolved and the film in the unexposed area is hardly dissolved in the developer, so that a desired pattern is formed on the substrate.

Electron beam exposure can be roughly classified into a direct writing method and a mask projection method. Initially, the electron beam exposure method was a point beam method, but in order to enhance the exposure efficiency, the method has been evolved into a variable shaped beam (VSB) method and a partial batch (cell projection) method, and further, as an extension thereof, the method has advanced into a mask projection method which has all patterns in a similar manner as light exposure.

On the other hand, there is a multi-beam method (hereinafter also referred to as an "electron beam multi-beam exposure") which improves an efficiency by irradiation with a plurality of electron beams at the same time (see, for example, Elmar Platzgummer, Stefan Cernusca, Christof Klein, Jan Klikovits, Samuel Kvasnica, Hans Loeschner, "eMET-50 keV electron Mask Exposure Tool Development based on proven multi-beam projection technology", Proc. SPIE Vol. 7823, 782308 (2010); and Christof Klein, Hans Loeschner, Elmar Platzgummer, "Performance of the Proof-of-Concept Multi-Beam Mask Writer", Pro. SPIE Vol. 8880, 88801E (2013)).

The exposure can be performed by irradiating the actinic ray-sensitive or radiation-sensitive film with a plurality of electron beams at the same time. The exposure can be performed using a multi-beam mask writer (MBMW). According to the multi-beam mask writer, it is possible to write (expose) a plurality of places at once, which can thus improve a throughput.

In a case where the pattern forming method of the embodiment of the present invention has a step of performing development using an alkali developer, as the alkali developer, for example, an aqueous alkali solution of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, tetraalkylammonium hydroxides such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide, quaternary ammonium salts such as trimethylphenylammonium hydroxide, trimethylbenzylammonium hydroxide, triethylbenzylammonium hydroxide, and dimethylbis(2-hydroxytethyl)ammonium hydroxide, or cyclic amines such as pyrrole and piperidine can be used.

Furthermore, the aqueous alkali solution can be used after adding an appropriate amount of alcohols or a surfactant thereto.

The alkali concentration of the alkali developer is usually 0.1% to 20% by mass.

The pH of the alkali developer is usually 10.0 to 15.0.

In particular, a 2.38%-by-mass aqueous tetramethylammonium hydroxide solution is desirable.

Pure water may be used as the rinsing liquid in the rinse treatment performed after the alkali development, and an appropriate amount of a surfactant may be added to the pure water.

In addition, after the developing treatment or the rinsing treatment, a treatment of removing the developer or the rinsing liquid adhering to a pattern with a supercritical fluid can be performed.

In a case where the pattern forming method of the embodiment of the present invention has a step of performing development using a developer containing an organic solvent, as the developer in the step (hereinafter also referred to as an organic developer), a polar solvent such as a ketone-based solvent, an ester-based solvent, an alcohol-based solvent, an amide-based solvent, and an ether-based solvent, or a hydrocarbon-based solvent can be used.

In the present invention, the ester-based solvent is a solvent having an ester group in the molecule, the ketone-based solvent is a solvent having a ketone group in the molecule, the alcohol-based solvent is a solvent having an alcoholic hydroxy group in the molecule, the amide-based solvent is a solvent having an amide group in the molecule, and the ether-based solvent is a solvent having an ether bond in the molecule. Among those, a solvent having a plurality of the functional groups in one molecule is also present, but in this case, it is applicable to any of solvent species including the functional group contained in the solvent. For example, diethylene glycol monomethyl ether is applicable to any of the alcohol-based solvent and the ether-based solvent in the classification. In addition, the hydrocarbon-based solvent is a hydrocarbon solvent having no substituent.

In particular, a developer containing at least one solvent selected from the ketone-based solvent, the ester-based solvent, the alcohol-based solvent, or the ether-based solvent is preferable.

It is preferable to use an ester-based solvent having 7 or more carbon atoms (preferably 7 to 14 carbon atoms, more preferably 7 to 12 carbon atoms, and still more preferably 7 to 10 carbon atoms), and 2 or less heteroatoms as the developer from the viewpoint that the swelling of the resist film can be suppressed.

The heteroatom of the ester-based solvent is an atom other than a carbon atom and a hydrogen atom, and examples thereof include an oxygen atom, a nitrogen atom, and a sulfur atom. The number of the heteroatoms is preferably 2 or less.

Preferred examples of the ester-based solvents having 7 or more carbon atoms and 2 or less heteroatoms include amyl acetate, isoamyl acetate, 2-methylbutyl acetate, 1-methylbutyl acetate, hexyl acetate, pentyl propionate, hexyl propionate, heptyl propionate, butyl butanoate, and isobutyl isobutanoate, and isoamyl acetate or isobutyl isobutanoate is particularly preferably used.

As the developer, a mixed solvent of the ester-based solvent and the hydrocarbon-based solvent or a mixed solvent of the ketone-based solvent and the hydrocarbon solvent may be used instead of the ester-based solvent having 7 or more carbon atoms and having 2 or less heteroatoms as mentioned above. Also in this case, it is effective in suppressing the swelling of the resist film.

In a case where the ester-based solvent and the hydrocarbon-based solvent are used in combination, it is preferable to use isoamyl acetate as the ester-based solvent. In addition, from the viewpoint of adjusting the solubility of the resist film, a saturated hydrocarbon solvent (for example, octane, nonane, decane, dodecane, undecane, and hexadecane) is preferably used as the hydrocarbon-based solvent.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, 2,5-dimethyl-4-hexanone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate, and diisobutyl ketone and 2,5-dimethyl-4-hexanone are particularly preferably used.

Examples of the ester-based solvent include methyl acetate, butyl acetate, ethyl acetate, isopropyl acetate, isoamyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butyrate, and methyl 2-hydroxyisobutyrate.

Examples of the alcohol-based solvent include alcohols such as methyl alcohol, ethyl alcohol, n-propyl alcohol, isopropyl alcohol, n-butyl alcohol, sec-butyl alcohol, 4-methyl-2-pentanol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include anisole, dioxane, and tetrahydrofuran, in addition to the glycol ether-based solvents.

As the amide-based solvent, for example, N-methyl-2-pyrrolidone, N,N-dimethylacetamide, N,N-dimethylformamide, hexamethylphosphoric triamide, 1,3-dimethyl-2-imidazolidinone, or the like can be used.

Examples of the hydrocarbon-based solvent include aromatic hydrocarbon-based solvents such as toluene and xylene, and aliphatic hydrocarbon-based solvents such as pentane, hexane, octane, decane, and undecane.

In addition, the aliphatic hydrocarbon-based solvent which is a hydrocarbon-based solvent may be a mixture of compounds having the same number of carbon atoms but different structures. For example, in a case where decane is used as the aliphatic hydrocarbon-based solvent, 2-methylnonane, 2,2-dimethyloctane, 4-ethyloctane, isooctane, or the like which is a compound having the same number of carbon atoms and different structures, may be included in the aliphatic hydrocarbon-based solvent.

In addition, only one kind or a plurality of kinds of the compounds as described above having the same number of carbon atoms and different structures may be included.

A plurality of the solvents may be mixed or the solvent may be used in admixture with a solvent other than those described above or water. It should be noted that in order to fully exert the effects of the present invention, the moisture content of the developer as a whole is preferably less than 10% by mass, and the developer is more preferably substantially free of the moisture.

The concentration of the organic solvent (in a case of mixing a plurality of the organic solvents, a total thereof) in the organic developer is preferably 50% by mass or more, more preferably 50% to 100% by mass, still more preferably 85% to 100% by mass, even still more preferably 90% to 100% by mass, and particularly preferably 95% to 100% by mass. Most preferably, the organic solvent consists substantially only of an organic solvent. In addition, a case of consisting substantially only of an organic solvent includes a case of containing a trace amount of a surfactant, an antioxidant, a stabilizer, an antifoaming agent, or the like.

In particular, the organic developer is preferably a developer containing at least one organic solvent selected from the group consisting of a ketone-based solvent, an ester-based solvent, an alcohol-based solvent, an amide-based solvent, and an ether-based solvent.

The vapor pressure of the organic developer at 20° C. is preferably 5 kPa or less, more preferably 3 kPa or less, and particularly preferably 2 kPa or less. By setting the vapor pressure of the organic developer to 5 kPa or less, evaporation of the developer on the substrate or in the development cup is suppressed, the temperature uniformity in a wafer plane is improved, and as a result, the dimensional uniformity in the wafer plane is improved.

Specific examples of the organic developer having a vapor pressure of 5 kPa or less include ketone-based solvents such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone, and methyl isobutyl ketone, ester-based solvents such as butyl acetate, pentyl acetate, isoamyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate, and propyl lactate, alcohol-based solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol, ether-based solvents such as tetrahydrofuran, amide-based solvents such as N-methyl-2-pyrrolidone, N,N-dimethylacetamide, and N,N-dimethylformamide, aromatic hydrocarbon-based solvents such as toluene and xylene, and aliphatic hydrocarbon-based solvents such as octane and decane.

Specific examples of the organic developer having a vapor pressure of 2 kPa or less, which is a particularly preferable range, include ketone-based solvents such as 1-octanone, 2-octanone, 1-nonanone, 2-nonanone, 2-heptanone, 4-heptanone, 2-hexanone, diisobutyl ketone, cyclohexanone, methylcyclohexanone, and phenylacetone, ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate, and propyl lactate, alcohol-based solvents such as n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol, amide-based solvents such as N-methyl-2-pyrrolidone, N,N-dimethylacetamide, and N,N-dimethylformamide, aromatic hydrocarbon-based solvents such as xylene, and aliphatic hydrocarbon-based solvents such as octane, decane, and undecane.

The organic developer may include a basic compound. Specific examples and preferred examples of the basic compound which can be included in the developer used in the present invention are the same ones as those in the basic compound which can be included in the above-described actinic ray-sensitive or radiation-sensitive composition.

An appropriate amount of a surfactant can be added to the organic developer, as necessary.

The surfactant is not particularly limited, but, for example, an ionic or nonionic fluorine-based and/or silicon-based surfactant or the like can be used. Examples of such the fluorine- and/or silicon-based surfactant include the surfactants described in, for example, JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. Nos. 5,405,720A, 5,360,692A, 5,529,881A, 5,296,330A, 5,436,098A, 5,576,143A, 5,294,511A, and 5,824,451A, and nonionic surfactants are preferable. The nonionic surfactant is not particularly limited, but it is more preferable to use a fluorine-based surfactant or a silicon-based surfactant.

The amount of the surfactant to be used is preferably 0.0001% to 2% by mass, more preferably 0.0001% to 1% by mass, and particularly preferably 0.0001% to 0.1% by mass with respect to the total amount of the developer.

As the developing method, for example, a method in which a substrate is dipped in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), a method in which a developer is continuously jetted onto a substrate rotating at a constant speed while scanning a developer jetting nozzle at a constant speed (a dynamic dispense method), or the like can be applied.

In a case where the various developing methods include a step of jetting a developer from developing nozzles of a developing device toward the resist film, the jetting pressure of the developer to be jetted (flow rate per unit area of the developer to be jetted) is preferably 2 mL/sec/$mm^2$ or less, more preferably 1.5 mL/sec/$mm^2$ or less, and still more preferably 1 mL/sec/$mm^2$ or less. There is no particular lower limit to the flow rate, but the lower limit is preferably 0.2 mL/sec/$mm^2$ or more in consideration of a throughput.

By setting the jetting pressure of the developer to be jetted within the range, it is possible to significantly reduce the pattern defects derived from resist residues after development.

Although the details of this mechanism are not clear, it is considered that by setting the jetting pressure to be in the range, the pressure applied to the resist film by the developer is likely to be reduced and the resist film/pattern is prevented from being scraped or broken carelessly.

In addition, the jetting pressure (mL/sec/$mm^2$) of the developer is a value at the outlet of the developing nozzle in the developing device.

Examples of the method of adjusting the jetting pressure of the developer include a method of adjusting a jetting pressure with a pump or the like, and a method of changing a pressure by adjusting the pressure with a supply from a pressure tank.

Furthermore, after a step of performing development using a developer including an organic solvent, a step of stopping the development may be carried out while substituting the solvent with another solvent.

A step of performing washing using a rinsing liquid may be included after the step of performing development using a developer including an organic solvent, but from the viewpoint of a throughput (productivity), an amount of the rinsing liquid to be used, and the like, a step of performing washing using a rinsing liquid may not be included.

The rinsing liquid used in the rinsing step after the developing step using a developer including an organic solvent is not particularly limited as long as the rinsing liquid does not dissolve the resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same ones as those described for the developer including an organic solvent, and in particular, suitable examples thereof include butyl acetate and methyl isobutyl carbinol.

It is preferable to perform a step of performing washing, more preferably using a rinsing liquid containing at least one organic solvent selected from the group consisting of an ester-based solvent, an alcohol-based solvent, and a hydrocarbon-based solvent, and still more preferably using a rinsing liquid containing the alcohol-based solvent or the hydrocarbon-based solvent, after the step of performing development using a developer including an organic solvent.

Among the organic solvents, the hydrocarbon-based solvent is also preferably used, and the aliphatic hydrocarbon-based solvent is more preferably used, as the organic solvent included in the rinsing liquid. As the aliphatic hydrocarbon-based solvent used in the rinsing liquid, from the viewpoint of further improving the effects, an aliphatic hydrocarbon-based solvent having 5 or more carbon atoms (for example, pentane, hexane, octane, decane, undecane, dodecane, and hexadecane) is preferable, an aliphatic hydrocarbon-based solvent having 8 or more carbon atoms is more preferable, and an aliphatic hydrocarbon-based solvent having 10 or more carbon atoms is still more preferable.

Incidentally, the upper limit value of the number of carbon atoms in the aliphatic hydrocarbon-based solvent is not particularly limited, and for example, is 16 or less, preferably 14 or less, and more preferably 12 or less.

Among the aliphatic hydrocarbon-based solvents, decane, undecane, or dodecane is particularly preferable, and undecane is the most preferable.

By using the hydrocarbon-based solvent (in particular, the aliphatic hydrocarbon-based solvent) as the organic solvent included in the rinsing liquid as described above, the developer permeating into the resist film slightly after development is washed away, the swelling is further suppressed, and thus, an effect of suppressing pattern collapse is further exhibited.

The respective components in a plural number may be mixed or the components may also be used in admixture with an organic solvent other than the solvents.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure at 20° C. of the rinsing liquid which is used after the step of performing development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to be from 0.05 kPa to 5 kPa, the temperature uniformity in a wafer plane is improved, and further, the dimensional uniformity in a wafer plane is enhanced by suppression of swelling due to the permeation of the rinsing liquid.

The rinsing liquid can be used after an appropriate amount of a surfactant is added thereto.

In the rinsing step, a wafer which has been developed using a developer including an organic solvent is subjected to a washing treatment using a rinsing liquid including an organic solvent. A method for the washing treatment is not particularly limited, for example, a method in which a rinsing liquid is continuously jetted on a substrate rotating at a constant speed (a rotation application method), a method in which a substrate is dipped in a tank filled with a rinsing liquid for a certain period of time (a dip method), a method in which a rinsing liquid is sprayed on a substrate surface (a spray method), or the like, and among these, a method in which a washing treatment is performed using the rotation application method, and a substrate is rotated at a rotation speed of 2,000 rpm to 4,000 rpm after washing, thereby removing the rinsing liquid from the substrate, is preferable. Furthermore, it is also preferable that a heating step (post-baking) is included after the rinsing step. The developer and the rinsing liquid remaining between and inside the patterns are removed by the baking. The heating step after the rinsing step is performed, usually at 40° C. to 160° C., and preferably 70° C. to 95° C., usually for 10 seconds to 3 minutes, and preferably for 30 seconds to 90 seconds.

In a case where there is no step of performing washing with a rinsing liquid, for example, the developing treatment method described in paragraphs [0014] to [0086] of JP2015-216403A can be adopted.

Moreover, the pattern forming method of the embodiment of the present invention may include a developing step using an organic developer and a developing step using an alkali developer. A portion having a low exposure intensity is removed by development using an organic developer, and a portion having a high exposure intensity is removed by performing development using an alkali developer. By virtue of multiple development processes in which development is performed in a plurality of times in such a manner, a pattern can be formed by keeping only a region with an intermediate exposure intensity from not being dissolved, so that a finer pattern than usual can be formed (the same mechanism as in paragraph [0077] of JP2008-292975A).

It is preferable that various materials (for example, a resist solvent, a developer, a rinsing liquid, a composition for forming an antireflection film, and a composition for forming a topcoat) used in the actinic ray-sensitive or radiation-sensitive composition in the embodiment of the present invention, and the pattern forming method of the embodiment of the present invention include no impurities such as metals, metal salts including halogen, acids, alkalis, and components including a sulfur atom or a phosphorus atom. Here, examples of the impurities including a metal atom include Na, K, Ca, Fe, Cu, Mn, Mg, Al, Cr, Ni, Zn, Ag, Sn, Pb, Li, and salts thereof.

The content of the impurities included in these materials is preferably 1 ppm or less, more preferably 1 ppb or less, still more preferably 100 parts per trillion (ppt) or less, and particularly preferably 10 ppt or less, and it is the most preferable that substantially no metal component is included (below a detection limit of the measuring apparatus).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a filter made of polytetrafluoroethylene, polyethylene, nylon, or the like is preferable. The filter may be a composite material in which these materials are combined with an ion exchange medium. As the filter, a filter which has been washed with an organic solvent in advance may be used. In the step of filtration using a filter, plural kinds of filters connected in series or in parallel may be used. In a case of using a plurality of kinds of filters, a combination of filters having different pore diameters and/or materials may be used. In addition, various materials may be filtered plural times, and the step of filtering plural times may be a circulatory filtration step.

Moreover, examples of a method for reducing the impurities such as metals included in various materials include a method in which a raw material having a low metal content is selected as a raw material constituting various materials and the raw material constituting the various materials is subjected to filtration using a filter; and a method in which distillation under conditions suppressing contamination as much as possible by performing a lining with TEFLON (registered trademark), or the like in the inside of a device is performed. Preferred conditions for the filtration using a filter performed on the raw materials constituting various materials are the same ones as the above-mentioned conditions.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used.

In addition, as a method for reducing the impurities such as metals included in the organic treatment liquid of the present invention, a method in which a raw material having a low metal content is selected as a raw material constituting various materials, the raw material constituting the various materials is subjected to filtration using a filter; distillation under conditions suppressing contamination as much as possible by performing a lining with TEFLON (registered trademark) in the inside of a device; or the like. Preferred conditions for the filtration using a filter performed on the raw materials constituting various materials are the same ones as the above-mentioned conditions.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used.

[Storage Container]

As an organic solvent (also referred to as an "organic treatment liquid") which can be used for a developer and a rinsing liquid, it is preferable to use one stored in a storage container for storing an organic treatment liquid for patterning a chemically amplified or non-chemically amplified resist film, in which the container has a storage part. The storage container is preferably, for example, a storage container for storing an organic treatment liquid for patterning a resist film, in which the inner wall of the storage part being in contact with the organic treatment liquid is formed from a resin different from any of a polyethylene resin, a polypropylene resin, and a polyethylene-polypropylene resin, or of a metal subjected to a rust prevention/metal elution prevention treatment. An organic solvent to be used as an organic treatment liquid for patterning a resist film is stored in the storage part of the storage container, and the organic solvent jetted from the storage part can be used at the time of patterning the resist film.

In a case where the storage container further has a sealing part for sealing the storage part, the sealing part is also preferably formed of a resin different from one or more resins selected from the group consisting of a polyethylene resin, a polypropylene resin, and a polyethylene-polypropylene resin, or of a metal which has been subjected to a rust prevention/metal elution prevention treatment.

Here, the sealing part refers to a member capable of shielding the storage part from the outside air, and suitable examples thereof include a packing and an O ring.

The resin different from one or more resins selected from the group consisting of a polyethylene resin, a polypropylene resin, and a polyethylene-polypropylene resin is preferably a perfluoro resin.

Examples of the perfluoro resin include a tetrafluoroethylene resin (PTFE), a tetrafluoroethylene-perfluoroalkyl vinyl ether copolymer (PFA), a tetrafluoroethylene-hexafluoropropylene copolymerized resin (FEP), a tetrafluoroethylene-ethylene copolymerized resin (ETFE), a trifluoroethylene chloride-ethylene copolymerized resin (ECTFE), a polyvinylidene fluoride resin (PVDF), a trifluoroethylene chloride copolymerized resin (PCTFE), and a polyvinyl fluoride resin (PVF).

Particularly preferred examples of the perfluoro resin include a tetrafluoroethylene resin, a tetrafluoroethylene-perfluoroalkyl vinyl ether copolymer, and a tetrafluoroethylene-hexafluoropropylene copolymerized resin.

Examples of the metal in the metal which has been subjected to a rust prevention/metal elution prevention treatment include carbon steel, alloy steel, nickel chromium steel, nickel chromium molybdenum steel, chromium steel, chromium molybdenum steel, and manganese steel.

As the rust prevention/metal elution prevention treatment, a coating technique is preferably applied.

The coating technique is roughly divided into three types of metal coating (various plating), inorganic coating (various chemical conversion treatments, glass, concrete, ceramics, and the like), and organic coating (a rust preventive oil, a paint, rubber, and plastics).

Preferred examples of the coating technique include a rust preventive oil, a rust inhibitor, a corrosion inhibitor, a chelate compound, a strippable plastic, and a surface treatment with a lining agent.

Among those, corrosion inhibitors, such as various chromates, nitrites, silicates, phosphates, oleic acid, dimer acid, carboxylic acids such as naphthenic acid, carboxylic acid metal soaps, sulfonates, amine salts, and esters (glycerol esters of higher fatty acids and phosphoric acid esters), chelate compounds such as ethylenediaminetetraacetic acid, gluconic acid, nitrilotriacetic acid, hydroxyethylethylenediaminetriacetic acid, and diethylenetriaminepentaacetic acid, and a fluorine resin lining are preferable. A phosphate treatment and the fluorine resin lining are particularly preferable.

Although it does not directly prevent rust as compared with a direct coating treatment, it is also preferable to adopt a "pretreatment" which is a step prior to a rust prevention treatment, as a treatment method leading to prolongation of the rust prevention period by a coating treatment.

As a specific example of such a pretreatment, a treatment for removing a variety of corrosive factors such as chlorides and sulfates present on the metal surface by washing or polishing can be suitably mentioned.

Specific examples of the storage container include the following ones.

FluoroPurePFA composite drum manufactured by Entegris Inc. (wetted inner surface; PFA resin lining)

Steel drum manufactured by FE Corporation (wetted inner surface; zinc phosphate-coated film)

Furthermore, examples of the storage container which can be used in the present invention include the containers described in paragraphs [0013] to [0030] of JP1999-021393A (JP-H11-021393A) and paragraphs [0012] to [0024] of JP1998-45961A (JP-H10-45961A).

In order to prevent breakdown of a chemical liquid pipe and various parts (a filter, an O-ring, a tube, and the like) due to electrostatic charging and subsequent electrostatic discharging, a conductive compound may be added to the organic treatment liquid of the present invention. The conductive compound is not particularly limited, but examples thereof include methanol. The addition amount of the conductive compound is not particularly limited, but is preferably 10% by mass or less, and more preferably 5% by mass or less from the viewpoint of maintaining preferable development characteristics. With regard to the members of the chemical liquid pipe, it is possible to use various pipes coated with stainless steel (SUS), or a polyethylene resin, a polypropylene resin, or a fluorine resin (a polytetrafluoroethylene resin, a perfluoroalkoxy resin, or the like), which has been subjected to an antistatic treatment. Similarly, a polyethylene resin, a polypropylene resin, or a fluorine resin (a polytetrafluoroethylene resin, a perfluoroalkoxy resin, or the like), which has been subjected to an antistatic treatment, can be used for a filter and an O-ring.

Moreover, generally, the developer and the rinsing liquid are stored in a waste liquid tank through a pipe after use. At that time, in a case where a hydrocarbon-based solvent is used as the rinsing liquid, there is a method of passing a solvent in which a resist is dissolved through a pipe again in order to prevent the resist dissolved in the developer from being precipitated and adhering to the back surface of the wafer, the side surface of the pipe or the like. Examples of the method of passing the solvent through the pipe include a method in which the back surface, the side surface, and the like of a substrate are washed with a solvent in which a resist is dissolved and then the solvent is allowed to flow after performing washing with a rinsing liquid, and a method of flowing a solvent in which a resist is dissolved so as to pass through a pipe while being not in contact with the resist.

The solvent to be passed through the pipe is not particularly limited as long as it can dissolve the resist, examples thereof include the above-mentioned organic solvents, and propylene glycol monomethyl ether acetate (PGMEA), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate, propylene glycol monomethyl ether (PGME), propylene glycol monoethyl ether, propylene glycol monopropyl ether, propylene glycol monobutyl ether, ethylene glycol monomethyl ether, ethylene glycol monoethyl ether, 2-heptanone, ethyl lactate, 1-propanol, acetone, or the like can be used. Among those, PGMEA, PGME, or cyclohexanone can be preferably used.

[Method for Manufacturing Electronic Device]

In addition, the present invention further relates to a method for manufacturing an electronic device, including the above-described pattern forming method. The electronic device manufactured by the method for manufacturing an electronic device of an embodiment of the present invention is suitably mounted on electric or electronic equipment (for example, home electronics, office automation (OA)-related equipment, media-related equipment, optical equipment, and telecommunication equipment).

EXAMPLES

Hereinbelow, the present invention will be described in more detail with reference to Examples. The materials, the amounts of materials used, the proportions, the treatment details, the treatment procedure, and the like shown in Examples below may be appropriately modified as long as the modifications do not depart from the spirit of the present invention. Therefore, the scope of the present invention should not be construed as being limited to Examples shown below.

<Resin (A)>

Synthesis Example 1: Synthesis of Resin (A-3)

(Synthesis of Chloroether Compound)

25.0 g of 1-adamantane carbaldehyde, 24.2 g of trimethyl orthoformate, 353 mg of camphorsulfonic acid, and 125 mL of hexane were added into a 500 mL eggplant-shaped flask, and stirred at 25° C. for 1 hour. 1.5 g of triethylamine was added thereto, the mixture was stirred, and the organic phase was washed 3 times with 200 mL of distilled water. Hexane was removed therefrom under reduced pressure conditions to obtain 33.0 g of a compound 1 shown below as an acetal compound.

Next, 28.6 g of acetyl chloride (AcCl) was added to 31.8 g of the obtained compound 1 and the mixture was stirred in a water bath at 40° C. for 5 hours. After returning to 25° C., unreacted acetyl chloride was removed therefrom under reduced pressure conditions to obtain 36.2 g of a compound 2 shown below as a chloroether compound.

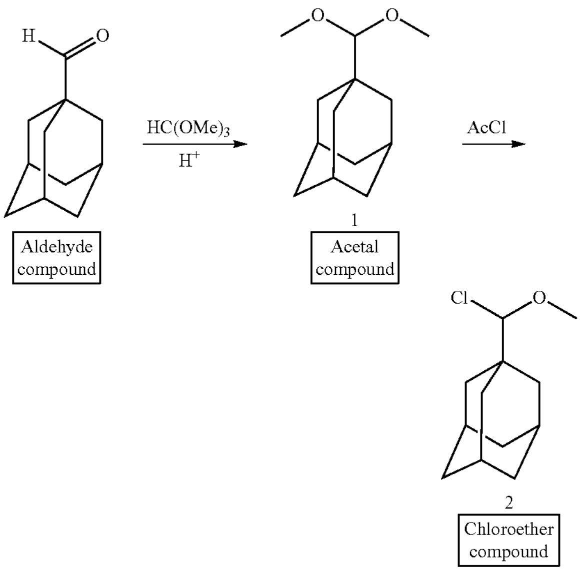

(Synthesis of Resin (A-3))

18.0 g of poly(p-hydroxystyrene) (VP-2500, manufactured by Nippon Soda Corporation) was dissolved in 120 g of tetrahydrofuran (THF), 3.46 g of triethylamine was added thereto, and the mixture was stirred in an ice water bath. The compound 2 (6.12 g) obtained above was added dropwise to the reaction solution and the mixture was stirred for 4 hours. In a case where a small amount of the reaction solution was collected and subjected to $^1$H-NMR measurement, the protection rate was 18.2%. Thereafter, a small amount of the compound 2 was added thereto, the mixture was stirred for 4 hours and repeatedly subjected to an operation for measuring $^1$H-NMR, and distilled water was added thereto to stop the reaction at the time of the protection rate exceeding a target value of 20.0%. THF was evaporated under reduced pressure to dissolve the reaction product in ethyl acetate. The obtained organic phase was washed 5 times with distilled water and then the organic phase was added dropwise to 1.5 L of hexane. The obtained precipitate was separated by filtration and washed with a small amount of hexane. 10 g of the obtained powder was dissolved in 20 g of propylene glycol monomethyl ether acetate (PGMEA), and 300 g of ethyl acetate was added thereto. The solution was transferred to a separating funnel and 300 g of an acidic aqueous solution was added thereto to wash the mixture. This washing operation was repeated 3 times, and then washing with 300 g of distilled water was performed 4 times. At this time, a 0.1 mol/L hydrochloric acid aqueous solution or a 0.5 mol/L oxalic acid aqueous solution was used as the acidic aqueous solution. The solvent was evaporated under reduced pressure and the residue was dissolved in 30 g of PGMEA. The low-boiling-point solvent was removed from the obtained solution with an evaporator to obtain 26.3 g of a PGMEA solution (30.1% by mass) of the resin (A-3).

For the obtained resin (A-3), a content of the repeating unit was measured by $^{13}$C-nuclear magnetic resonance (NMR) or $^1$H-NMR. In addition, the weight-average molecular weights (Mw) and the dispersities (Mw/Mn) of the resins were measured by means of GPC (carrier: tetrahydrofuran (THF)) (an amount in terms of polystyrene).

The other resin (A) used was also synthesized by performing the same operation as that of the resin (A-3).

The structures of the repeating units and contents (molar ratios) thereof, the weight-average molecular weights (Mw), and the dispersities (Mw/Mn) of the resin (A) used are shown below. Furthermore, the contents (molar ratios) of the repeating units are described on the right side or the left side of ( ).

(A-1)

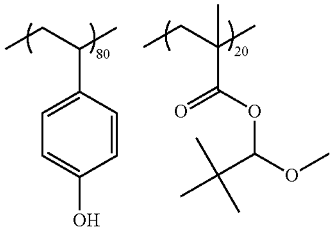

Mw = 8800
Mw/Mn = 1.6

-continued
(A-2)
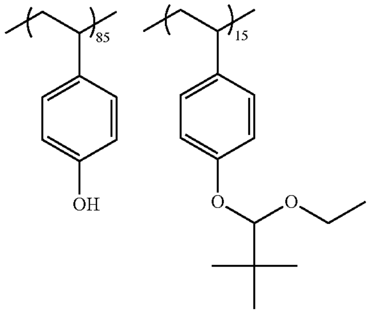
Mw = 4600
Mw/Mn = 1.2
(A-3)
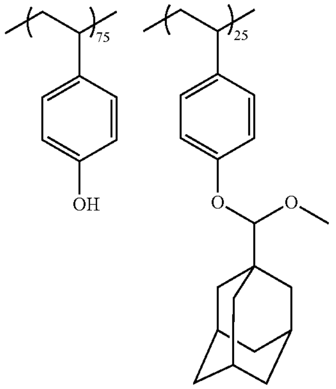
Mw = 5000
Mw/Mn = 1.4
(A-4)
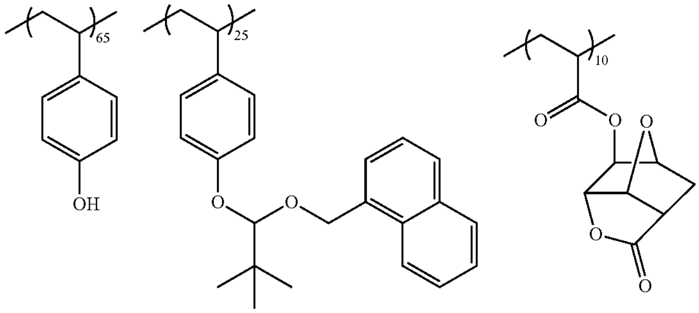
Mw = 9000
Mw/Mn = 1.6

-continued
(A-5)
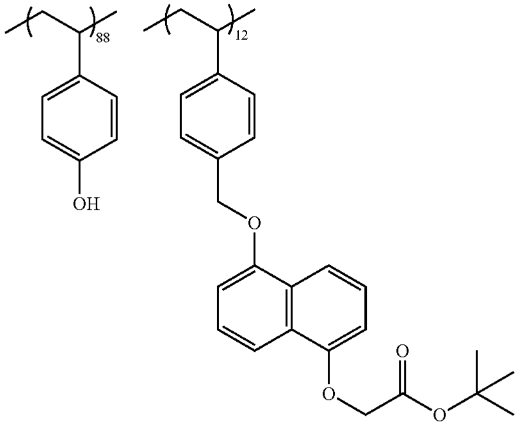
Mw = 7000
Mw/Mn = 1.4
(A-6)
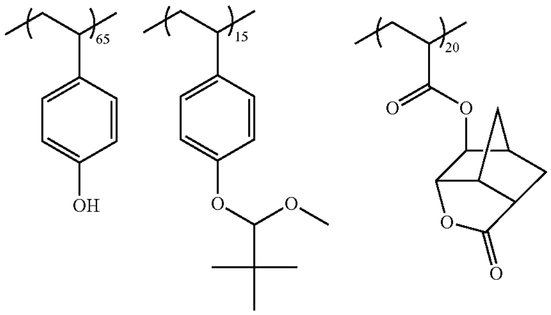
Mw = 6000
Mw/Mn = 1.6
(A-7)
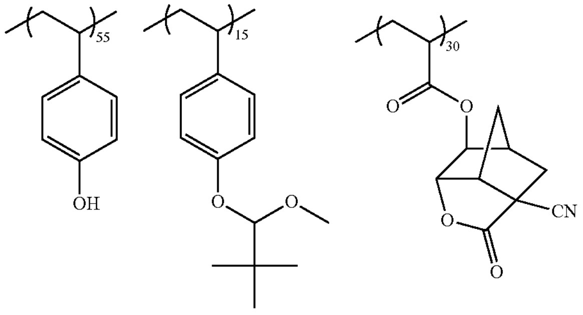
Mw = 12000
Mw/Mn = 1.7

-continued
(A-8)
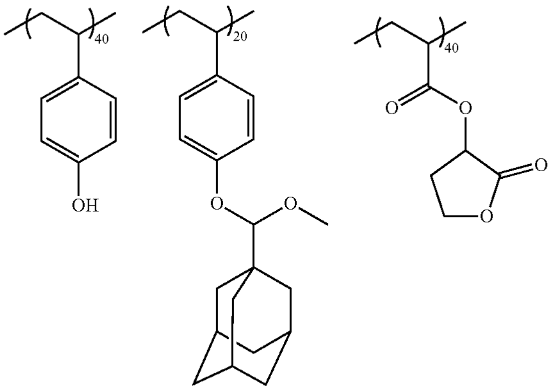
Mw = 5000
Mw/Mn = 1.7
(A-9)
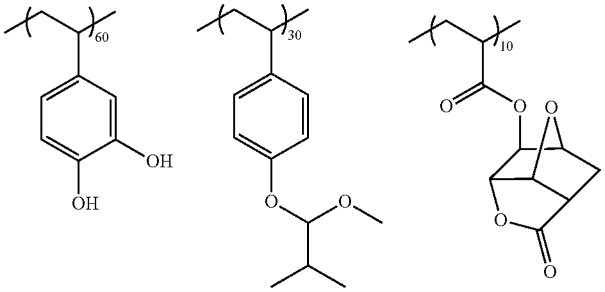
Mw = 9000
Mw/Mn = 1.6
(A-10)
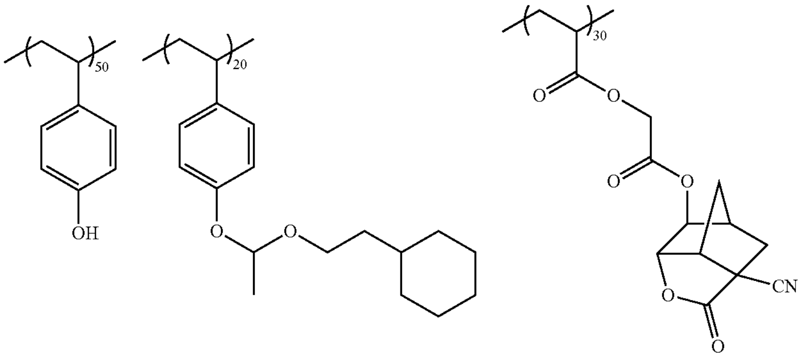
Mw = 15000
Mw/Mn = 1.7

-continued
(A-11)
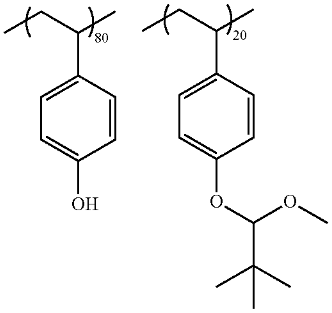
Mw = 5000
Mw/Mn = 1.1
(A-12)
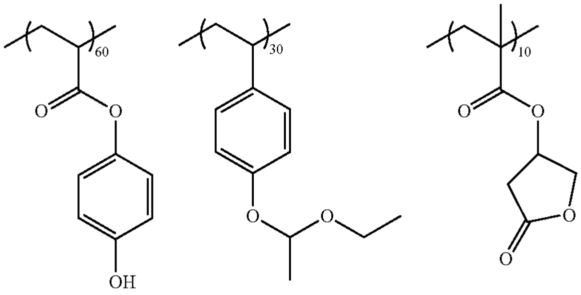
Mw = 9000
Mw/Mn = 1.6
(A-13)
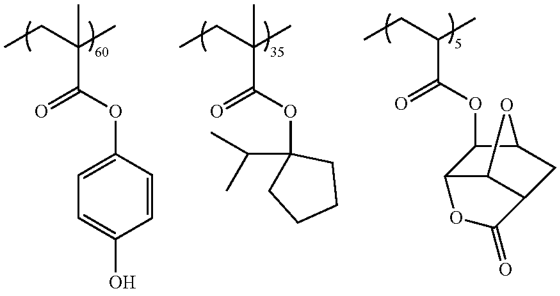
Mw = 12000
Mw/Mn = 1.6
(A-14)
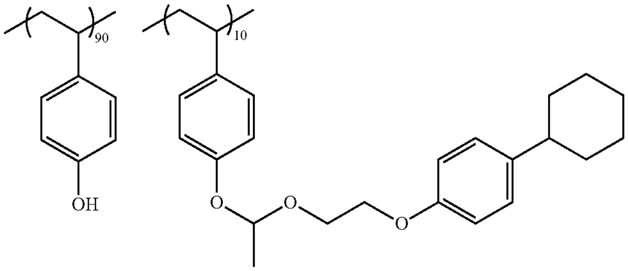
Mw = 18000
Mw/Mn = 1.2

-continued
(A-15)
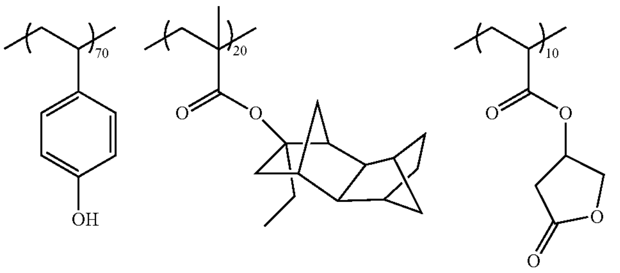
Mw = 10000
Mw/Mn = 1.6
(A-16)
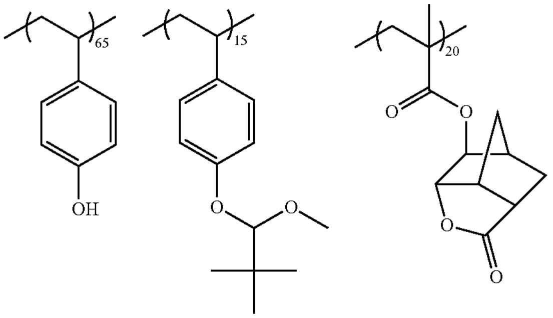
Mw = 5500
Mw/Mn = 1.7
(A-17)
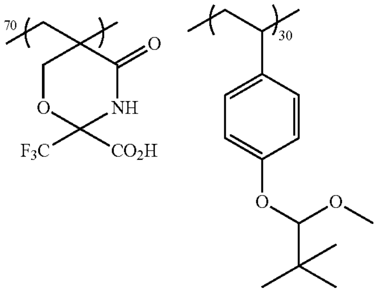
Mw = 13000
Mw/Mn = 1.7
(A-18)
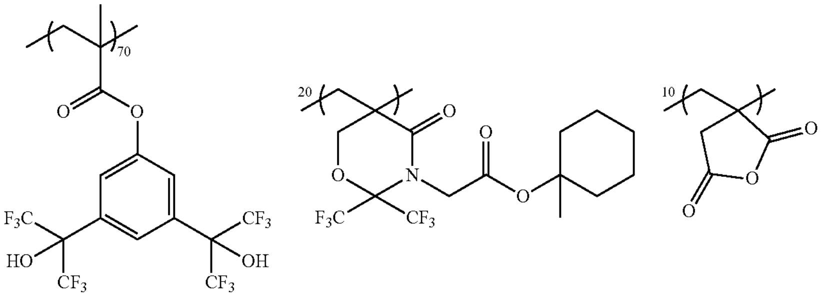
Mw = 7000
Mw/Mn = 1.7

-continued
(A-19)
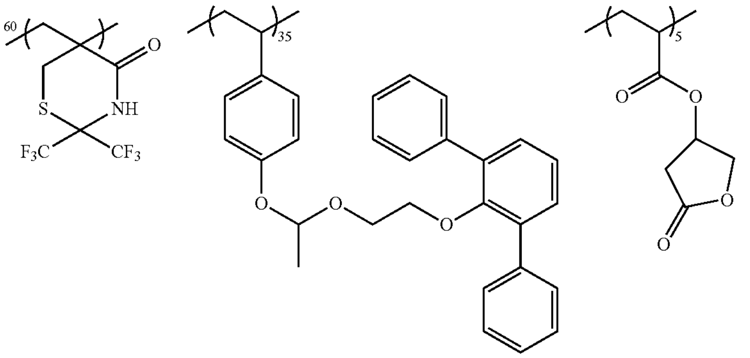
Mw = 9000
Mw/Mn = 1.7
(A-20)
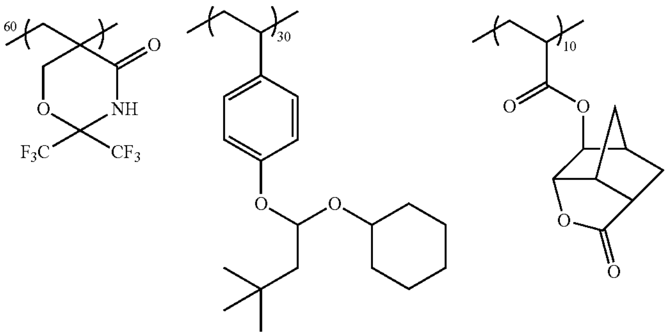
Mw = 8000
Mw/Mn = 1.4
(A-21)
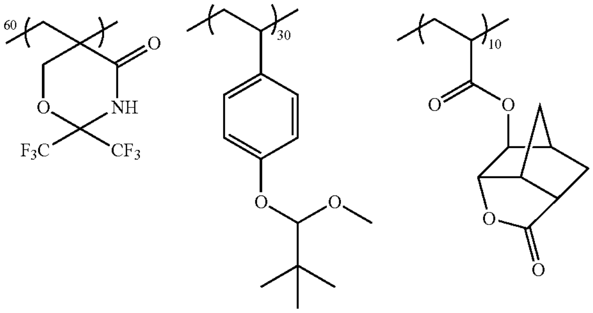
Mw = 9000
Mw/Mn = 1.6
(A-22)
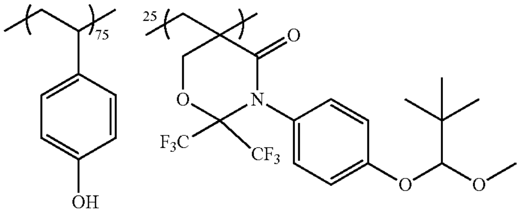
Mw = 7000
Mw/Mn = 1.8

-continued
(A-23)
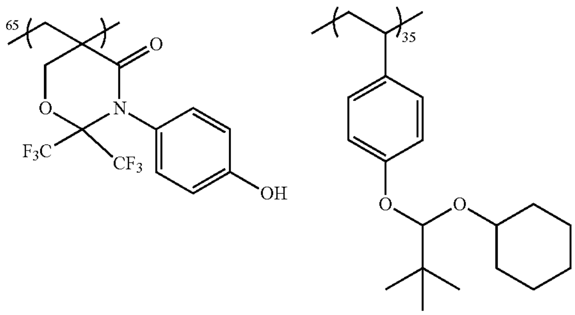
Mw = 17000
Mw/Mn = 1.7
(A-24)
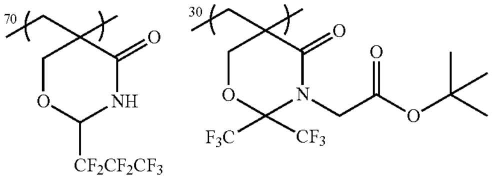
Mw = 5000
Mw/Mn = 1.5
(A-25)
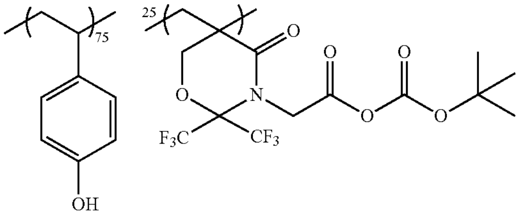
Mw = 7000
Mw/Mn = 1.8
(A-26)
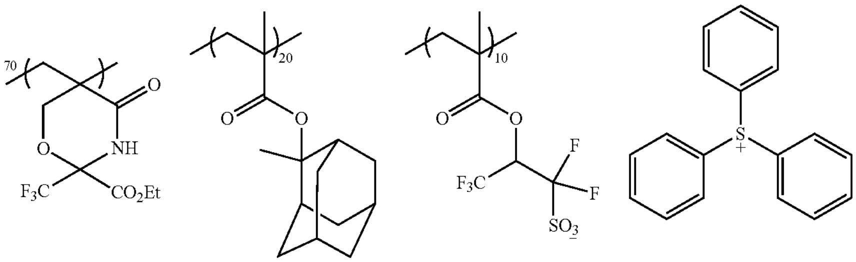
Mw = 8000
Mw/Mn = 1.6

-continued
(A-27)
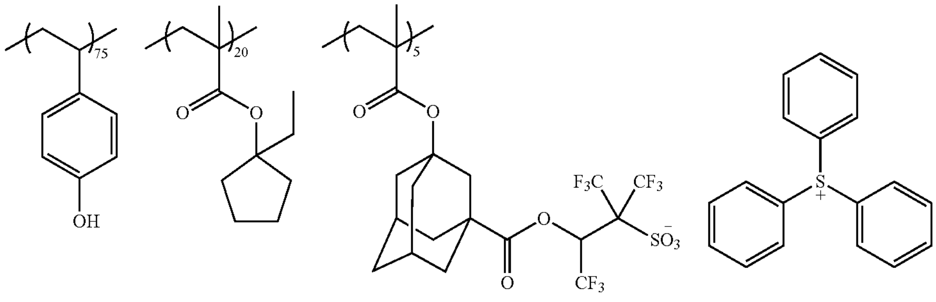
Mw = 1000
Mw/Mn = 1.5
(A-28)
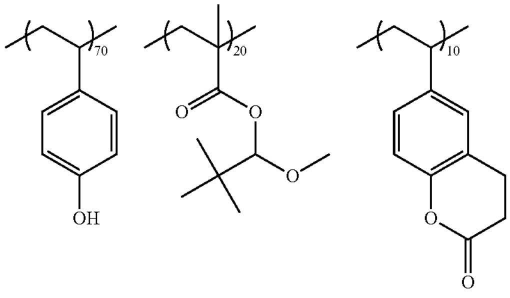
Mw = 7800
Mw/Mn = 1.7
(A-29)
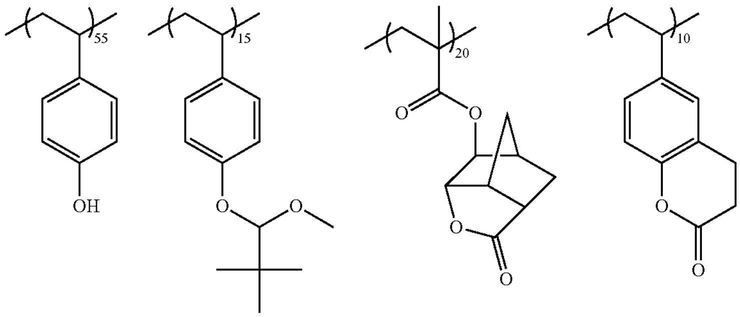
Mw = 5500
Mw/Mn = 1.7
(A-30)
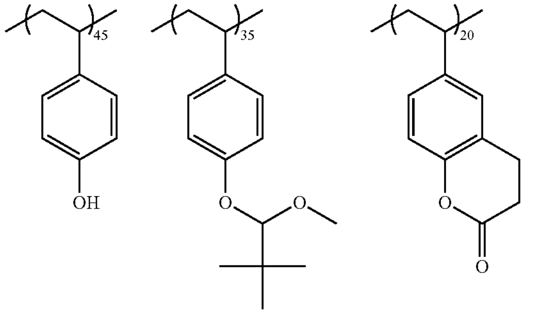
Mw = 6000
Mw/Mn = 1.6

-continued
(A-31)
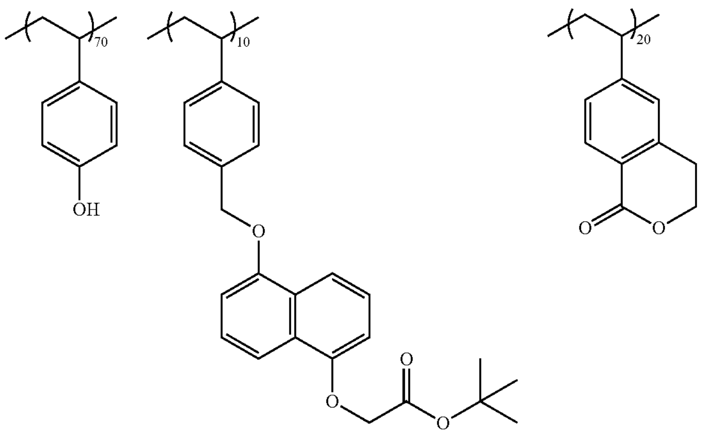
Mw = 7000
Mw/Mn = 1.4
(A-32)
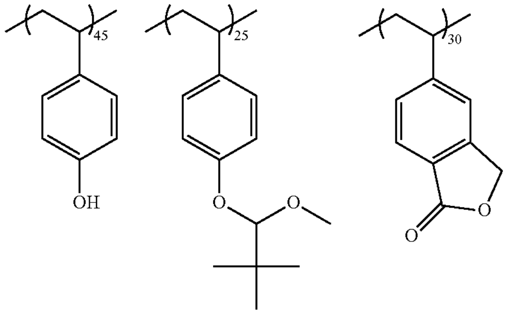
Mw = 8000
Mw/Mn = 1.6
(A-33)
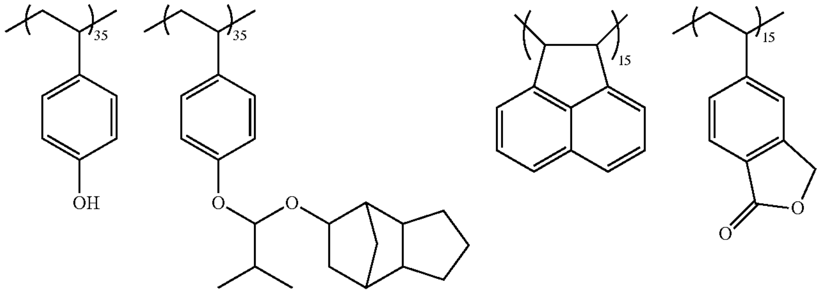
Mw = 5000
Mw/Mn = 1.8
(A-34)
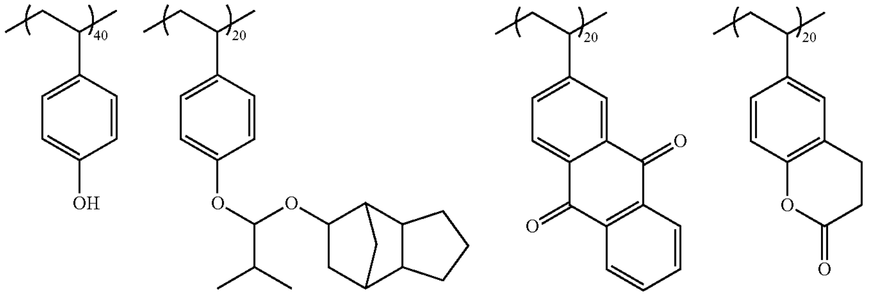
Mw = 10000
Mw/Mn = 1.7

-continued (A-35)

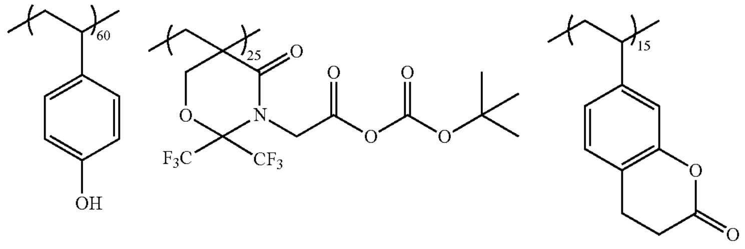

Mw = 10000
Mw/Mn = 1.8

(A-36)

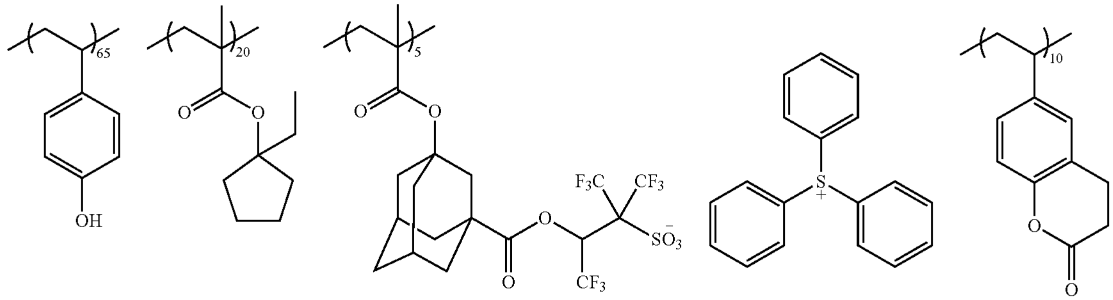

Mw = 10000
Mw/Mn = 1.5

<Acid Generator (B) (Compound (B))>

Synthesis Example 2: Synthesis of Acid Generator (B-7)

(1) (Synthesis of B-7-1)

50.0 g of 2,6-dichlorobenzenesulfonyl chloride was dissolved in 296 g of chloroform, the solution was cooled to 0° C., 22.6 g of isobutyl alcohol and 27.4 g of pyridine were added thereto, and the mixture was stirred at room temperature for 3 hours. 1 N hydrochloric acid was added to the mixed reaction solution to separate the layers, and the organic layer was washed with 1 N hydrochloric acid, saturated aqueous sodium bicarbonate, and saturated saline, and dried by addition of anhydrous magnesium sulfate. After filtration, the solvent in the filtrate was evaporated under reduced pressure and vacuum-dried to obtain 51.4 g of a compound (B-7-1).

(2) (Synthesis of B-7-2)

10.00 g of the compound (B-7-1), 23.5 g of 4-(tetrahydro-2H-pyran-2-yloxy)phenylboronic acid, 30.0 g of tripotassium phosphate, 1.45 mg of Sphos (2-dicyclohexylphosphino-2',6'-dimethoxybiphenyl), and 176 g of tetrahydrofuran were charged and degassed. Then, 396 mg of palladium acetate was added thereto and the mixture was stirred at 80° C. for 4 hours. Ethyl acetate was added to the mixed reaction solution to separate the layers, and the organic layer was washed with saturated saline and dried by addition of anhydrous magnesium sulfate. After filtration, the filtrate was passed through silica gel and washed with ethyl acetate. The solvent was evaporated under reduced pressure and then the crude product was purified by silica gel chromatography to obtain 12.3 g of a compound (B-7-2).

(3) (Synthesis of B-7-3)

6.00 g of the compound (B-7-2), 200 g of acetonitrile, and 4.76 g of sodium iodide were charged and stirred at 80° C. for 10 hours. The solid was separated by filtration and the residue was washed with acetonitrile. After vacuum-drying, 4.84 g of a compound (B-7-3) was obtained.

(4) (Synthesis of B-7)

3.00 g of the compound (B-7-3), 1.93 g of triphenylsulfonium bromide, 30 g of methylene chloride, and 30 g of pure water were charged and stirred at room temperature for 3 hours. The organic phase was washed with pure water, the solvent was then evaporated under reduced pressure, and the residue was azeotropically distilled with isopropyl ether. After vacuum-drying, a compound (B-7) (3.10 g) was obtained.

Furthermore, the $^1$H-NMR spectrum (400 MHz, DMSO-d6) of the compound (B-7) was as follows: 6=7.99-7.72 (m, 15H), 7.44-7.36 (d, 4H), 7.30-7.22 (m, 1H), 7.07-7.00 (d, 2H), 6.95-6.85 (d, 4H), 5.49-5.40 (m, 2H), 3.93-3.74 (m, 2H), 3.68-3.51 (m, 2H), 1.97-1.46 (m, 12H).

Hereinafter, the compounds (B-1) to (B-6), and (B-8) to (B-32) were synthesized using the same method.

The compounds (B-1) to (B-32) are each a compound obtained by a combination of a cation shown in Table 1 and an anion shown in Table 1.

TABLE 1
| Compound | | Cation | | | | | | | | | | | | | |
|---|---|---|---|---|---|---|---|---|---|---|---|---|---|---|---|
| (B) | | 1 | 2 | 3 | 4 | 5 | 6 | 7 | 8 | 9 | 10 | 11 | 12 | 13 | 14 |
| Anion | 1 | B-1 | | | | | | | | | | B-22 | | | B-16 |
| | 2 | | | | | B-7 | | | | | | | | | |
| | 3 | | | | | | B-14 | | | | | | | | |
| | 4 | | | B-31 | | | | | | | B-8 | | | | |
| | 5 | B-3 | | | | | | | | | | | | | |
| | 6 | | B-5 | | | | | | | | | | | | |
| | 7 | B-2 | | | | | | | | | | | | | |
| | 8 | B-4 | | | B-6 | | | | | B-23 | | | | B-24 | |
| | 9 | | | | | | | B-9 | | | | | | | |
| | 10 | | | | | | | | B-13 | | | | B-21 | | |
| Compound | | Cation | | | | | | | | | | | | | |
| (B) | | 15 | 16 | 17 | 18 | 19 | 20 | 21 | 22 | 23 | 24 | 25 | 26 | 27 | 28 |
| Anion | 1 | | | | | | | | | B-17 | | | | | |
| | 2 | | | | | | | | | | | | | B-28 | |
| | 3 | | | | | | B-11 | | | | | B-12 | | | |
| | 4 | | B-15 | | | | | | B-18 | | | | | | |
| | 5 | | | | | 8-30 | | | | | | | | | |
| | 6 | | | | | | | B-26 | | | | | B-27 | | B-32 |
| | 7 | | | | B-19 | | | | | | | | | | |
| | 8 | B-20 | | | | | | | | | | | | | |
| | 9 | | | | | | | | | | B-29 | | | | |
| | 10 | | | B-25 | | | | | | | | B-10 | | | |
The structures of cations shown in Table 1 are shown below. Me represents a methyl group and Bu represents an n-butyl group.
1
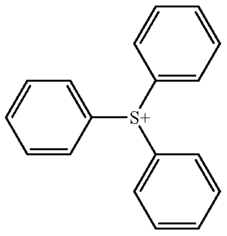
2
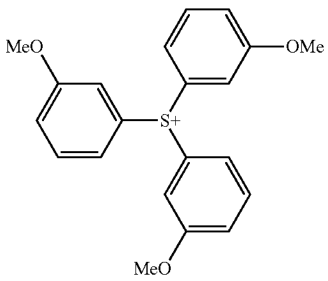
3
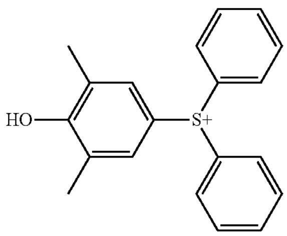
-continued
4
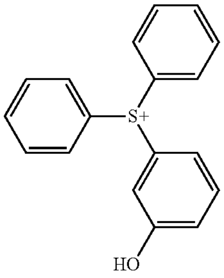
5
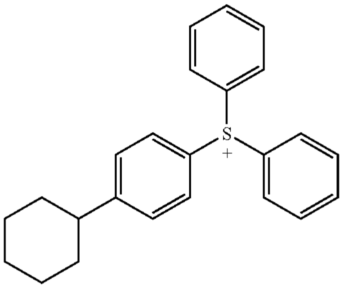
8
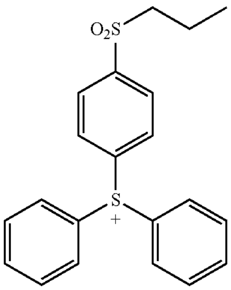

-continued
7
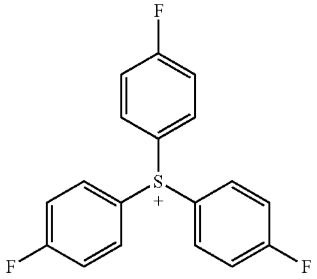
8
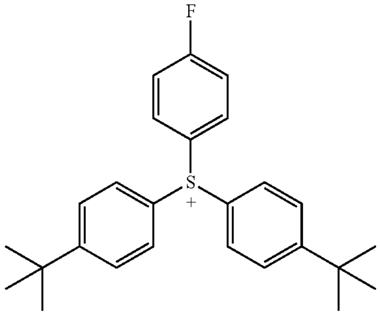
9
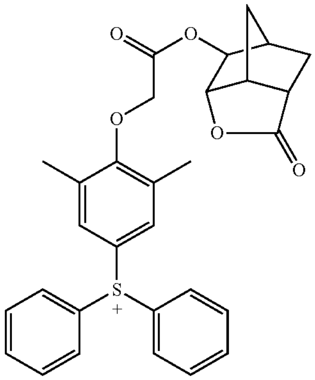
10
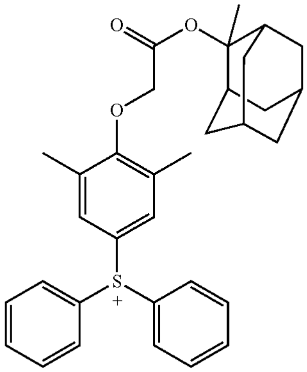
-continued
11
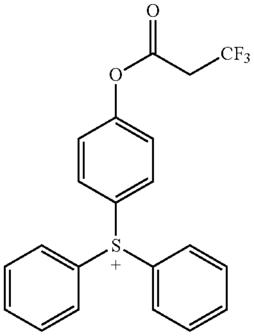
12
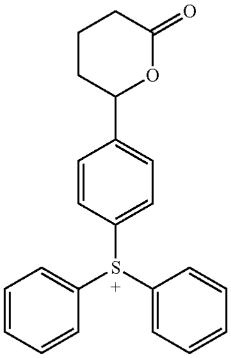
13
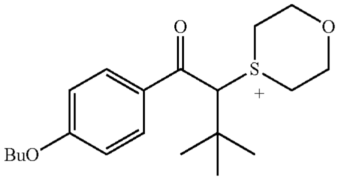
14
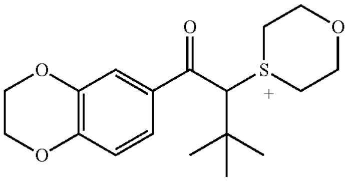
15
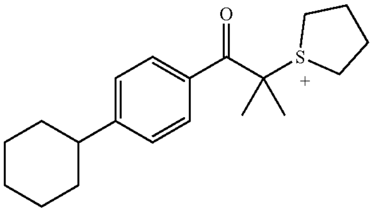
16
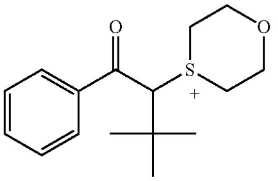

-continued
17
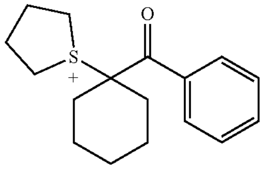
18
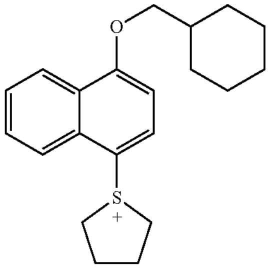
19
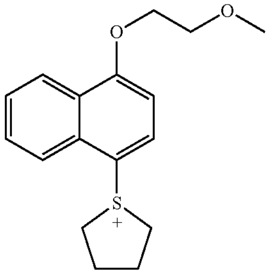
20
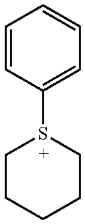
21
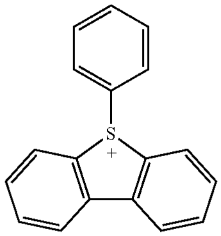
22
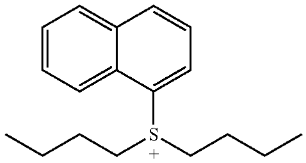
23
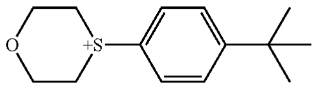
-continued
24
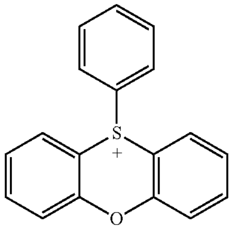
25
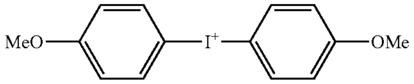
26
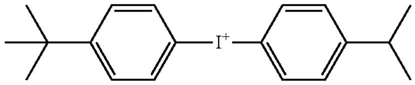
27
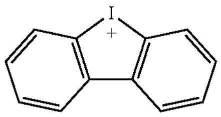
28
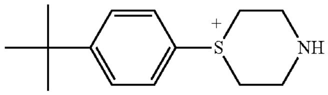
The structures of anions shown in Table 1 are shown below. Me represents a methyl group and Bu represents an n-butyl group.
1
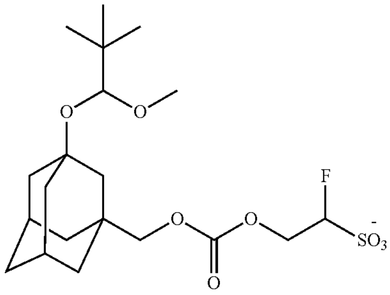
2
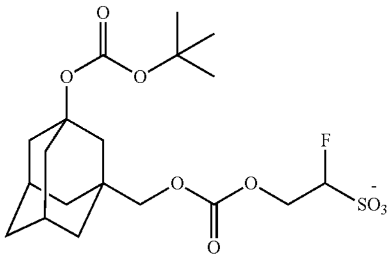
3
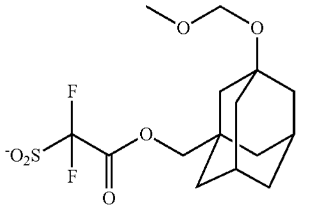

-continued
4
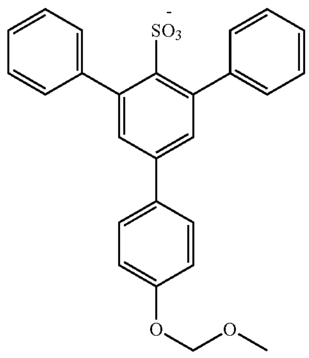
5
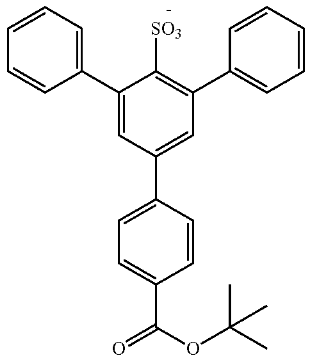
6
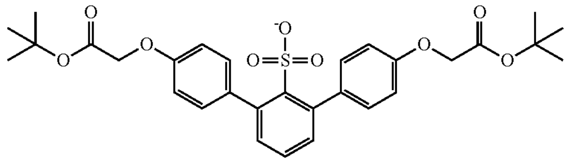
7
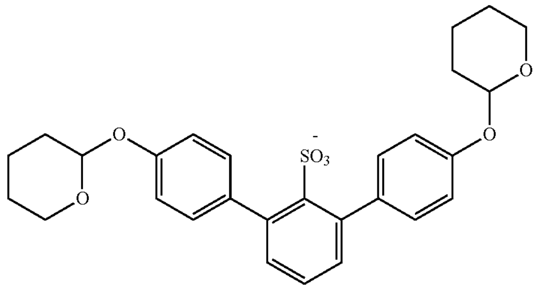
-continued
8
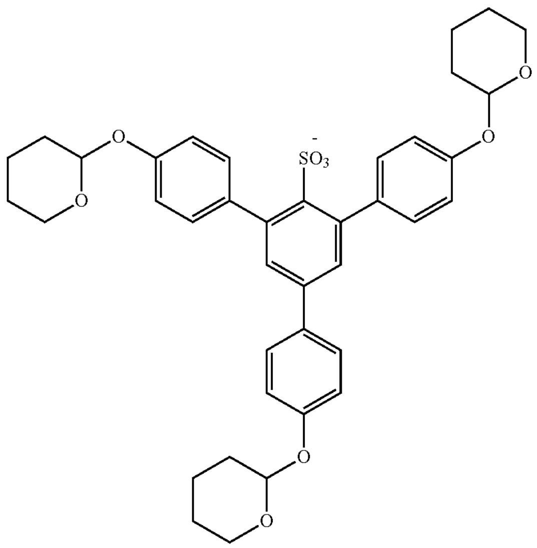
9
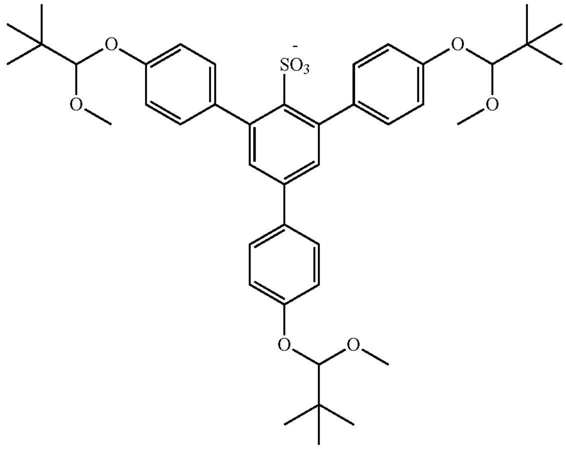
10
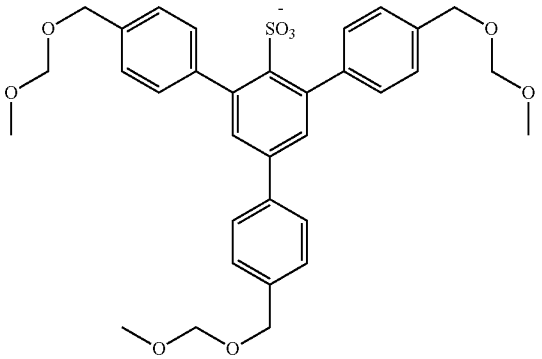
<Acid Generator (C) (Compound (C))>
Synthesis Example 3: Synthesis of Compound (C-3)
A compound (C-3) was synthesized by the same method as for the compound (B-7-2), except that 4-hydroxyphenylboronic acid was used instead of 4-(tetrahydro-2H-pyran-2-yloxy)phenylboronic acid.

Hereinafter, compounds (C-1) to (C-2) and (C-4) to (C-32) were synthesized using the same method.

The compounds (C-1) to (C-32) are each a compound obtained by a combination of a cation shown in Table 2 and an anion shown in Table 2.

TABLE 2

| Compound | | Cation | | | | | | | | | | | | | |
|---|---|---|---|---|---|---|---|---|---|---|---|---|---|---|---|
| | (C) | 1 | 2 | 3 | 4 | 5 | 6 | 7 | 8 | 9 | 10 | 11 | 12 | 13 | 14 |
| Anion | 1 | C-1 | | | | C-7 | | | | | | C-22 | | | C-16 |
| | 2 | | | | | | C-14 | | | | | | | | |
| | 3 | | | C-31 | | | | | | | C-8 | | | | |
| | 4 | C-3 | | | | | | | | | | | | | |
| | 5 | | C-5 | | | | | | | | | | | | |
| | 6 | C-2 | | | | | | | | | | | | | |
| | 7 | C-4 | | | C-6 | | | | | C-23 | | | | C-24 | |
| | 8 | | | | | | | C-9 | | | | | | | |
| | 9 | | | | | | | | C-13 | | | | C-21 | | |

| Compound | | Cation | | | | | | | | | | | | | |
|---|---|---|---|---|---|---|---|---|---|---|---|---|---|---|---|
| | (C) | 15 | 16 | 17 | 18 | 19 | 20 | 21 | 22 | 23 | 24 | 25 | 26 | 27 | 28 |
| Anion | 1 | | | | | | | | | C-17 | | | | C-28 | |
| | 2 | | | | | | C-11 | | | | | C-12 | | | |
| | 3 | | C-16 | | | | | | C-18 | | | | | | |
| | 4 | | | | | C-30 | | | | | | | | | |
| | 5 | | | | | | | C-26 | | | | | C-27 | | C-32 |
| | 6 | | | | C-19 | | | | | | | | | | |
| | 7 | C-20 | | | | | | | | | | | | | |
| | 8 | | | | | | | | | | C-29 | | | | |
| | 9 | | | C-25 | | | | | | | | C-10 | | | |

The structures of cations shown in Table 2 are shown below. Me represents a methyl group and Bu represents an n-butyl group.

1

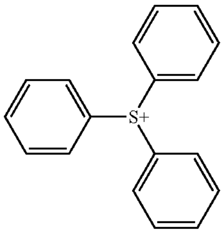

2

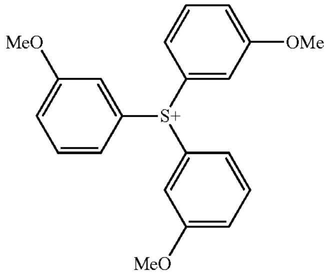

-continued
3
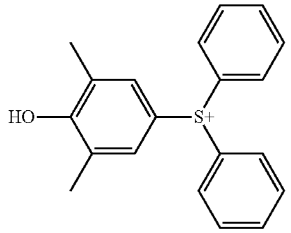
4
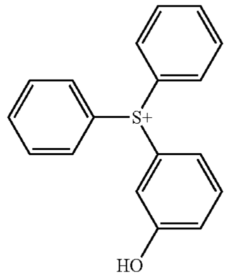
5
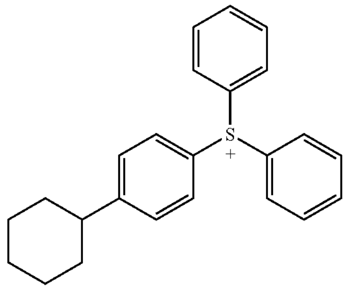
8
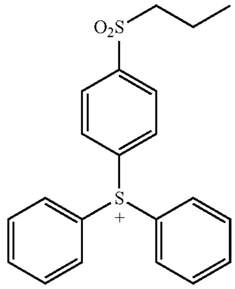
7
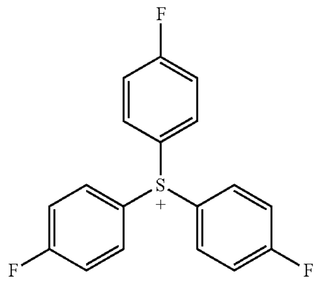
-continued
8
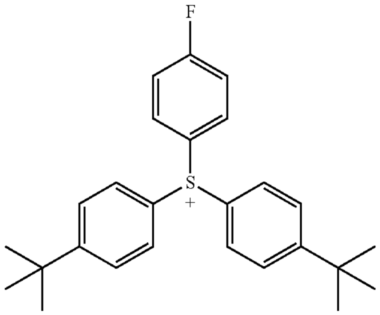
9
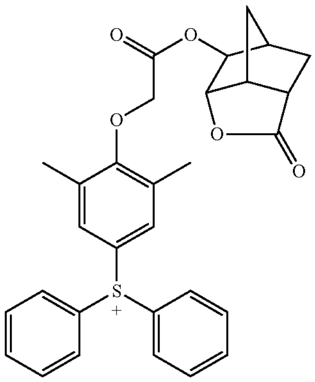
10
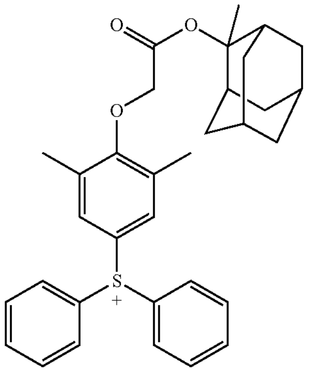
11
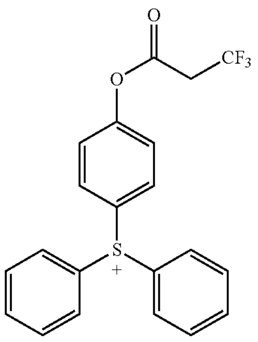

-continued
12
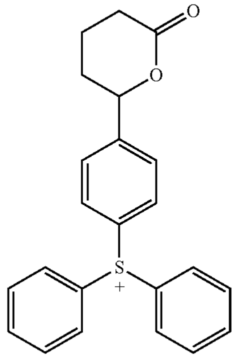
13
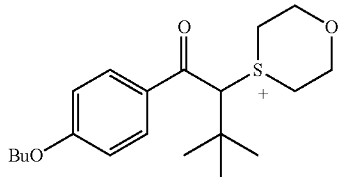
14
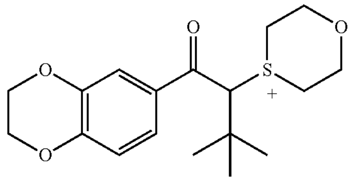
15
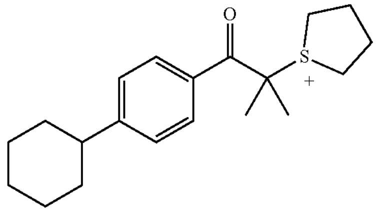
16
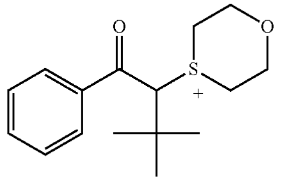
17
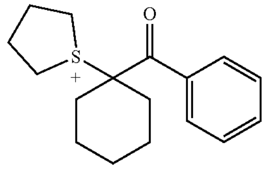
18
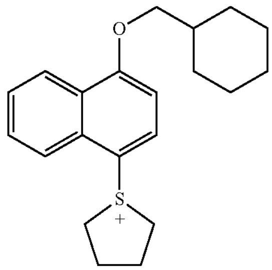
-continued
19
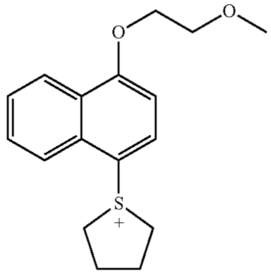
20
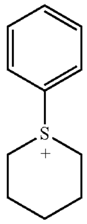
21
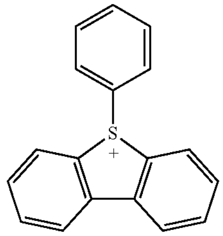
22
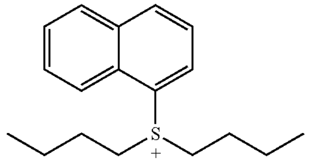
23
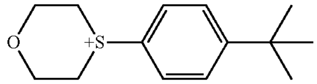
24
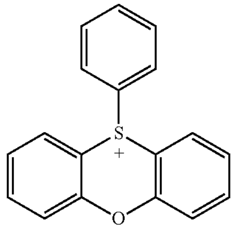
25
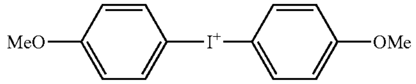
26
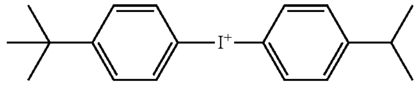
27
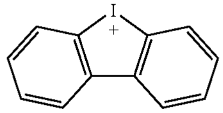

-continued
28
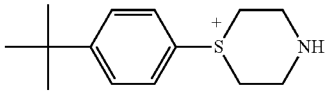
The structures of anions shown in Table 2 are shown below. Me represents a methyl group and Bu represents an n-butyl group.
1
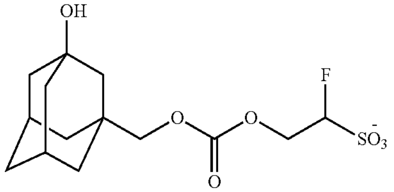
2
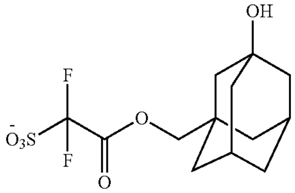
3
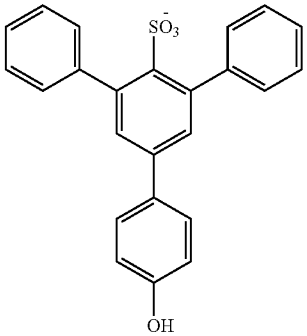
4
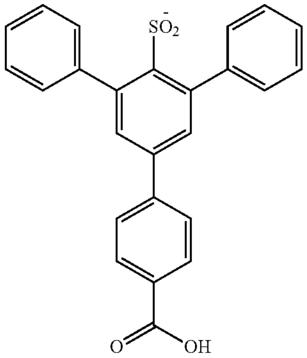
5
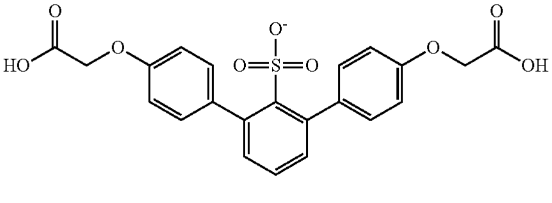
-continued
6
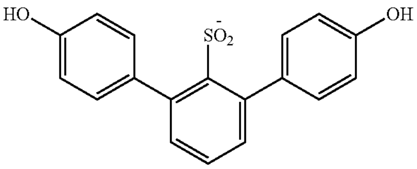
7
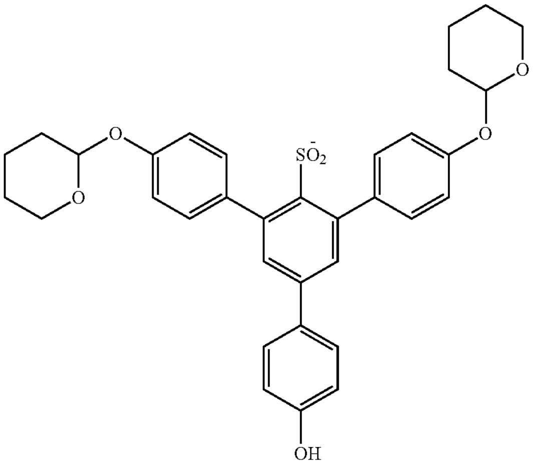
8
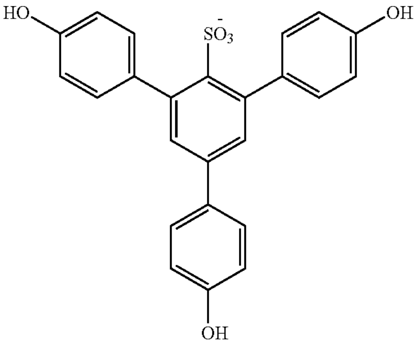
9
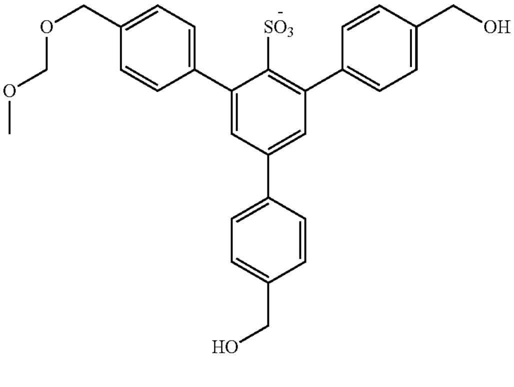

<Acid Diffusion Control Agent>
The structures of the acid diffusion control agents used are shown below.
(D-1)
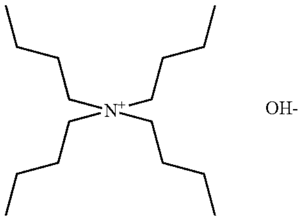
(D-2)
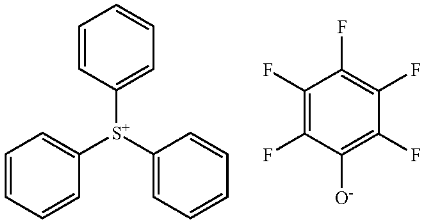
(D-3)
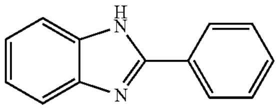
(D-4)
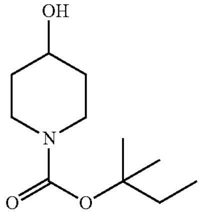
(D-5)
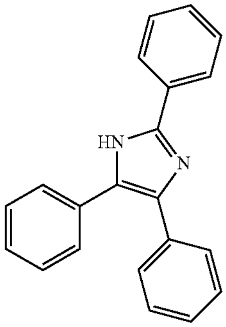
(D-6)
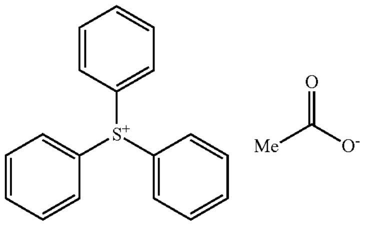
(D-7)
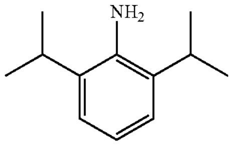
-continued
(D-8)
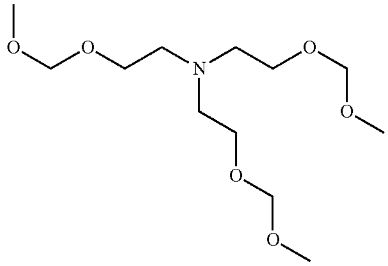
(D-9)
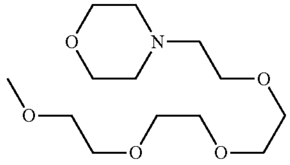
(D-10)
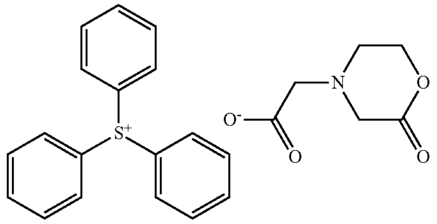
(D-11)
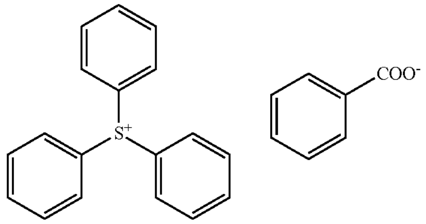
(D-12)
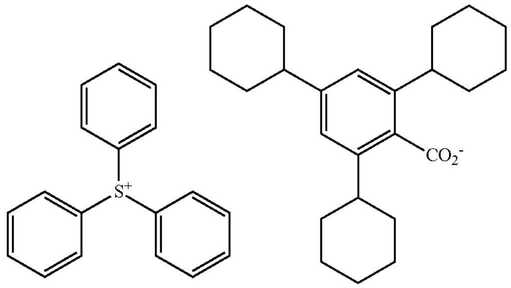
(D-13)
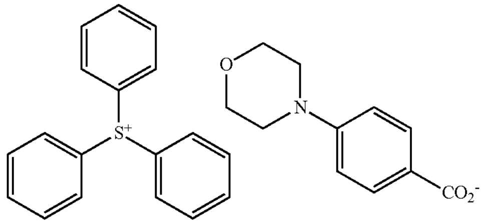

-continued (D-14)

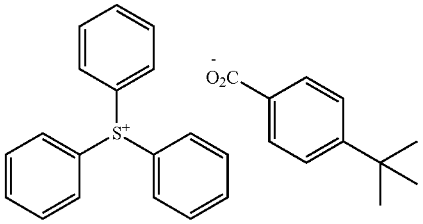

(D-15)

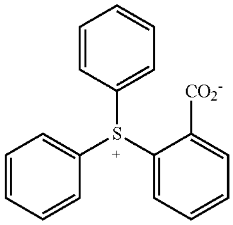

(D-16)

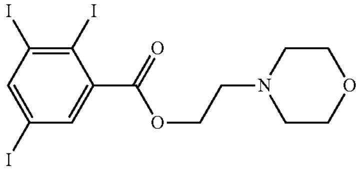

-continued (D-17)

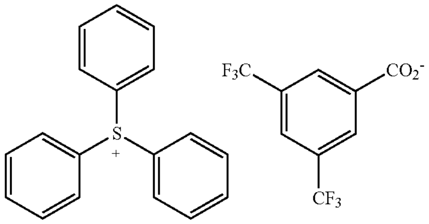

<Resin (E)>

With regard to the resin (E) used, the structures and contents thereof (molar ratios), the weight-average molecular weights (Mw), and the dispersities (Mw/Mn) of the repeating units are shown.

Furthermore, the weight-average molecular weights (Mw) and the dispersities (Mw/Mn) of the resin were measured in the same manner as for the resin (A).

(E-1)

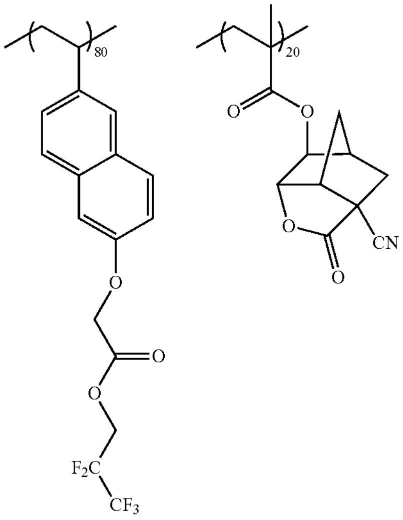

Mw = 9000
Mw/Mn = 1.7

(E-2)

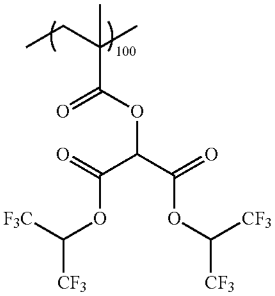

Mw = 12000
Mw/Mn = 1.6

-continued
(E-3)
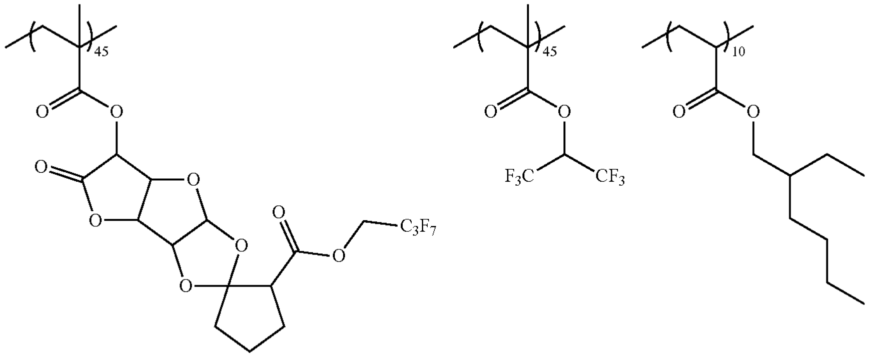
Mw = 6000
Mw/Mn = 1.7
(E-4)
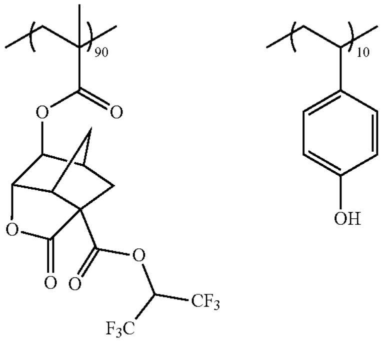
Mw = 7000
Mw/Mn = 1.3
(E-5)
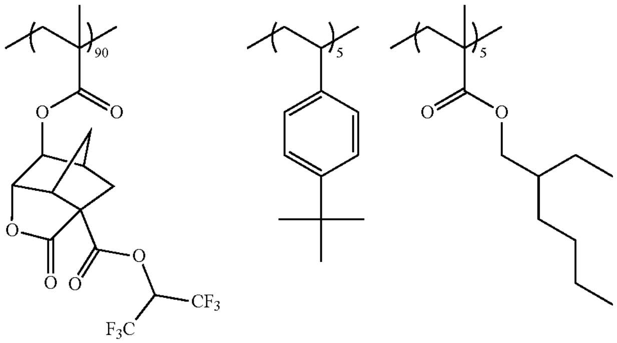
Mw = 10000
Mw/Mn = 1.7
(E-6)
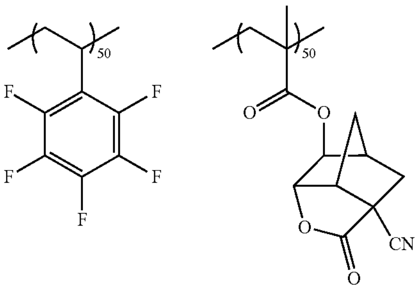
Mw = 11000
Mw/Mn = 1.7

<Surfactant>

The following W-1 to W-4 were used as a surfactant.

W-1: MEGAFACE R08 (manufactured by Dainippon Ink and Chemicals Inc.; fluorine- and silicon-based)

W-2: Polysiloxane Polymer KP-341 (manufactured by Shin-Etsu Chemical Co., Ltd.; silicon-based)

W-3: TROYSOL S-366 (manufactured by Troy Chemical Corporation; fluorine-based)

W-4: PF6320 (manufactured by OMNOVA Solutions Inc.; fluorine-based)

<Solvent>

The solvents used are shown below.

S-1: Propylene glycol monomethyl ether acetate (PGMEA)

S-2: Propylene glycol monomethyl ether (PGME)

S-3: Ethyl lactate (EL)

S-4: Ethyl 3-ethoxypropionate (EEP)

S-5; 2-Heptanone (MAK)

S-6: Methyl 3-methoxypropionate (MEMP)

S-7: 3-Methoxybutyl acetate

[Preparation and Coating of Coating Liquid of Resist Composition]

(1) Preparation of Support

An 8-inch wafer on which Cr oxynitride had been vapor-deposited (a product for which a shielding film treatment used for an ordinary photomask blank had been carried out) was prepared.

(2) Preparation of Resist Composition

The components shown in Tables 3 to 5 were dissolved in the solvents shown in Tables 3 to 5 to prepare solutions, which were filtered through a polyethylene filter having a pore size of 0.03 μm, thereby preparing resist compositions.

Furthermore, in Tables 3 to 5, the contents (% by mass) of the resin (A), the acid diffusion control agent, the resin (E), and the surfactant mean content ratios with respect to a total solid content of the resist composition. In a case where the surfactant was used, a content thereof was set to 0.01% by mass with respect to the total solid content.

A total content (% by mass) of the compound (B) and the compound (C) with respect to the total solid content of the resist composition is described in the column of "Content (% by mass) of (B)+(C)" of the acid generator (B) (compound (B)).

A ratio of the content of the compound (C) to the content of the compound (B) is described in the column of "Content (% by mass with respect to B)" of the compound (C).

In addition, the types of solvents used and the content ratios (% by mass) of the solvents used with respect to all the respective solvents are described in Tables 3 to 5 below.

The concentrations of solid contents (the content of solid contents) of the resist compositions are also shown in Tables 3 to 5.

In the resist composition R-53, the mass ratio {(B-1)/(B-4)} of (B-1) and (B-4) was set to 1/1.

In the resist composition R-53, the mass ratio {(C-1)/(C-4)} of (C-1) and (C-4) was set to 1/1.

In the resist composition R-54, the mass ratio {(B-10)/(B-12)} of (B-10) and (B-12) was set to 2/3.

In the resist composition R-54, the mass ratio {(C-10)/(C-12)} of (C-10) and (C-12) was set to 2/3.

TABLE 3

| Resist composition | Resin (A) Compound | Resin (A) Content (% by mass) | Acid generator (B) Compound | Acid generator (B) Content (% by mass) of (B) + (C) | Compound (C) Compound | Compound (C) Content (% by mass with respect to B) | Acid diffusion control agent Compound | Acid diffusion control agent Content (% by mass) | Resin (E) Compound | Resin (E) Content (% by mass) | Surfactant Type (0.01% by mass) | Solvent 1 | Content ratio (% by mass) of solvent 1 | Solvent 2 | Content ratio (% by mass) of solvent 2 | Solvent 3 | Content ratio (% by mass) of solvent 3 | Content (% by mass) of solid contents |
|---|---|---|---|---|---|---|---|---|---|---|---|---|---|---|---|---|---|---|
| R-1 | (A-1) | 84.79 | (B-3) | 15.00 | (C-3) | 0.02 | (D-1) | 0.20 | — | — | W-1 | S-1 | 60 | S-2 | 40 | — | — | 2.6 |
| R-2 | (A-2) | 79.89 | (B-4) | 20.00 | (C-4) | 0.50 | (D-3) | 0.10 | — | — | W-3 | S-1 | 90 | S-4 | 10 | — | — | 2.8 |
| R-3 | (A-3) | 84.90 | (B-10) | 15.00 | (C-10) | 1.00 | (D-2) | 0.10 | — | — | — | S-1 | 80 | S-2 | 10 | S-3 | 10 | 3.1 |
| R-4 | (A-4) | 79.89 | (B-23) | 20.00 | (C-23) | 0.08 | (D-4) | 0.10 | — | — | W-4 | S-1 | 60 | S-5 | 40 | — | — | 2.8 |
| R-5 | (A-5) | 89.89 | (B-19) | 10.00 | (C-19) | 2.46 | (D-7) | 0.10 | — | — | W-2 | S-1 | 20 | S-2 | 20 | S-3 | 60 | 3.6 |
| R-6 | (A-2) | 89.90 | (B-20) | 10.00 | (C-20) | 7.35 | (D-1) | 0.10 | — | — | — | S-1 | 30 | S-3 | 30 | S-7 | 40 | 2.9 |
| R-7 | (A-11) | 79.89 | (B-18) | 20.00 | (C-18) | 0.65 | (D-5) | 0.10 | — | — | W-1 | S-1 | 20 | S-2 | 20 | S-3 | 60 | 3.0 |
| R-8 | (A-4) | 79.89 | (B-28) | 10.00 | (C-28) | 4.43 | (D-11) | 0.10 | — | — | W-3 | S-1 | 20 | S-4 | 20 | S-6 | 60 | 2.6 |
| R-9 | (A-2) | 89.90 | (B-26) | 10.00 | (C-26) | 8.34 | (D-1) | 0.10 | — | — | — | S-1 | 90 | S-4 | 10 | — | — | 2.8 |
| R-10 | (A-6) | 84.89 | (B-6) | 15.00 | (C-6) | 4.35 | (D-2) | 0.10 | — | — | W-1 | S-1 | 80 | S-2 | 10 | S-3 | 10 | 3.1 |
| R-11 | (A-9) | 79.89 | (B-24) | 20.00 | (C-24) | 1.35 | (D-8) | 0.10 | — | — | W-3 | S-1 | 20 | S-2 | 20 | S-3 | 60 | 3.6 |
| R-12 | (A-8) | 84.90 | (B-5) | 15.00 | (C-5) | 0.45 | (D-1) | 0.10 | — | — | — | S-1 | 30 | S-2 | 30 | S-7 | 40 | 2.9 |
| R-13 | (A-3) | 89.89 | (B-14) | 10.00 | (C-14) | 1.34 | (D-4) | 0.10 | — | — | W-4 | S-1 | 20 | S-2 | 20 | S-3 | 60 | 3.0 |
| R-14 | (A-4) | 84.89 | (B-17) | 15.00 | (C-17) | 0.34 | (D-5) | 0.10 | — | — | W-2 | S-1 | 20 | S-2 | 20 | S-3 | 60 | 3.2 |
| R-15 | (A-21) | 89.80 | (B-20) | 10.00 | (C-20) | 1.24 | (D-9) | 0.20 | — | — | — | S-1 | 40 | S-3 | 60 | — | — | 3.1 |
| R-16 | (A-10) | 89.90 | (B-29) | 10.00 | (C-29) | 0.04 | (D-3) | 0.10 | — | — | — | S-1 | 20 | S-2 | 20 | S-3 | 60 | 2.9 |
| R-17 | (A-2) | 84.80 | (B-12) | 15.00 | (C-12) | 1.34 | (D-3) | 0.20 | — | — | — | S-1 | 30 | S-2 | 20 | S-3 | 50 | 2.8 |
| R-18 | (A-1) | 89.89 | (B-11) | 10.00 | (C-11) | 2.34 | (D-6) | 0.10 | — | — | W-2 | S-1 | 20 | S-2 | 80 | — | — | 2.8 |
| R-19 | (A-2) | 84.90 | (B-15) | 15.00 | (C-15) | 3.45 | (D-2) | 0.10 | — | — | — | S-1 | 40 | S-3 | 20 | S-5 | 40 | 3.5 |
| R-20 | (A-3) | 84.79 | (B-18) | 15.00 | (C-18) | 2.64 | (D-3) | 0.20 | — | — | W-4 | S-1 | 10 | S-2 | 60 | S-3 | 30 | 2.4 |
| R-21 | (A-6) | 79.90 | (B-21) | 20.00 | (C-21) | 0.46 | (D-4) | 0.10 | — | — | — | S-1 | 20 | S-2 | 50 | S-3 | 30 | 2.1 |
| R-22 | (A-5) | 89.79 | (B-7) | 10.00 | (C-7) | 0.05 | (D-5) | 0.20 | — | — | W-3 | S-1 | 20 | S-2 | 80 | — | — | 2.8 |
| R-23 | (A-12) | 89.79 | (B-13) | 10.00 | (C-13) | 1.64 | (D-3) | 0.20 | — | — | W-1 | S-1 | 20 | S-2 | 60 | S-3 | 20 | 2.4 |
| R-24 | (A-7) | 89.80 | (B-25) | 10.00 | (C-25) | 6.35 | (D-2) | 0.20 | — | — | — | S-1 | 50 | S-2 | 30 | S-5 | 20 | 2.3 |
| R-25 | (A-8) | 84.80 | (B-30) | 15.00 | (C-30) | 0.65 | (D-8) | 0.20 | — | — | — | S-1 | 40 | S-2 | 30 | S-3 | 30 | 2.1 |
| R-26 | (A-15) | 79.89 | (B-15) | 20.00 | (C-15) | 4.56 | (D-11) | 0.10 | — | — | W-2 | S-1 | 30 | S-2 | 20 | S-6 | 50 | 2.9 |
| R-27 | (A-13) | 84.90 | (B-31) | 15.00 | (C-31) | 8.54 | (D-10) | 0.10 | — | — | — | S-1 | 10 | S-3 | 50 | S-5 | 40 | 2.3 |
| R-28 | (A-11) | 89.79 | (B-2) | 10.00 | (C-2) | 3.32 | (D-3) | 0.20 | — | — | W-3 | S-1 | 80 | S-2 | 10 | S-3 | 10 | 2.8 |
| R-29 | (A-4) | 89.80 | (B-28) | 10.00 | (C-28) | 0.04 | (D-1) | 0.20 | — | — | — | S-1 | 80 | S-3 | 10 | S-4 | 10 | 2.7 |
| R-30 | (A-9) | 89.79 | (B-22) | 10.00 | (C-22) | 4.43 | (D-4) | 0.20 | — | — | W-2 | S-1 | 80 | S-2 | 10 | S-6 | 10 | 2.9 |
| R-31 | (A-2) | 84.90 | (B-27) | 15.00 | (C-27) | 2.35 | (D-13) | 0.10 | — | — | — | S-1 | 50 | S-2 | 30 | S-3 | 20 | 3.3 |
| R-32 | (A-3) | 79.89 | (B-1) | 20.00 | (C-1) | 0.07 | (D-2) | 0.10 | — | — | W-4 | S-1 | 50 | S-2 | 20 | S-3 | 30 | 3.4 |

TABLE 4

| Resist composition | Resin (A) Compound | Resin (A) Content (% by mass) | Acid generator (B) Compound | Acid generator (B) Content (% by mass) of (B) + (C) | Compound (C) Compound | Compound (C) Content (% by mass with respect to B) | Acid diffusion control agent Compound | Acid diffusion control agent Content (% by mass) | Resin (E) Compound | Resin (E) Content (% by mass) | Surfactant Type (0.01% by mass) | Solvent 1 | Content ratio (% by mass) of solvent 1 | Solvent 2 | Content ratio (% by mass) of solvent 2 | Solvent 3 | Content ratio (% by mass) of solvent 3 | Content (% by mass) of solid contents |
|---|---|---|---|---|---|---|---|---|---|---|---|---|---|---|---|---|---|---|
| R-33 | (A-4) | 79.80 | (B-16) | 20.00 | (C-16) | 1.65 | (D-9) | 0.20 | — | — | — | S-1 | 30 | S-2 | 30 | S-3 | 40 | 3.6 |
| R-34 | (A-8) | 89.80 | (B-8) | 10.00 | (C-8) | 3.35 | (D-10) | 0.20 | — | — | — | S-1 | 30 | S-3 | 20 | S-4 | 50 | 2.8 |
| R-35 | (A-11) | 79.90 | (B-4) | 20.00 | (C-4) | 0.01 | (D-6) | 0.10 | — | — | — | S-1 | 20 | S-2 | 20 | S-3 | 60 | 2.8 |
| R-36 | (A-11) | 79.90 | (B-4) | 20.00 | (C-4) | 5.00 | (D-6) | 0.10 | — | — | — | S-1 | 20 | S-2 | 20 | S-3 | 60 | 2.8 |
| R-37 | (A-11) | 79.90 | (B-4) | 20.00 | (C-4) | 10.00 | (D-6) | 0.10 | — | — | — | S-1 | 20 | S-2 | 20 | S-3 | 60 | 2.8 |
| R-38 | (A-1) | 84.89 | (B-9) | 10.00 | (C-9) | 1.35 | (D-1) | 0.10 | (E-1) | 5.00 | W-1 | S-1 | 30 | S-3 | 40 | S-4 | 30 | 2.9 |
| R-39 | (A-27) | 74.90 | (B-2) | 15.00 | (C-2) | 0.02 | (D-2) | 0.10 | (E-2) | 10.00 | — | S-1 | 20 | S-2 | 20 | S-3 | 60 | 2.8 |
| R-40 | (A-26) | 74.79 | (B-6) | 20.00 | (C-6) | 1.54 | (D-12) | 0.20 | (E-3) | 5.00 | W-1 | S-1 | 80 | S-3 | 10 | S-4 | 10 | 2.7 |
| R-41 | (A-14) | 69.89 | (B-4) | 20.00 | (C-4) | 0.64 | (D-6) | 0.10 | (E-4) | 10.00 | W-4 | S-1 | 40 | S-3 | 60 | — | — | 2.9 |
| R-42 | (A-18) | 64.79 | (B-14) | 25.00 | (C-14) | 0.87 | (D-5) | 0.20 | (E-5) | 10.00 | W-2 | S-1 | 20 | S-2 | 20 | S-3 | 60 | 2.8 |
| R-43 | (A-20) | 74.90 | (B-10) | 20.00 | (C-10) | 0.03 | (D-3) | 0.10 | (E-6) | 5.00 | — | S-1 | 20 | S-2 | 20 | S-3 | 60 | 3.4 |
| R-44 | (A-16) | 79.89 | (B-4) | 20.00 | (C-4) | 0.14 | (D-6) | 5.00 | — | — | — | S-1 | 20 | S-2 | 20 | S-3 | 60 | 2.8 |
| R-45 | (A-22) | 79.90 | (B-15) | 20.00 | (C-15) | 0.90 | (D-5) | 1.00 | — | — | — | S-1 | 20 | S-2 | 20 | S-3 | 60 | 2.8 |
| R-46 | (A-17) | 85.00 | (B-7) | 10.00 | (C-7) | 1.50 | (D-9) | 5.00 | — | — | — | S-1 | 20 | S-2 | 20 | S-3 | 60 | 2.8 |
| R-47 | (A-24) | 76.99 | (B-13) | 20.00 | (C-13) | 2.71 | (D-10) | 3.00 | — | — | W-1 | S-1 | 80 | S-3 | 10 | S-4 | 10 | 2.7 |
| R-48 | (A-19) | 73.99 | (B-11) | 25.00 | (C-11) | 1.98 | (D-11) | 1.00 | — | — | W-2 | S-1 | 40 | S-3 | 60 | — | — | 2.9 |
| R-49 | (A-23) | 70.00 | (B-26) | 25.00 | (C-26) | 0.65 | (D-12) | 5.00 | — | — | — | S-1 | 20 | S-2 | 20 | S-3 | 60 | 3.4 |
| R-50 | (A-9) | 88.99 | (B-29) | 10.00 | (C-29) | 0.98 | (D-8) | 1.00 | — | — | W-1 | S-1 | 30 | S-2 | 20 | S-3 | 50 | 3.4 |
| R-51 | (A-25) | 77.00 | (B-8) | 20.00 | (C-8) | 0.34 | (D-14) | 3.00 | — | — | — | S-1 | 20 | S-2 | 20 | S-3 | 60 | 2.8 |
| R-52 | (A-11) | 75.00 | (B-28) | 20.00 | (C-28) | 0 45 | (D-7) | 5.00 | — | — | — | S-1 | 30 | S-3 | 20 | S-4 | 50 | 2.8 |
| R-53 | (A-14) | 79.90 | (B-1), (B-4) | 20.00 | (C-1), (C-4) | 2.43 | (D-6) | 0.10 | — | — | — | S-1 | 20 | S-2 | 20 | S-3 | 60 | 2.8 |
| R-54 | (A-22) | 89.80 | (B-10), (B-12) | 10.00 | (C-10), (C-12) | 0.64 | (D-13) | 0.20 | — | — | — | S-1 | 20 | S-3 | 20 | S-4 | 60 | 2.4 |
| R-55 | (A-2) | 79.90 | (B-32) | 20.00 | (C-32) | 0.34 | (D-10) | 0.10 | — | — | — | S-1 | 80 | S-2 | 20 | — | — | 3.4 |
| R-56 | (A-20) | 84.90 | (B-16) | 15.00 | (C-16) | 0.04 | (D-2) | 0.10 | — | — | — | S-1 | 40 | S-2 | 30 | S-3 | 30 | 3.0 |
| R-57 | (A-15) | 79.89 | (B-28) | 20.00 | (B-28) | 0.65 | (D-7) | 0.10 | — | — | W-1 | S-1 | 20 | S-2 | 20 | S-3 | 60 | 2.7 |
| R-53 | (A-3) | 89.80 | (B-8) | 10.00 | (C-8) | 10.56 | (D-1) | 0.20 | — | — | — | S-1 | 20 | S-3 | 20 | S-5 | 60 | 2.8 |
| R-59 | (A-11) | 79.90 | (B-4) | 20.00 | (C-4) | 15.00 | (D-6) | 0.10 | — | — | — | S-1 | 20 | S-2 | 20 | S-3 | 60 | 2.8 |
| R-60 | (A-4) | 74.89 | (B-2) | 25.00 | (C-1) | 0.71 | (D-6) | 0.10 | — | — | W-1 | S-1 | 30 | S-2 | 20 | S-3 | 50 | 2 8 |
| R-61 | (A-5) | 79.89 | (B-3) | 20.00 | (C-7) | 1.35 | (D-7) | 0.10 | — | — | W-2 | S-1 | 20 | S-2 | 30 | S-3 | 50 | 2 8 |
| R-62 | (A-11) | 79.90 | (B-4) | 20.00 | — | 0.00 | (D-6) | 0.10 | — | — | — | S-1 | 20 | S-2 | 20 | S-3 | 60 | 2.8 |
| R-63 | (A-11) | 79.90 | (B-4) | 20.00 | (C-4) | 0.005 | (D-6) | 0.10 | — | — | — | S-1 | 20 | S-2 | 20 | S-3 | 60 | 2.8 |

TABLE 5

| Resist composition | Resin (A) Compound | Resin (A) Content (% by mass) | Acid generator (B) Compound | Acid generator (B) Content (% by mass) of (B) + (C) | Compound (C) Compound | Compound (C) Content (% by mass with respect to B) | Acid diffusion control agent Compound | Acid diffusion control agent Content (% by mass) | Resin (E) Compound | Resin (E) Content (% by mass) |
|---|---|---|---|---|---|---|---|---|---|---|
| R-64 | (A-28) | 79.80 | (B-1) | 20.00 | (C-1) | 0.65 | (D-9) | 0.10 | — | — |
| R-65 | (A-29) | 89.80 | (B-2) | 10.00 | (C-2) | 0.65 | (D-10) | 0.20 | — | — |
| R-66 | (A-30) | 84.80 | (B-3) | 15.00 | (C-3) | 0.98 | (D-11) | 0.20 | — | — |
| R-67 | (A-31) | 79.90 | (B-4) | 20.00 | (C-4) | 0.04 | (D-12) | 0.10 | — | — |
| R-68 | (A-32) | 79.80 | (B-5) | 20.00 | (C-5) | 0.98 | (D-13) | 0.20 | — | — |
| R-69 | (A-33) | 79.50 | (B-6) | 20.00 | (C-6) | 0.34 | (D-14) | 0.50 | — | — |
| R-70 | (A-34) | 79.80 | (B-7) | 20.00 | (C-7) | 0.02 | (D-15) | 0.20 | — | — |
| R-71 | (A-35) | 84.50 | (B-8) | 15.00 | (C-8) | 0.65 | (D-16) | 0.50 | — | — |
| R-72 | (A-36) | 89.80 | (B-9) | 10.00 | (C-9) | 0.02 | (D-17) | 0.20 | — | — |

| Resist composition | Surfactant Type (0.01% by mass) | Solvent 1 | Content ratio (% by mass) of solvent 1 | Solvent 2 | Content ratio (% by mass) of solvent 2 | Solvent 3 | Content ratio (% by mass) of solvent 3 | Content (% by mass) of solid contents |
|---|---|---|---|---|---|---|---|---|
| R-64 | — | S-1 | 20 | S-2 | 20 | S-3 | 60 | 3.0 |
| R-65 | — | S-1 | 20 | S-2 | 20 | S-3 | 60 | 3.0 |
| R-66 | — | S-1 | 20 | S-2 | 20 | S-3 | 60 | 3.0 |
| R-67 | — | S-1 | 20 | S-2 | 20 | S-3 | 60 | 3.0 |
| R-68 | — | S-1 | 20 | S-2 | 20 | S-3 | 60 | 3.0 |
| R-69 | — | S-1 | 20 | S-2 | 20 | S-3 | 60 | 3.0 |
| R-70 | — | S-1 | 20 | S-2 | 20 | S-3 | 60 | 3.0 |
| R-71 | — | S-1 | 20 | S-2 | 20 | S-3 | 60 | 3.0 |
| R-72 | — | S-1 | 20 | S-2 | 20 | S-3 | 60 | 3.0 |

(3) Preparation of Resist Film

A resist composition was applied onto the 8-inch wafer using a spin coater Mark8 manufactured by Tokyo Electron Limited, and dried on a hot plate at 120° C. for 600 seconds to obtain a resist film having a film thickness of 100 nm. That is, a resist-coated wafer was obtained.

[EB Exposure and Development]

(4) Preparation of Resist Pattern

The resist film obtained in (3) above was subjected to patternwise irradiation using an electron beam drawing apparatus (manufactured by Advantest Corporation; F7000S, accelerating voltage: 50 keV). After the irradiation, the film was heated on a hot plate at 100° C. for 600 seconds, dipped using a 2.38%-by-mass aqueous tetramethylammonium hydroxide (TMAH) solution for 60 seconds, then rinsed with water for 30 seconds, and dried.

Furthermore, the exposure by the electron beam irradiator (F7000S) is a single beam method, but it is assumed that the evaluation results are the same even in a case of performing the exposure by a multi-beam method in which a plurality of single beams are simultaneously scanned.

[Etching]

An 8-inch wafer on which the resist pattern had been formed was dry-etched to form a hard mask pattern. In the dry etching, a fluorine-based gas ($SF_6$) was used as the etching gas, and the etching time was set to 20 seconds.

[Evaluation]

(5) Evaluation of Resist Pattern

The obtained pattern was evaluated on a resolution and development defects by the following methods. The results are shown in Tables 6 and 7 below.

<Sensitivity>

The irradiation energy upon resolution of a 1:1 line-and-space pattern with a line width of 50 nm was defined as a sensitivity (Eop).

<L/S Resolution>

A marginal resolving power (a minimum line width at which lines and spaces (line:space=1:1) are separated and resolved) at an exposure dose showing the sensitivity (Eop) was taken as an L/S resolution (nm).

<Line Width Roughness (LWR) Performance>

Line width roughness was measured at any 50 points in 0.5 μm of a line-and-space pattern in the longitudinal direction (line:space=1:1) with a line width of 50 nm in the above Eop, a standard deviation thereof was determined, and 3a (nm) was calculated. A smaller value thereof indicates better performance.

<Development Defects>

Using a defect inspection apparatus, KLA 2360 (trade name), manufactured by KLA Tencor Ltd., a 1:1 line-and-space pattern with a line width of 50 nm formed at the sensitivity (Eop) was measured by setting a pixel size of the defect inspection apparatus to 0.16 μm and a threshold value to 20 to detect defects (defects/$cm^2$) extracted from a difference produced at the time of superposing pixel units on a reference image, and the number of the defects per unit area (defects/$cm^2$) was computed. Then, by performing a defect review, the development defects were classified and extracted from all the defects, and the number of development defects per unit area (defects/$cm^2$) was computed. The value of less than 0.5 was designated as A, the value of 0.5 or more and less than 1.0 was designated as B, the value of 1.0 or more and less than 5.0 was designated as C, and a value of 5.0 or more was designated as D. A smaller value thereof indicates better performance.

<Etching Defects>

For the formed hard mask pattern, the number of defects due to the remaining pattern was counted. The number of defects was counted using a mask blank defect inspection apparatus (MAGICS series M2351) manufactured by Lasertec Corporation. A case where the value was less than 1 was designated as A, a case where the value was 1 or more and less than 10 was designated as B, a case where the value was 10 or more and less than 50 was designated as C, and a case where the value was 50 or more was designated as D. A smaller value thereof indicates better performance.

TABLE 6

| | Resist composition | L/S resolution [nm] | LWR [nm] | Development defects | Etching defects |
|---|---|---|---|---|---|
| Example 1a | R-1 | 23 | 5.1 | A | B |
| Example 2a | R-2 | 22 | 5.3 | A | A |
| Example 3a | R-3 | 22 | 5.3 | B | B |
| Example 4a | R-4 | 21 | 5.1 | A | A |
| Example 5a | R-5 | 21 | 4.9 | A | A |
| Example 6a | R-6 | 22 | 5.1 | B | B |
| Example 7a | R-7 | 21 | 5.3 | A | A |
| Example 8a | R-8 | 27 | 5.5 | B | A |
| Example 9a | R-9 | 24 | 5.2 | B | B |
| Example 10a | R-10 | 22 | 4.8 | A | A |
| Example 11a | R-11 | 20 | 4.7 | B | B |
| Example 12a | R-12 | 23 | 5.3 | B | B |
| Example 13a | R-13 | 28 | 4.9 | B | A |
| Example 14a | R-14 | 26 | 5.6 | A | B |
| Example 15a | R-15 | 21 | 5.3 | A | A |
| Example 16a | R-16 | 22 | 4.9 | A | A |
| Example 17a | R-17 | 28 | 5.5 | A | A |
| Example 18a | R-18 | 27 | 5.6 | B | B |
| Example 19a | R-19 | 22 | 5.2 | A | A |
| Example 20a | R-20 | 21 | 5.2 | B | B |
| Example 21a | R-21 | 22 | 4.8 | B | B |
| Example 22a | R-22 | 27 | 5.3 | B | A |
| Example 23a | R-23 | 22 | 4.8 | B | B |
| Example 24a | R-24 | 21 | 5.3 | B | B |
| Example 25a | R-25 | 23 | 5.3 | A | A |
| Example 26a | R-26 | 22 | 4.9 | B | A |
| Example 27a | R-27 | 20 | 5.2 | B | B |
| Example 28a | R-28 | 21 | 4.9 | A | B |
| Example 29a | R-29 | 28 | 4.8 | A | A |
| Example 30a | R-30 | 26 | 5.6 | A | B |
| Example 31a | R-31 | 23 | 5.2 | A | A |
| Example 32a | R-32 | 25 | 5.7 | A | B |
| Example 33a | R-33 | 25 | 5.5 | A | A |
| Example 34a | R-34 | 22 | 4.9 | A | A |
| Example 35a | R-35 | 19 | 4.8 | A | A |
| Example 36a | R-36 | 18 | 4.8 | A | A |
| Example 37a | R-37 | 21 | 5.2 | A | A |
| Example 38a | R-38 | 21 | 5.3 | A | A |
| Example 39a | R-39 | 22 | 5.2 | A | A |
| Example 40a | R-40 | 20 | 5.3 | A | A |
| Example 41a | R-41 | 22 | 4.9 | B | B |
| Example 42a | R-42 | 27 | 5.5 | B | A |
| Example 43a | R-43 | 22 | 4.9 | A | A |
| Example 44a | R-44 | 24 | 4.9 | B | A |
| Example 45a | R-45 | 21 | 4.9 | B | A |
| Example 46a | R-46 | 27 | 5.5 | A | B |
| Example 47a | R-47 | 22 | 5.1 | A | A |
| Example 48a | R-48 | 28 | 4.9 | B | B |
| Example 49a | R-49 | 24 | 4.8 | A | A |
| Example 50a | R-50 | 22 | 5.1 | A | A |
| Example 51a | R-51 | 21 | 4.9 | B | A |
| Example 52a | R-52 | 28 | 5.5 | A | A |
| Example 53a | R-53 | 21 | 4.9 | A | A |
| Example 54a | R-54 | 24 | 4.8 | A | A |
| Example 55a | R-55 | 27 | 5.3 | A | A |
| Example 56a | R-56 | 25 | 4.9 | B | A |
| Example 57a | R-57 | 27 | 5.5 | A | B |
| Comparative Example 1a | R-58 | 32 | 6.2 | A | C |
| Comparative Example 2a | R-59 | 38 | 6.1 | A | D |
| Comparative Example 3a | R-60 | 28 | 7.8 | C | A |
| Comparative Example 4a | R-61 | 28 | 8.2 | C | A |
| Comparative Example 5a | R-62 | 22 | 5.3 | D | A |
| Comparative Example 6a | R-63 | 23 | 5.3 | C | A |

TABLE 7

| | Resist composition | L/S resolution [nm] | LWR [nm] | Development defects | Etching defects |
|---|---|---|---|---|---|
| Example 58a | R-64 | 26 | 5.3 | A | A |
| Example 59a | R-65 | 22 | 5.2 | B | A |
| Example 60a | R-66 | 24 | 4.9 | A | A |
| Example 61a | R-67 | 19 | 4.8 | A | A |
| Example 62a | R-68 | 23 | 5.0 | A | A |
| Example 63a | R-69 | 21 | 5.1 | B | A |
| Example 64a | R-70 | 28 | 5.5 | B | B |
| Example 65a | R-71 | 21 | 5.2 | B | A |
| Example 66a | R-72 | 22 | 5.1 | A | A |

From the results of Tables 6 and 7, it can be seen that the resist compositions of Examples are excellent in the resolution and the LWR performance, and the development defects and the etching defects are reduced.

[Extreme Ultraviolet Ray (EUV) Exposure]

(4) Preparation of Resist Pattern

A wafer on which the resist film obtained in (3) had been applied was subjected to patternwise exposure through an exposure mask (line/space=1/1) using an EUV exposure device (Micro Exposure Tool, manufactured by Exitech, numerical aperture (NA): 0.3, Quadrupole, outer sigma: 0.68, inner sigma: 0.36). After the exposure, the film was heated on a hot plate at 100° C. for 90 seconds, dipped using a 2.38%-by-mass aqueous tetramethylammonium hydroxide (TMAH) solution for 60 seconds, and then rinsed with water for 30 seconds. Then, the wafer was rotated at a rotation speed of 4,000 rpm for 30 seconds, baked at 95° C. for 60 seconds, and dried.

[Etching]

An 8-inch wafer on which the resist pattern had been formed was dry-etched to form a hard mask pattern. In the dry etching, a fluorine-based gas ($SF_6$) was used as the etching gas, and the etching time was set to 20 seconds.

[Evaluation]

(5) Evaluation of Resist Pattern

The obtained pattern was evaluated on a resolution and development defects by the following methods. The results are shown in Tables 8 and 9 below.

<Sensitivity>

The irradiation energy upon resolution of a 1:1 line-and-space pattern with a line width of 50 nm was defined as a sensitivity (Eop).

<US Resolution>

A marginal resolving power (a minimum line width at which lines and spaces (line:space=1:1) are separated and resolved) at an exposure dose showing the sensitivity (Eop) was taken as a resolving power (nm).

<Line Width Roughness (LWR) Performance>

Line width roughness was measured at any 50 points in 0.5 μm of a line-and-space pattern in the longitudinal direction (line:space=1:1) with a line width of 50 nm in the above Eop, a standard deviation thereof was determined, and 3a (nm) was calculated. A smaller value thereof indicates better performance.

<Development Defects>

Using a defect inspection apparatus, KLA 2360 (trade name), manufactured by KLA Tencor Ltd., a 1:1 line-and-space pattern with a line width of 50 nm formed at the sensitivity (Eop) was measured by setting a pixel size of the defect inspection apparatus to 0.16 μm and a threshold value to 20 to detect defects (defects/$cm^2$) extracted from a difference produced at the time of superposing pixel units on a reference image, and the number of the defects per unit area (defects/$cm^2$) was computed. Then, by performing a defect review, the development defects were classified and extracted from all the defects, and the number of development defects per unit area (defects/$cm^2$) was computed. The value of less than 0.5 was designated as A, the value of 0.5 or more and less than 1.0 was designated as B, the value of 1.0 or more and less than 5.0 was designated as C, and a value of 5.0 or more was designated as D. A smaller value thereof indicates better performance.

<Etching Defects>

For the formed hard mask pattern, the number of defects due to the remaining pattern was counted. The number of defects was counted using a mask blank defect inspection apparatus (MAGICS series M2351) manufactured by Lasertec Corporation. A case where the value was less than 1 was designated as A, a case where the value was 1 or more and less than 10 was designated as B, a case where the value was 10 or more and less than 50 was designated as C, and a case where the value was 50 or more was designated as D. A smaller value thereof indicates better performance.

TABLE 8

| | Resist composition | L/S resolution [nm] | LWR [nm] | Development defects | Etching defects |
|---|---|---|---|---|---|
| Example 1b | R-1 | 23 | 5.3 | A | B |
| Example 2b | R-2 | 20 | 5.2 | A | A |
| Example 3b | R-3 | 22 | 5.2 | A | B |
| Example 4b | R-4 | 20 | 4.8 | B | A |
| Example 5b | R-5 | 21 | 4.7 | A | A |
| Example 6b | R-6 | 21 | 5.3 | B | B |
| Example 7b | R-7 | 22 | 5.3 | A | A |
| Example 8b | R-8 | 27 | 5.5 | A | A |
| Example 9b | R-9 | 24 | 5.2 | B | B |
| Example 10b | R-10 | 22 | 4.8 | B | A |
| Example 11b | R-11 | 20 | 4.7 | B | B |
| Example 12b | R-12 | 24 | 5.3 | A | B |
| Example 13b | R-13 | 28 | 4.9 | A | A |

TABLE 8-continued

| | Resist composition | L/S resolution [nm] | LWR [nm] | Development defects | Etching defects |
|---|---|---|---|---|---|
| Example 14b | R-14 | 26 | 5.6 | A | B |
| Example 15b | R-15 | 21 | 5.3 | B | A |
| Example 16b | R-16 | 22 | 4.9 | A | A |
| Example 17b | R-17 | 28 | 5.5 | A | A |
| Example 18b | R-18 | 27 | 5.5 | A | B |
| Example 19b | R-19 | 22 | 4.8 | A | B |
| Example 20b | R-20 | 21 | 4.9 | B | B |
| Example 21b | R-21 | 22 | 5.3 | B | A |
| Example 22b | R-22 | 28 | 4.9 | A | A |
| Example 23b | R-23 | 20 | 5.2 | B | B |
| Example 24b | R-24 | 22 | 5.2 | B | B |
| Example 25b | R-25 | 24 | 5.3 | A | A |
| Example 26b | R-26 | 20 | 5.2 | A | A |
| Example 27b | R-27 | 21 | 5.2 | B | B |
| Example 28b | R-28 | 22 | 4.8 | A | B |
| Example 29b | R-29 | 27 | 5.3 | A | A |
| Example 30b | R-30 | 25 | 5.6 | B | A |
| Example 31b | R-31 | 23 | 5.2 | A | B |
| Example 32b | R-32 | 26 | 5.6 | A | A |
| Example 33b | R-33 | 25 | 5.5 | A | A |
| Example 34b | R-34 | 22 | 4.9 | A | B |
| Example 35b | R-35 | 20 | 4.8 | A | A |
| Example 36b | R-36 | 19 | 4.8 | A | A |
| Example 37b | R-37 | 24 | 5.3 | A | A |
| Example 38b | R-38 | 20 | 5.2 | A | A |
| Example 39b | R-39 | 21 | 5.2 | B | B |
| Example 40b | R-40 | 20 | 4.8 | A | B |
| Example 41b | R-41 | 21 | 4.9 | A | A |
| Example 42b | R-42 | 28 | 5.5 | B | A |
| Example 43b | R-43 | 22 | 5.2 | A | A |
| Example 44b | R-44 | 24 | 4.8 | A | B |
| Example 45b | R-45 | 20 | 4.9 | A | B |
| Example 46b | R-46 | 27 | 5.5 | A | A |
| Example 47b | R-47 | 22 | 5.2 | A | A |
| Example 48b | R-48 | 28 | 5.2 | B | A |
| Example 49b | R-49 | 23 | 5.3 | B | B |
| Example 50b | R-50 | 20 | 5.2 | A | B |
| Example 51b | R-51 | 22 | 5.2 | A | A |
| Example 52b | R-52 | 27 | 5.5 | A | A |
| Example 53b | R-53 | 21 | 5.2 | A | A |
| Example 54b | R-54 | 23 | 4.9 | A | A |
| Example 55b | R-55 | 27 | 5.5 | A | A |
| Example 56b | R-56 | 25 | 4.9 | B | B |
| Example 57b | R-57 | 27 | 5.1 | A | A |
| Comparative Example 1b | R-58 | 32 | 6.0 | A | C |
| Comparative Example 2b | R-59 | 34 | 6.1 | A | D |
| Comparative Example 3b | R-60 | 26 | 7.9 | B | A |
| Comparative Example 4b | R-61 | 28 | 8.6 | C | A |
| Comparative Example 5b | R-62 | 23 | 5.3 | D | A |
| Comparative Example 6b | R-63 | 23 | 5.2 | C | A |

TABLE 9

| | Resist composition | L/S resolution [nm] | LWR [nm] | Development defects | Etching defects |
|---|---|---|---|---|---|
| Example 58b | R-64 | 25 | 5.3 | A | A |
| Example 59b | R-65 | 22 | 5.2 | A | A |
| Example 60b | R-66 | 23 | 5 | B | A |
| Example 61b | R-67 | 20 | 4.9 | A | A |
| Example 62b | R-68 | 24 | 4.9 | A | B |
| Example 63b | R-69 | 21 | 5.1 | A | B |
| Example 64b | R-70 | 27 | 5.4 | B | A |
| Example 65b | R-71 | 22 | 5.2 | A | A |
| Example 66b | R-72 | 21 | 5.1 | A | A |

From the results in Tables 8 and 9, it can be seen that the resist composition of the example is excellent in resolution and LWR performance, and development defects and etching defects are reduced.

According to the present invention, it is possible to provide an actinic ray-sensitive or radiation-sensitive resin composition which is excellent in a resolution and a line width roughness (LWR) performance, and can reduce development defects and etching defects; and an actinic ray-sensitive or radiation-sensitive film, a pattern forming method, and a method for manufacturing an electronic device, each using the actinic ray-sensitive or radiation-sensitive resin composition.

Although the present invention has been described in detail with reference to specific embodiments, it will be apparent to those skilled in the art that various changes and modifications can be made without departing from the spirit and the scope of the present invention.

What is claimed is:

1. An actinic ray-sensitive or radiation-sensitive resin composition comprising:

(A) a resin having a group having a polarity that increases through decomposition by an action of an acid;

(B) a compound represented by General Formula (b1), which generates an acid upon irradiation with actinic rays or radiation; and (C) a compound represented by General Formula (c1), which generates an acid upon irradiation with actinic rays or radiation, wherein a ratio of a content of the compound (C) to a content of the compound (B) is from 0.01% by mass to 10% by mass, $$_{n}(A-L)-X-SO_3^-\ M^+ \quad (b1)$$

in General Formula (b1), L represents a single bond or a divalent linking group, in a case where there are a plurality of L's, the plurality of L's may be the same as or different from each other, A represents a group that decomposes by an action of an acid, in a case where there are a plurality of A's, the plurality of A's may be the same as or different from each other, n represents an integer from 1 to 5, X represents an (n+1)-valent linking group, and $M^+$ represents a sulfonium ion or an iodonium ion, $$_{n}(B-L)-X-SO_3^-\ M^+ \quad (c1)$$

in General Formula (c1), L represents a single bond or a divalent linking group, in a case where there are a plurality of L's, the plurality of L's may be the same as or different from each other, n represents an integer from 1 to 5, X represents an (n+1)-valent linking group, $M^+$ represents a sulfonium ion or an iodonium ion, provided that L, n, X, and $M^+$ in General Formula (c1) are the same as L, n, X, and $M^+$ in General Formula (b1), respectively, and B in General Formula (c1) is different from A in General Formula (b1), B represents a group that decomposes by an action of an acid, a hydroxy group, or a carboxy group, and in a case where there are a plurality of B's, the plurality of B's may be the same as or different from each other, provided that at least one B represents the hydroxy group or the carboxy group, wherein the hydroxy group or the carboxy group of the at least one B in General Formula (c1) is disposed on a terminal site of the General Formula (c1).

2. The actinic ray-sensitive or radiation-sensitive resin composition according to claim 1, wherein the compound (B) is represented by General Formula (b2) and the compound (C) is represented by General Formula (c2), (b2)

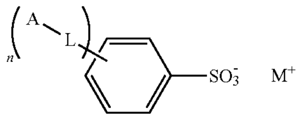

in General Formula (b2), L represents a single bond or a divalent linking group, in a case where there are a plurality of L's, the plurality of L's may be the same as or different from each other, A represents a group that decomposes by an action of an acid, in a case where there are a plurality of A's, the plurality of A's may be the same as or different from each other, n represents an integer from 1 to 5, and $M^+$ represents a sulfonium ion or an iodonium ion, (c2)

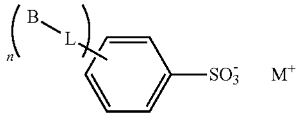

in General Formula (c2), L represents a single bond or a divalent linking group, in a case where there are a plurality of L's, the plurality of L's may be the same as or different from each other, n represents an integer from 1 to 5, $M^+$ represents a sulfonium ion or an iodonium ion, provided that L, n, and $M^+$ in General Formula (c2) are the same as L, n, and $M^+$ in General Formula (b2), respectively, B represents a group that decomposes by an action of an acid, a hydroxy group, or a carboxy group, and in a case where there are a plurality of B's, the plurality of B's may be the same as or different from each other, provided that at least one B represents the hydroxy group or the carboxy group.

3. The actinic ray-sensitive or radiation-sensitive resin composition according to claim 1, wherein the compound (B) is represented by General Formula (b3) and the compound (C) is represented by General Formula (c3), (b3)

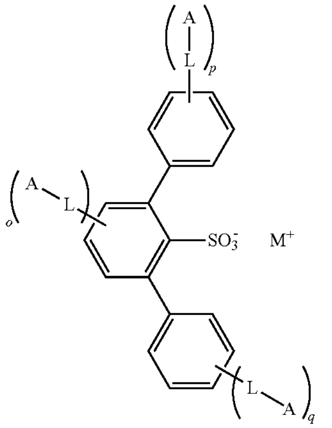

in General Formula (b3), L represents a single bond or a divalent linking group, in a case where there are a plurality of L's, the plurality of L's may be the same as or different from each other, A represents a group that decomposes by an action of an acid, in a case where there are a plurality of A's, the plurality of A's may be the same as or different from each other, o, p, and q each independently represent an integer from 0 to 5, provided that a sum of o, p, and q is from 1 to 5, and $M^+$ represents a sulfonium ion or an iodonium ion, (c3)

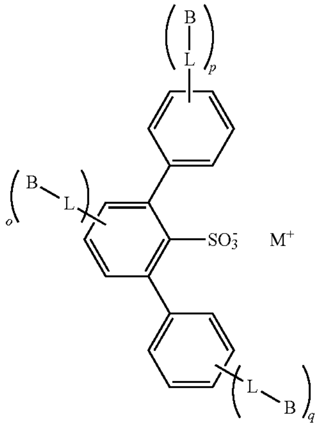

in General Formula (c3), L represents a single bond or a divalent linking group, in a case where there are a plurality of L's, the plurality of L's may be the same as or different from each other, o, p, and q each independently represent an integer from 0 to 5, provided that a sum of o, p, and q is from 1 to 5, $M^+$ represents a sulfonium ion or an iodonium ion, provided that L, o, p, q, and $M^+$ in General Formula (c3) are the same as L, o, p, q, and $M^+$ in General Formula (b3), respectively, B represents a group that decomposes by an action of an acid, a hydroxy group, or a carboxy group, and in a case where there are a plurality of B's, the plurality of B's may be the same as or different from each other, provided that at least one B represents the hydroxy group or the carboxy group.

4. The actinic ray-sensitive or radiation-sensitive resin composition according to claim 1, wherein the group represented by A, which decomposes by an action of an acid, is at least one group selected from the group consisting of a group represented by General Formula (T-1) and a group represented by General Formula (T-2), (T-1)

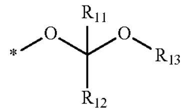

(T-2)

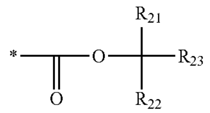

in General Formula (T-1), $R_{11}$ represents a hydrogen atom or an alkyl group, $R_{12}$ represents a hydrogen atom, an alkyl group, a cycloalkyl group, or an aryl group, and the alkyl group and the cycloalkyl group may each include an ether bond or a carbonyl bond, $R_{13}$ represents an alkyl group, a cycloalkyl group, or an aryl group, and the alkyl group and the cycloalkyl group may each include an ether bond or a carbonyl bond, $R_{11}$ and $R_{12}$ may be bonded to each other to form a ring, $R_{12}$ and $R_{13}$ may be bonded to each other to form a ring, and

* represents a bond, and in General Formula (T-2), $R_{21}$, $R_{22}$, and $R_{23}$ each independently represent an alkyl group, two of $R_{21}$ to $R_{23}$ may be bonded to each other to form a ring, and

* represents a bond.

5. The actinic ray-sensitive or radiation-sensitive resin composition according to claim 4, wherein the group represented by A, which decomposes by an action of an acid, is the group represented by General Formula (T-1).

6. The actinic ray-sensitive or radiation-sensitive resin composition according to claim 1, wherein the ratio of the content of the compound (C) to the content of the compound (B) is from 0.01% by mass to 5% by mass.

7. The actinic ray-sensitive or radiation-sensitive resin composition according to claim 1, wherein the sulfonium ion or the iodonium ion represented by $M^+$ has no nitrogen atom.

8. The actinic ray-sensitive or radiation-sensitive resin composition according to claim 1, wherein the resin (A) includes a repeating unit represented by General Formula (I), (I)

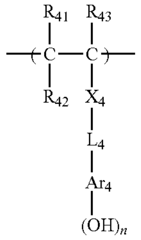

in General Formula (I), $R_{41}$, $R_{42}$, and $R_{43}$ each independently represent a hydrogen atom, an alkyl group, a cycloalkyl group, a halogen atom, a cyano group, or an alkoxycarbonyl group, provided that $R_{42}$ may be bonded to $Ar_4$ to form a ring, and in this case, $R_{42}$ represents a single bond or an alkylene group, $X_4$ represents a single bond, —COO—, or —$CONR_{64}$—, where $R_{64}$ represents a hydrogen atom or an alkyl group, $L_4$ represents a single bond or an alkylene group, $Ar_4$ represents an (n+1)-valent aromatic ring group, and in a case where $Ar_4$ is bonded to $R_{42}$ to form a ring, $Ar_4$ represents an (n+2)-valent aromatic ring group, and n represents an integer of 1 to 5.

9. An actinic ray-sensitive or radiation-sensitive film formed of the actinic ray-sensitive or radiation-sensitive resin composition according to claim 1.

10. The actinic ray-sensitive or radiation-sensitive resin composition according to claim 1, further comprising an acid diffusion control agent.

11. The actinic ray-sensitive or radiation-sensitive resin composition according to claim 10, wherein the acid diffusion control agent has an onium salt (DC) which is a weak acid relative to a photoacid generator.

12. The actinic ray-sensitive or radiation-sensitive resin composition according to claim 11, wherein the onium salt (DC) is a compound represented by general formulas (d1-1) to (d1-3), (d1-1)

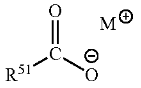

(d1-2)

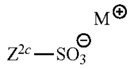

(d1-3)

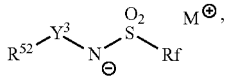

in the formulae, $R^{51}$ is a hydrocarbon group which may have a substituent, $Z^{2c}$ is a hydrocarbon group having 1 to 30 carbon atoms, which may have a substituent (provided that carbon adjacent to S is not substituted with a fluorine atom), $R^{52}$ is an organic group, $Y^3$ is a linear, branched, or cyclic alkylene group or an arylene group, Rf is a hydrocarbon group including a fluorine atom, and $M^+$'s are each independently an ammonium cation, a sulfonium cation, or an iodonium cation.

13. The actinic ray-sensitive or radiation-sensitive resin composition according to claim 1, further comprising a fluorine-containing compound having a group having a solubility in an alkali developer that increases upon decomposition by the action of the alkali developer.

14. A pattern forming method comprising:

a resist film forming step of forming a resist film using the actinic ray-sensitive or radiation-sensitive resin composition according to claim 1;

an exposing step of exposing the resist film; and a developing step of developing the exposed resist film, using a developer.

15. A method for manufacturing an electronic device, comprising the pattern forming method according to claim 14.

* * * * *